(12) United States Patent
Ishida

(10) Patent No.: US 6,440,790 B1
(45) Date of Patent: Aug. 27, 2002

(54) METHOD OF MAKING SEMICONDUCTOR DEVICE HAVING AN INSULATING FILM POSITIONED BETWEEN TWO SIMILARLY SHAPED CONDUCTIVE FILMS

(75) Inventor: Masahiro Ishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/702,695

(22) Filed: Nov. 1, 2000

Related U.S. Application Data

(62) Division of application No. 08/905,048, filed on Aug. 1, 1997, now abandoned.

(30) Foreign Application Priority Data

Feb. 14, 1997 (JP) ................................. 9-30975

(51) Int. Cl.⁷ .......................................... H01L 21/8234
(52) U.S. Cl. ..................... 438/238; 438/382; 438/637
(58) Field of Search ................... 438/238, 381, 438/382, 383, 384, 637

(56) References Cited

U.S. PATENT DOCUMENTS

| | | | |
|---|---|---|---|
| 5,307,308 A | 4/1994 | Noguchi | 257/380 |
| 5,324,961 A | 6/1994 | Rodder | 257/306 |
| 5,391,894 A | 2/1995 | Itabashi et al. | 257/393 |
| 5,485,420 A | 1/1996 | Lage et al. | 257/277 |
| 5,545,584 A * | 8/1996 | Wuu et al. | 438/238 |
| 5,550,409 A | 8/1996 | Yamaguchi et al. | 257/757 |
| 5,780,909 A | 7/1998 | Hayashi | 257/393 |
| 5,792,683 A * | 8/1998 | Hayashi et al. | 438/382 |
| 6,187,621 B1 * | 2/2001 | Green et al. | 438/238 |

FOREIGN PATENT DOCUMENTS

| | | |
|---|---|---|
| DE | 43 26 822 | 10/1994 |
| JP | 02-01176 | 1/1990 |
| JP | 2-244760 | 9/1990 |
| JP | 02-271663 | 11/1990 |
| JP | 4-102369 | 4/1992 |
| JP | 6-151771 | 5/1994 |
| JP | 6-232372 | 8/1994 |
| JP | 7-112014 | 11/1995 |

OTHER PUBLICATIONS

Official Action from the Korean Patent Office (Dec. 2001).
Japanese Translation of the Official Action from the Korean Patent Office (Dec. 2001).
D. Widmann, H. Mader, H. Friedrich; Technologie hochintegrierter Schaltungen In: Halbleiter–Elektronik Bank 19, 1996, Springer, p. 289.
T. Yamanaka et al., "Having Excellent Soft Error Immunity" pp. 88–151, 1988, IEEEE.

* cited by examiner

*Primary Examiner*—Chandra Chaudhari
(74) *Attorney, Agent, or Firm*—McDermott. Will & Emery

(57) ABSTRACT

A plurality of conductive films are formed on a semiconductor substrate with an insulating film sandwiched between the adjacent conductive films, and at least two of the plurality of conductive films are patterned simultaneously in the same shape. Selected ones of the plurality of conductive films are connected through viaholes formed in the insulating film to the semiconductor substrate. High-resistance elements, capacity elements or thin-film transistors are formed by using the selected ones of the plurality of conductive films. Thus, mask superposing allowances are made unnecessary in fabricating a semiconductor device, and the number of processes for fabricating the semiconductor device is reduced.

3 Claims, 60 Drawing Sheets

METHOD OF MAKING SEMICONDUCTOR DEVICE HAVING AN INSULATING FILM POSITIONED BETWEEN TWO SIMILARLY SHAPED CONDUCTIVE FILMS

This application is a division of Ser. No. 08/905,048, file Aug. 1, 1997, now abandoned.

TECHNICAL FIELD

The present invention relates to a semiconductor device and a method of fabricating the same. More specifically, the invention relates to a semiconductor device including a plurality of transistors, and a plurality of load or capacitance elements, and a method of fabricating the same.

BACKGROUND ART

A static random-access memory (hereinafter abbreviated to "SRAM") will be described as an example of conventional semiconductor devices. A conventional flip-flop SRAM cell comprises two load elements and four n-channel MOS transistors, as described in JP-B No. 7-112014, and T. Yamanaka, T. Hashimoto et al. "A 25 $\mu m^2$, New poly-Si PMOS Load (PPL) SRAM Cell Having Excellent Soft Error Immunity", IEDM '88.

FIG. 75 illustrates an equivalent circuit of a conventional flip-flop SRAM cell, wherein the drain D of each of a pair of drive MOS transistors T1 and T2 is connected to the gate electrode G of the other. Load elements, for example, load resistors R1 and R2 of high-resistance polysilicon, are connected to the drains D of the drive MOS transistors T1 and T2. The sources S of the drive MOS transistors T1 and T2 are maintained at a predetermined potential, for example a ground potential, and a supply voltage VCC is applied to the other ends of the load resistors R1 and R2. Supply voltage Vcc supplies a small current to a flip-flop circuit including the drive MOS transistors T1 and T2, and the load resistors R1 and R2. Access MOS transistors T3 and T4 are connected to storage nodes N1 and N2. The four MOS transistors T1 to T4, and the two load resistors R1 and R2 constitute a cell of one bit. In FIG. 75, reference numeral 10a represents a word line and reference numerals 50a and 50b represent bit lines.

FIG. 76 is an equivalent circuit of a flip-flop SRAM cell provided with thin-film transistors ("TFTs") as load elements. Generally, load elements are high-resistance polysilicon resistors or thin-film transistors.

The prior art will be described in detail with reference to FIGS. 77 to 86. FIGS. 77 to 81 illustrate the structure of a conventional SRAM cell of a highresistance load type for one bit and a method of fabricating the same. FIGS. 77 to 80 show a planar layout of each layer forming a SRAM cell for one bit. FIG. 81 is a sectional view taken on line Y1–Y2 of FIGS. 77 to 80.

FIG. 77 is a planar layout of access MOS transistors and drive MOS transistors, including a first conductive film serving as a gate electrode. FIG. 78 is a pattern of a second conductive film of high-resistance polysilicon formed in part of a polysilicon film. FIG. 79 is a pattern of a third conductive film. FIG. 80 is a pattern of a fourth conductive film forming aluminum lines.

Referring to FIG. 77, a word line 10a formed by patterning a first conductive film serves as a common gate shared by access MOS transistors T3 and T4. The drains 6a and 6b, i.e., diffused layers, of the access MOS transistors T3 and T4 are connected through viaholes 21a and 21b to members 30a and 30b of a third conductive film, as shown in FIGS. 79 and 81. The drains 6a and 6b are also connected through viaholes 42a and 42b to bit lines 50a and 50b, i.e., portions of a fourth conductive film of aluminum or the like as shown in FIGS. 80 and 81.

The gate electrodes 10b and 10c of drive MOS transistors T2 and T1 are connected through viaholes 5a and 5c to the sources 6c and 6d of the access MOS transistors T3 and T4, respectively. The sources of the drive MOS transistors T1 and T2 are connected through viaholes 21c and 21d by a third conductive film 30c as shown in FIG. 79. A ground potential VSS is applied through the third conductive film 30c to the sources of all the drive MOS transistors of the SRAM.

The sources 6c and 6d, i.e., diffused layers, of the access MOS transistors T3 and T4 are connected through viaholes 12a and 12b to low-resistance polysilicon films 20a and 20b, and to resistors, i.e., high-resistance films, 20R1 and 20R2, respectively, as shown in FIG. 78. As shown in FIG. 78, a second conductive film 20c forms a power feed line for applying a supply voltage VCC to high-resistance elements R1 and R2.

FIGS. 82 to 86 illustrate the structure of the one cell for one bit of the conventional SRAM of a TFT load type shown in FIG. 76. FIGS. 82 to 85 show the planar layout of each cell in different phases of the fabricating process. FIG. 86 is a sectional view taken on line Y1–Y2 in FIGS. 82 to 85.

FIG. 82 is a planar layout of access MOS transistors and drive MOS transistors including a first conductive film forming gate electrodes. FIG. 83 is a plan view of a second conductive film serving as a lower gate electrode of a TFT. FIG. 84 is a plan view of a third conductive film serving as a channel of the TFT. FIG. 85 is a plan view of aluminum wiring lines formed by patterning a fifth conductive film.

Referring to FIG. 82, a word line 10a is a common gate shared by access MOS transistors T3 and T4. The drain 6b, i.e., a diffused layer, of the access MOS transistor T4 is connected through a viahole 32b to a fourth conductive film 40b. The drain 6b is also connected through a viahole 41b to bit lines 50a and 50b, i.e., aluminum wiring lines formed by patterning a fifth conductive film as shown in FIGS. 85 and 86. Similarly, the drain 6a, i.e., a diffused layer, of the access MOS transistor T3 is connected through a viahole 32a to a fourth conductive film 40a. The drain 6a is also connected through a viahole 41a to the bit lines 50a and 50b, i.e., aluminum wiring lines formed by patterning the fifth conductive film.

The sources 6c and 6d of the access MOS transistors T3 and T4 are connected through viaholes 5a and 5c to the gate electrodes 10b and 10c of drive MOS transistors T2 and T1, respectively, as shown in FIG. 82. The sources of the drive MOS transistors T1 and T2 are interconnected by a diffused region, as shown in FIG. 82. A first conductive film 10d is connected to the sources of all the drive MOS transistors of the SRAM to apply a ground potential VSS to the sources.

TFTs T5 and T6, i.e., load elements, comprise lower gate electrodes 20a and 20b formed by patterning a second conductive film of polysilicon (as shown in FIGS. 83 and 86), a second insulating film 21 serving as a gate oxide film (as shown in FIG. 86), and polysilicon channels 30a and 30b formed by patterning a third conductive film (as shown in FIGS. 84 and 86).

As shown in FIGS. 82 to 86, nodes N1 and N2, i.e., the diffused sources of the access MOS transistors T3 and T4, are connected through viaholes 12a and 21a and viaholes 12b and 21b to channel layers 30a and 30b formed by patterning a third conductive film, respectively. The opposite ends of the channel layers 30a and 30b are low-resistance polysilicon. The other end of the low-resistance polysilicon layer serves as a power feed line for feeding power of a supply voltage VCC.

The foregoing conventional SRAM cell has the following problems.

When forming the high-resistance polysilicon layer to be used as load elements and the TFTs in a layered structure on a memory cell, the high-resistance polysilicon layer and the TFTs are connected through the viaholes 5a and 5b to the gate electrodes 10b and 10c of the drive MOS transistors T1 and T2. Misalignment of masks (masks for forming the gate electrodes 10b and 10c of the drive MOS transistors T1 and T2 and the viaholes 12a and 12b, and masks for forming the viaholes 12a and 12b and the load elements) for forming the viaholes 5a and 5b and the gate electrodes 10b and 10c of the drive MOS transistors T1 and T2, results in an increase in the dimensions of those components (hereinafter referred to as "CD gains") and/or decrease in the dimensions of those components (hereinafter referred to as "CD losses"). Therefore, when laying out the cells, sufficiently large superposing allowances must be secured. Such large superposing allowances increases the total member of the memory chip.

Trace uranium (U) and trace thorium (Th) contained in a ceramic material or a resin for packaging a memory chip, and in the material forming the wiring lines, emit alpha rays when they decay. If alpha rays penetrate the memory chip, electron-hole pairs are produced along the paths of alpha particles, and the potentials of the storage nodes N1 and N2 are varied by the electron-hole pairs. Consequently, a "soft error" occurs, resulting in the loss of information stored in the memory cells.

Recently, soft error problems attributable to cosmic alpha rays have been reported. Neutrons are produced when cosmic alpha rays collide with the atmosphere. If the neutrons produced collide with Si nuclei in the memory chip, charged particles (including protons, alpha particles and heavy ions) are produced and the Si nuclei move. Consequently, a large quantity of charges are produced and cause the potentials of the storage nodes N1 and N2 to destroy information stored in the memory cells. In the conventional SRAM cell, charges necessary for compensating a charge loss caused by alpha rays and neutrons can be stored by using the pn junction capacitance. The capacitance is produced between the n+diffused layer forming the drains of the drive MOS transistors T1 and T2 and the p-type silicon substrate, and using the capacitance of insulating films, such as the gate oxide film and the layer insulating film. However, if the member for the memory cell is reduced in size, charges sufficient for compensating the charge loss caused by alpha rays and neutrons cannot be stored. Therefore, the soft error rate increases and the reliability is deteriorated greatly if the SRAM cell of the conventional structure is miniaturized.

When forming the load elements of high-resistance polysilicon and TFTs in a stacked structure on the memory cell, the layers for forming the load elements and the components of the TFTs are processed by photolithographic processes and etching processes. Therefore, the SRAM cell needs an increased number of processes and hence the yield of the SRAM cell is reduced.

DISCLOSURE OF THE INVENTION

Accordingly, it is an object of the present invention to provide a semiconductor device capable of being formed in a small member, highly resistant to soft errors and requiring a smaller number of fabricating processes than the conventional semiconductor device, and to provide a method of fabricating such a semiconductor device.

According to one aspect of the present invention, a semiconductor device comprises a semiconductor substrate. An underlying insulating film is formed over a major surface of said semiconductor substrate. A plurality of conductive films are formed on said underlying insulating film. Insulating films are formed between said plurality of conductive films. Further, at least two adjacent conductive films among said plurality of conductive films are interconnected through a viahole formed in said insulating film, and have the same planar shape.

In another aspect of the present invention, in the semiconductor device, said conductive film formed directly on said underlying insulating film among said plurality of conductive films is connected to said semiconductor substrate through a viahole formed in said underlying insulating film.

In another aspect of the present invention, in the semiconductor device, at least one of said plurality of conductive films has a high-resistance region.

In another aspect of the present invention, in the semiconductor device, a first additional conductive film is formed on at least one of said plurality of conductive films with an insulating film formed therebetween, and a thin-film transistor is formed by said conductive film among said plurality of conductive films and said first additional conductive film.

In another aspect of the present invention, in the semiconductor device, a gate electrode of said thin-film transistor is formed from said conductive film among said plurality of conductive films, and a channel of said thin-film transistor is formed from said first additional conductive film.

In another aspect of the present invention, in the semiconductor device, a channel of said thin-film transistor is formed from said conductive film among said plurality of conductive films, and a gate electrode of said thin-film transistor is formed from said first additional conductive film.

In another aspect of the present invention, in the semiconductor device, said first additional conductive film is formed with an insulating film sandwiched between said first additional conductive film and said conductive film among said plurality of conductive films, and a second additional conductive film is connected to said conductive film among said plurality of conductive films.

In another aspect of the present invention, in the semiconductor device, a channel of said thin-film transistor is formed from said first additional conductive film, and double gate electrodes are formed from said conductive film among said plurality of conductive films and said second additional conductive film connected to said former.

In another aspect of the present invention, in the semiconductor device, said first additional conductive film and said second additional conductive film are the same in planar shape.

According to another aspect of the present invention, a semiconductor device comprises a semiconductor substrate. An underlying insulating film is formed over a major surface of said semiconductor substrate. A surface conductive film is formed on said underlying insulating film. A plurality of conductive films are formed on said insulating base film. Insulating films are formed between said plurality of conductive films. Further, at least two adjacent conductive films among said plurality of conductive films are the same in planar shape, and one of said two adjacent conductive films is connected through a viahole formed in said insulating film to said surface conductive film.

In another aspect of the present invention, in the semiconductor device, said surface conductive film is connected through a viahole formed in said underlying insulating film.

In another aspect of the present invention, in the semiconductor device, at least one of said plurality of conductive films has a high-resistance region.

In another aspect of the present invention, in the semiconductor device, a gate electrode of a thin-film transistor is formed from one of said two conductive films, and a channel of said thin-film transistor is formed from said other conductive film.

In another aspect of the present invention, the semiconductor device further comprises a first additional conductive film formed so that one of said two conductive films is sandwiched between said first additional conductive film and said other conductive film with an insulating film sandwiched between said first additional conductive film and said one of said two conductive films.

In another aspect of the present invention, in the semiconductor device, a channel of a thin-film transistor is formed from one of said two conductive films, and double gate electrodes of said thin-film transistor are formed from said other conductive film and said first additional conductive film connected to said other conductive film.

According to another aspect of the present invention, in a method of fabricating a semiconductor device, a first conductive film is formed on an underlying insulating film formed on a semiconductor substrate. A first insulating film is formed on said first conductive film. An opening is formed through at least said first insulating film and said first conductive film. A second conductive film is formed on said first insulating film and in said opening. Further, said second conductive film, said first insulating film and said first conductive film are patterned in the same planar shape so as to include said opening.

Other features and advantages of the present invention will become more apparent from the following description taken together with the accompanying drawings.

BRIEF DESCRIPTION OF DRAWINGS

FIG. 1 is a plan view of the gate electrodes of MOS transistors and high-resistance elements.

FIG. 2 is a plan view of aluminum wiring lines formed by patterning a third conductive film.

FIGS. 3 and 4 are sectional views taken on line X1–X2 and Y1–Y2 in FIGS. 1 and 2, respectively.

FIGS. 5 to 9 illustrate an exemplary method of fabricating the SRAM cell, showing a portion of the SRAM cell corresponding to the sections taken on line X1–X2 in FIGS. 1 and 2.

FIG. 10 is a circuit diagram of an equivalent circuit of the SRAM cell in the first embodiment.

FIGS. 11 to 13 illustrate an exemplary planar layout of the components of the SRAM cell.

FIG. 11 is a plan view of a first conductive film a second conductive film.

FIG. 12 is a plan view of a third conductive film.

FIG. 13 is a plan view of a fourth conductive film.

FIGS. 14 and 15 are sectional views taken on lines X1–X2 and Y1–Y2 in FIGS. 11 to 13.

FIGS. 16 to 21 illustrate an exemplary method of fabricating the SRAM cell, showing a portion of the SRAM cell corresponding to the sections taken on line X1–X2 in FIGS. 11 to 13.

FIG. 22 is a circuit diagram of an equivalent circuit of the SRAM cell in the second embodiment.

FIGS. 23 and 24 are views for explaining the planar layout of the components of the SRAM cell.

FIG. 23 is a plan view of a third conductive film serving as the upper gate electrodes of the TFTs.

FIG. 24 is a plan view of a fourth conductive film forming aluminum wiring lines.

FIGS. 25 and 26 are sectional views taken on lines X1–X2 and Y1–Y2 in FIGS. 11, 23 and 24.

FIG. 27 illustrates an exemplary method of fabricating the SRAM cell, showing a portion of the SRAM cell corresponding to the sections taken on line X1–X2 in FIGS. 11, 23 and 24.

FIG. 28 is a circuit diagram of an equivalent circuit of the SRAM cell in the third embodiment.

FIGS. 29 and 30 illustrate an exemplary planar layout of the components of the SRAM cell.

FIG. 29 is a planar layout of a fourth conductive film serving as the upper gate electrodes of the TFTs.

FIG. 30 is a planar layout of aluminum wiring lines formed by patterning a fifth conductive film.

FIGS. 31 and 32 are sectional views showing a portion of the SRAM cell corresponding to the sections taken on lines X1–X2 and Y1–Y2 in FIGS. 11 to 12 and 29 to 30.

FIG. 33 illustrates an exemplary method of fabricating the SRAM cell, showing a portion of the SRAM cell corresponding to the sections taken on line X1–X2 in FIGS. 11, 12, 29 and 30.

FIG. 34 is a circuit diagram of an equivalent circuit of the SRAM cell in the fourth embodiment.

FIGS. 35 and 36 illustrate an exemplary planar layout of the components of the SRAM cell.

FIG. 35 is a planar layout of a third conductive film serving as the channel regions of the TFTs, and a fourth conductive film serving as the upper gate electrodes of the TFTs.

FIG. 36 is a planar layout of aluminum wiring lines formed by patterning a fifth conductive film.

FIGS. 37 and 38 are sectional views showing a portion of the SRAM cell corresponding to the sections taken on lines X1–X2 and Y1–Y2 in FIGS. 11, 35 and 36.

FIGS. 39 to 40 illustrate an exemplary method of fabricating the SRAM cell, showing a portion corresponding to a section taken on line X1–X2 in FIGS. 11, 35 and 36.

FIG. 41 is a circuit diagram of an equivalent circuit of the SRAM cell in the fifth embodiment.

FIGS. 42 to 45 illustrate an exemplary planar lay out of the components of the SRAM cell, in which FIG. 42 is a plan view of a first conductive film serving as the gate electrodes of MOS transistors.

FIG. 43 is a plan view of a second conductive film serving as the lower gate electrodes of TFTs, and a third conductive film serving as the channel regions of the TFTs.

FIG. 44 is a plan view of a fourth conductive film serving as the upper gate electrodes of the TFTs;.

FIG. 45 is a plan view of aluminum wiring lines formed by patterning a fifth conductive film.

FIGS. 46 and 47 are sectional views taken on lines X1–X2 and Y1–Y2 in FIGS. 42 to 45.

FIGS. 48 to 52 illustrate an exemplary method of fabricating the SRAM cell, taken on line X1–X2 in FIGS. 42 to 45.

FIG. 53 is a circuit diagram of an equivalent circuit of the SRAM cell in the sixth embodiment.

FIGS. 54 to 57 illustrate an exemplary planar layout of the components of the SRAM cell.

FIG. 54 is a plan view of a first conductive film serving as the gate electrodes of MOS transistors.

FIG. 55 is a plan view of a second conductive film serving as the lower gate electrodes of the TFTs.

FIG. 56 is a plan view of a third conductive film serving as the channel regions of the TFTs, and a fourth conductive film serving as the upper gate electrodes of the TFTs.

FIG. 57 is a plan view of aluminum wiring lines formed by patterning a fifth conductive film.

FIGS. 58 and 59 are sectional views taken on lines X1–X2 and Y1–Y2 in FIGS. 54 to 57.

FIGS. 60 to 64 illustrate an exemplary method of fabricating the SRAM cell, taken on line X1–X2 in FIGS. 54 to 57.

FIG. 65 is a circuit diagram of an equivalent circuit of the SRAM cell in the seventh embodiment.

FIGS. 66 to 68 illustrate an exemplary planar layout of the components of the SRAM cell.

FIG. 66 is a plan view of a first conductive film serving as the gate electrodes of MOS transistors, a second conductive film serving as the lower electrodes of TFTs, and a third conductive film serving as the upper gate electrodes of the TFTs.

FIG. 67 is a plan view of a fourth conductive film serving as the upper gate electrodes of the TFTs.

FIG. 68 is a plan view of aluminum wiring lines formed by patterning a fifth conductive film.

FIGS. 69 and 70 are sectional views taken on lines X1–X2 and Y1–Y2 in FIGS. 66 to 68.

FIGS. 71 to 73 are sectional views taken on lines X1–X2 and Y1–Y2 in FIGS. 66 to 68.

FIG. 74 is a circuit diagram of an equivalent circuit of the SRAM cell in the seventh embodiment.

FIGS. 77 to 80 show a planar layout of each of layers forming a SRAM cell for one bit.

FIG. 77 is a planar layout of access MOS transistors and drive MOS transistors, including a first conductive film serving as a gate electrode.

FIG. 78 is a pattern of a second conductive film of high-resistance polysilicon formed in part of a polysilicon film.

FIG. 79 is a pattern of a third conductive film.

FIG. 80 is a pattern of a fourth conductive film forming aluminum lines.

FIG. 81 is a sectional view taken on line Y1–Y2 in FIGS. 77 to 80.

FIGS. 82 to 85 shows the planar layout of each cell in each of different phases of a fabricating process.

FIG. 82 is a planar layout of access MOS transistors and drive MOS transistors including a first conductive film forming gate electrodes.

FIG. 83 is a plan view of a second conductive film serving as a lower gate electrode of a TFT.

FIG. 84 is a plan view of a third conductive film serving as a channel of the TFT.

FIG. 85 is a plan view of aluminum wiring lines formed by patterning a fifth conductive film.

FIG. 86 is a sectional view taken on line Y1–Y2 in FIGS. 82 to 85.

DESCRIPTION OF THE PREFERRED EMBODIMENTS

Figure 1:
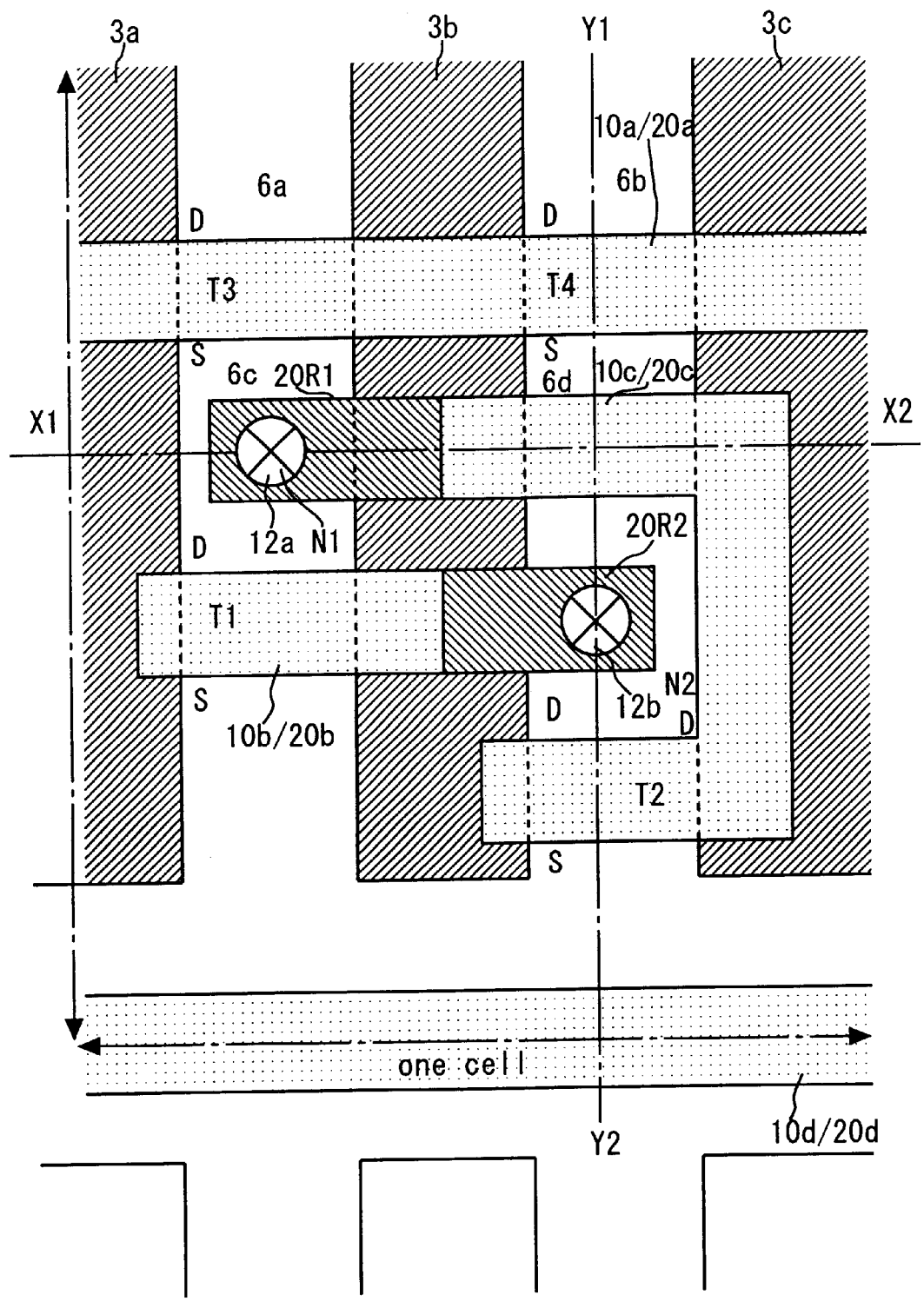
FIGS. 1 to 10 illustrate an exemplary structure and a method of fabricating the SRAM cell in the first embodiment of the present invention.

SRAM cells as semiconductor devices in preferred embodiments according to the present invention will be described hereinafter with reference to the accompanying drawings, in which like parts are designated by the same reference characters.

First Embodiment

A SRAM cell in a first embodiment according to the present invention is provided with high-resistance elements as load elements and is featured by the gate electrodes of MOS transistors, and resistors are formed simultaneously in the same planar shape.

Figure 2:
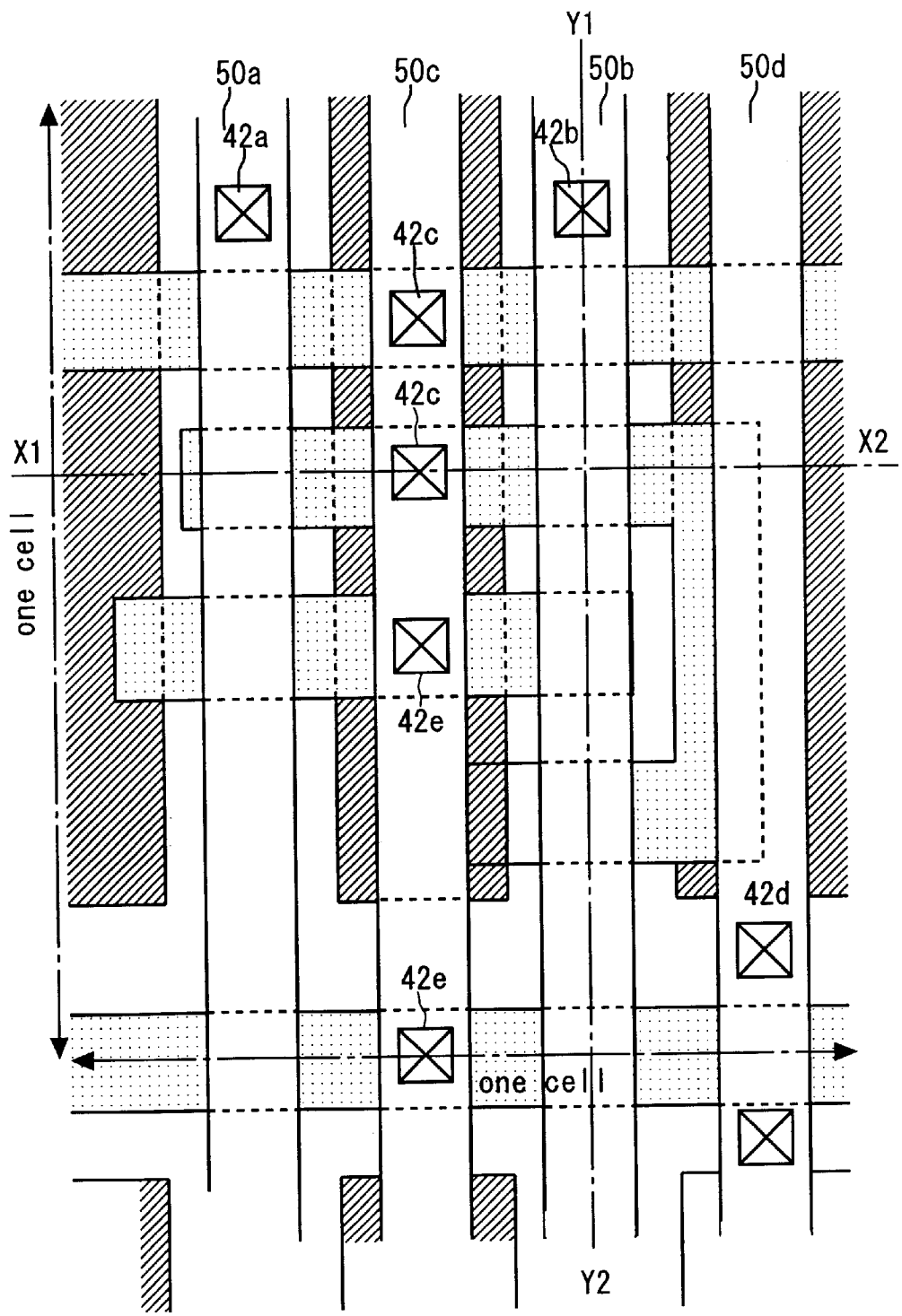

FIGS. 1 to 10 illustrate an exemplary structure and a method of fabricating the SRAM cell in the first embodiment. FIG. 1 is a plan view of the gate electrodes of MOS transistors formed by patterning a first conductive film, and high-resistance elements formed by patterning a second conductive film. FIG. 2 is a plan view of aluminum wiring lines formed by patterning a third conductive film.

Figure 3:
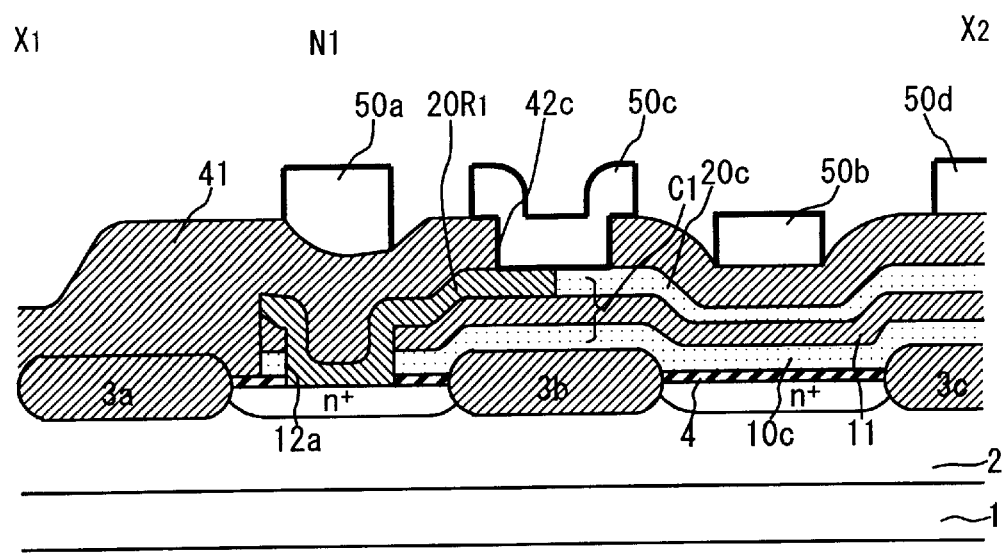
Figure 4:
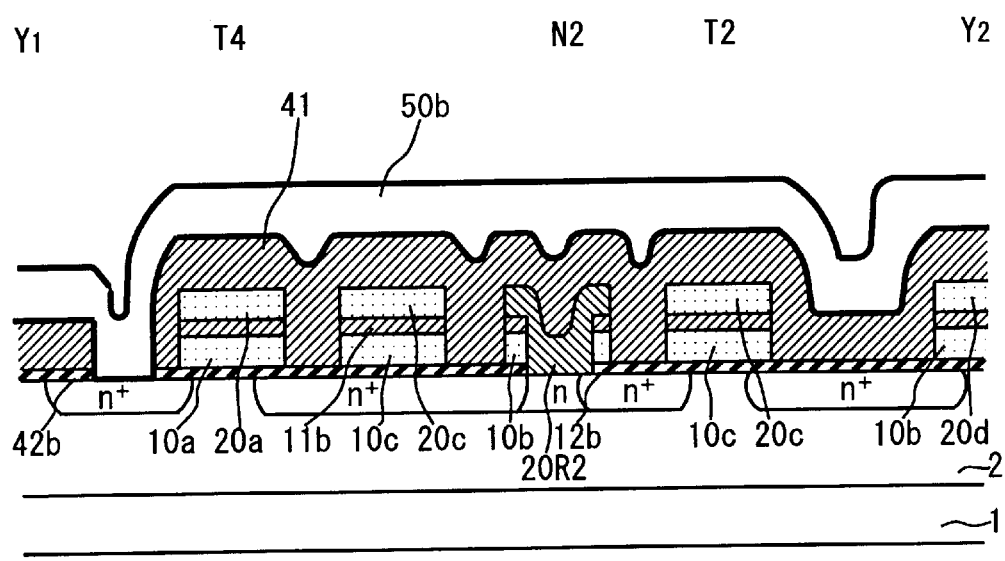

FIGS. 3 and 4 are sectional views taken on line X1–X2 and Y1–Y2 in FIGS. 1 and 2, respectively. FIGS. 5 to 9 illustrate an exemplary method of fabricating the SRAM cell, showing a portion of the SRAM cell corresponding to the sections taken on line X1–X2 in FIGS. 1 and 2.

Figure 10:
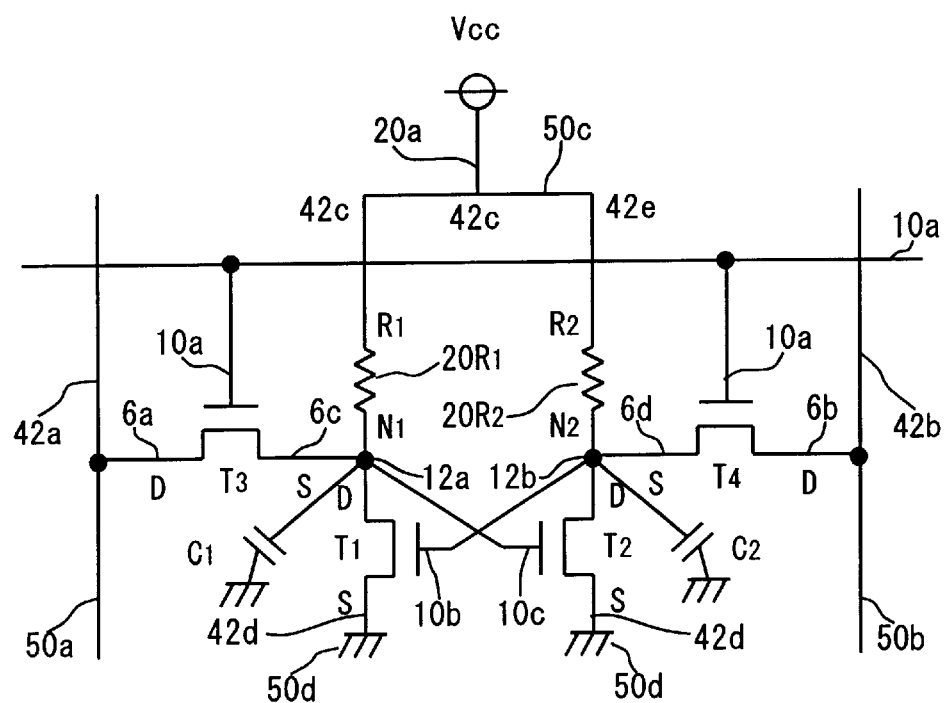

FIG. 10 is a circuit diagram of an equivalent circuit of the SRAM cell in the first embodiment.

The structure of the SRAM cell in the first embodiment will be described in connection with the description of a method of fabricating the SRAM cell with reference to FIGS. 1 to 10.

Figure 5:
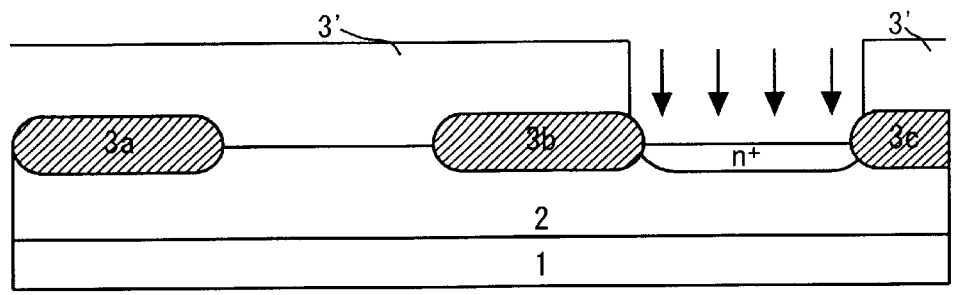

First, referring to FIG. 5, a p-type well 2 (a portion of a semiconductor substrate) is formed by doping an n-type silicon substrate 1 of (100) planes having a resistivity of 10 ohm·cm as a workpiece with boron in an impurity concentration in the range of $1.0 \times 10^{15}$ to $1.0 \times 10^{17}$ atoms/cm$^2$ by ion implantation and thermal diffusion.

Then, 100–1000 nm thick silicon dioxide films 3a, 3b and 3c are formed by a LOCOS process or the like to isolate regions for MOS transistors.

A resist mask 3' is formed on the workpiece, and a region between the silicon dioxide films 3b and 3c, which serves as a portion of the source region of the access MOS transistor T4 which is formed later, and underlies the first conductive film 10c, is doped with atoms of an n-type impurity, such as arsenic atoms, by ion implantation to form an n+-type region, and then the resist mask 3' is removed.

Figure 6:
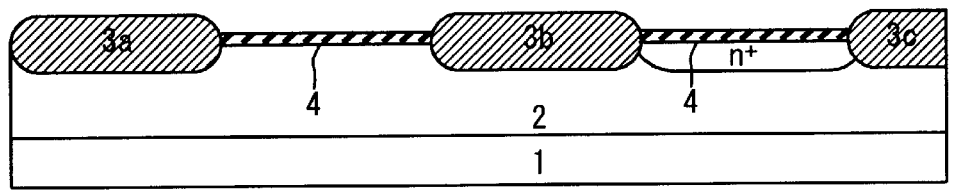

Then, as shown in FIG. 6, a 10–100 nm thick gate oxide film 4 (underlying insulating film) is formed on portions of the surface of the workpiece to be used as the active regions of MOS transistors.

Figure 7:
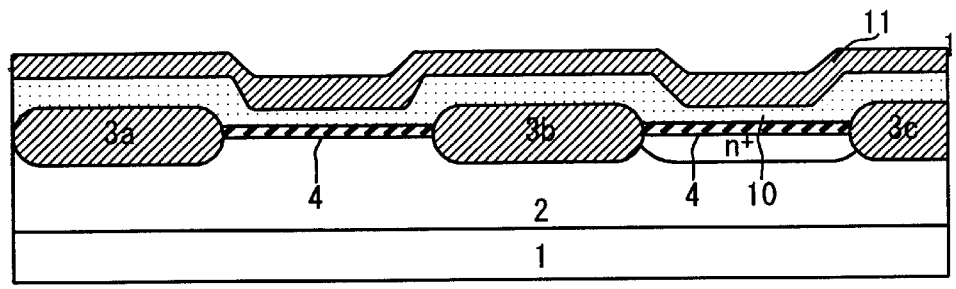

Then, as shown in FIG. 7, the first conductive film 10 (surface conductive film) of polysilicon containing an n-type impurity, such as phosphor, a metal silicide or a metal polycide is deposited on the surface of the workpiece, and then, a 100–1000 nm thick first layer insulating film 11 of SiO$_2$ or the like is deposited over the first conductive film 10.

Figure 8:
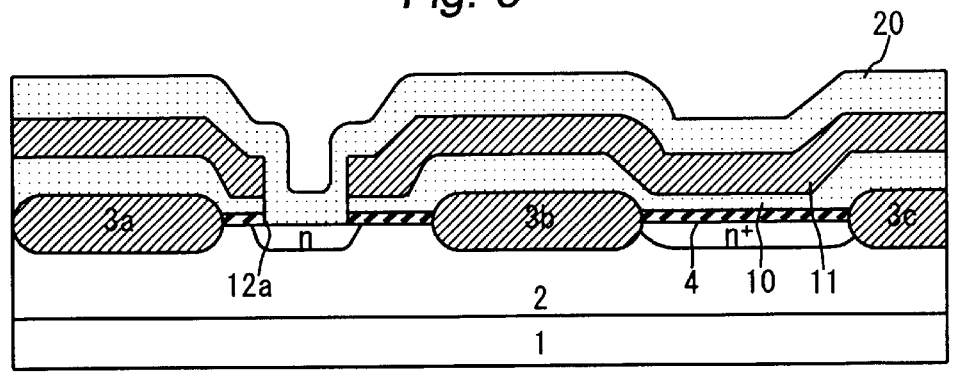

Then, as shown in FIGS. 1 and 8, viaholes 12a and 12b are formed through the first layer insulating film 11, the first conductive film 10 and the gate oxide film 4 by photolithography and etching. Then, a second conductive film 20 of polysilicon or the like is deposited, and the second conductive film 20 is doped with an n-type impurity, such as phosphorus, by ion implantation in a dose in the range of $1.0 \times 10^{12}$ to $1.0 \times 10^{13}$ atoms/cm$^2$.

Figure 9:
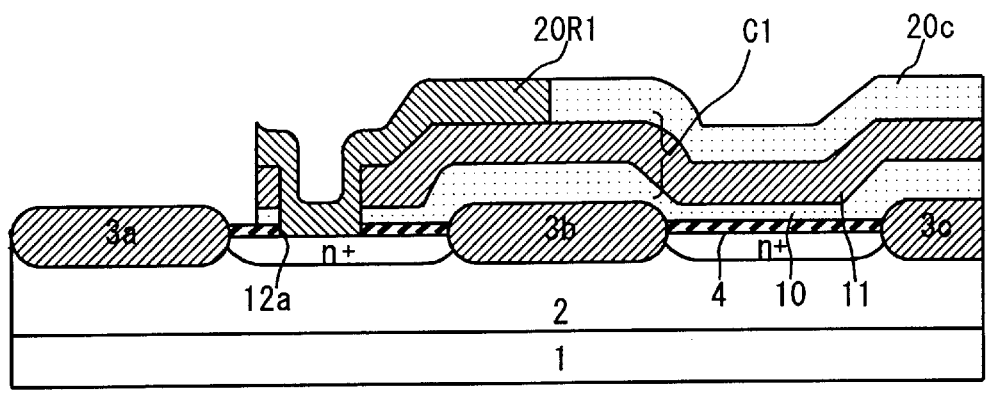

Then, as shown in FIGS. 1 and 9, the second conductive film 20, the first layer insulating film 11 and the first conductive film 10 are patterned simultaneously so as to include layer connection through the viaholes 12a and 12b by photolithography and etching to form first conductive film members 10a, 10b, 10c and 10d, and second conductive film members 20a, 20b, 20c and 20d.

The first conductive film member 10a serves as a common gate electrode shared by the access MOS transistors T3 and T4, and a word line. The first conductive film members 10b and 10c serve as the gate electrodes of the drive MOS transistors T1 and T2, respectively. The first conductive film member 10d serves as the gate electrode of a access MOS transistor included in an adjacent memory cell.

The second conductive film members 20a and 20d serve as power feed lines, and the second conductive film members 20b and 20c serve as the resistors 20R1 and 20R2, respectively.

After the completion of the foregoing patterning process, atoms of an n-type impurity, such as arsenic, are ion-implanted using a mask formed by photolithography to form the source and drain regions of the MOS transistors T1 to T4. At the same time, the second conductive film members 20b and 20c excluding portions for the resistors 20R1 and 20R2 are formed in a low resistance.

As shown in FIGS. 2, 3 and 4, a 100–1000 nm thick insulating film 41 of SiO$_2$ or the like is deposited by a CVD process or the like. Subsequently, viaholes 42a to 43e are formed in the insulating film 41, a 500–2000 nm thick aluminum film is formed, and then the aluminum film is patterned to form aluminum wiring lines 50a to 50d. The aluminum wiring lines 50a and 50b are bit lines, the aluminum wiring line 50c is a power feed line and the aluminum wiring line 50d is a grounding line.

A circuit formed in the memory cell thus fabricated will be described with reference to FIG. 10, in which parts like or corresponding to those shown in FIGS. 1 to 9 are designated by the same reference characters.

As shown in FIG. 1, the first conductive film member 10a serves as a common gate electrode shared by the access MOS transistors T3 and T4, and a word line.

The diffused drains 6a and 6b of the access MOS transistors T3 and T4 are connected through the viaholes 42a and 42b to the aluminum wiring lines 50a and 50b, i.e., bit lines, respectively, as shown in FIG. 2.

The source 6c of the access MOS transistor T3 is connected to the node N1 by a diffused layer as shown in FIG. 1, the node N1 is connected through the viahole 12a formed by etching a portion of the gate oxide film 4 to the first conductive film member 10c as shown in FIG. 3. An extension of the first conductive film member 10c serves as the gate of the drive MOS transistor T2.

The node N1 is connected through the viahole 12a and also to the resistor 20R1. The resistor 20R1 is connected through a viahole 42c to the power feed line 50c formed by etching the third conductive film. The power feed line 50c is connected through the viahole 42c to the power feed line 20a, extending over the word line 10a. A low current supplied from the supply voltage VCC of the power feed line 20a flows through the power feed line 20a and the resistor 20R1 to the diffused source 6c of the access MOS transistor T3.

The second conductive film member 20c, the first conductive film member 10c, and the layer insulating film 11 form a capacitor C1 to store charges in the diffused layer 6c of the storage node N1.

The node N1 is connected to the drain of the drive MOS transistor T1 by a diffused layer.

The source 6d of the access MOS transistor T4 is connected to the node N2 by a diffused layer, the node N2 is connected through the viahole 12b formed by etching a portion of the gate oxide film 4 to the first conductive film member 10b, and an extension of the first conductive film member 10b forms the gate of the drive MOS transistor T1.

As shown in FIGS. 1 and 4, the node N2 is connected to the resistor 20R2. The resistor 20R2 is connected through a viahole 42e to the power feed line 50c as shown in FIG. 2.

The node N2 is connected also to the drain of the drive MOS transistor T2 by a diffused layer.

As shown in FIG. 1, the respective sources S of the drive MOS transistors T1 and T2 are connected by a diffused region, and the diffused region is connected through a viahole 42d to the aluminum wiring line 50d. The aluminum wiring line 50d is kept at a ground potential VSS and is connected to the sources of all the drive MOS transistors of the SRAM. Thus, the circuit shown in FIG. 10 is formed.

In the first embodiment, the second conductive film 20, the first layer insulating film 11, and the first conductive film 10 are patterned simultaneously in the same planar shape so as to include the necessary layer connection. Superposing allowances, which must be secured in the conventional SRAM, are not necessary. Hence, length and width of the memory cell can be reduced.

Since the viaholes 12a and 12b are formed simultaneously through the first layer insulating film 11, the first conductive film 10 and the gate oxide film 4, the second conductive film 20 of polysilicon or the like is deposited, and the second conductive film 20 and the first conductive film 10 are connected to the nodes N1 and N2. The capacitors C1 and C2 formed of the second conductive film 20, the first layer insulating film 11 and the first conductive film 10 can be connected to the storage nodes N1 and N2. Thus, the immunity of the memory cell to soft error attributable to alpha rays and neutrons can be enhanced.

Since the second conductive film 20, the first layer insulating film 11 and the first conductive film 10 are patterned simultaneously, the resistance element forming processes (including an ion implantation process, a photolithographic process and an etching process), which are necessary for fabricating the conventional SRAM, are unnecessary. Hence, the number of processes can be reduced by 15% or more.

Second Embodiment

In a semiconductor device in a second embodiment according to the present invention, the load elements of a SRAM cell are TFTs of a lower gate structure, wherein the gate electrodes of MOS transistors and the lower gate electrodes of the TFTs are formed simultaneously in the same planar shape.

FIGS. 11 to 22 illustrate an exemplary structure of a SRAM cell as a semiconductor device in a second embodiment according to the present invention, and a method of fabricating the SRAM cell.

Figure 11:
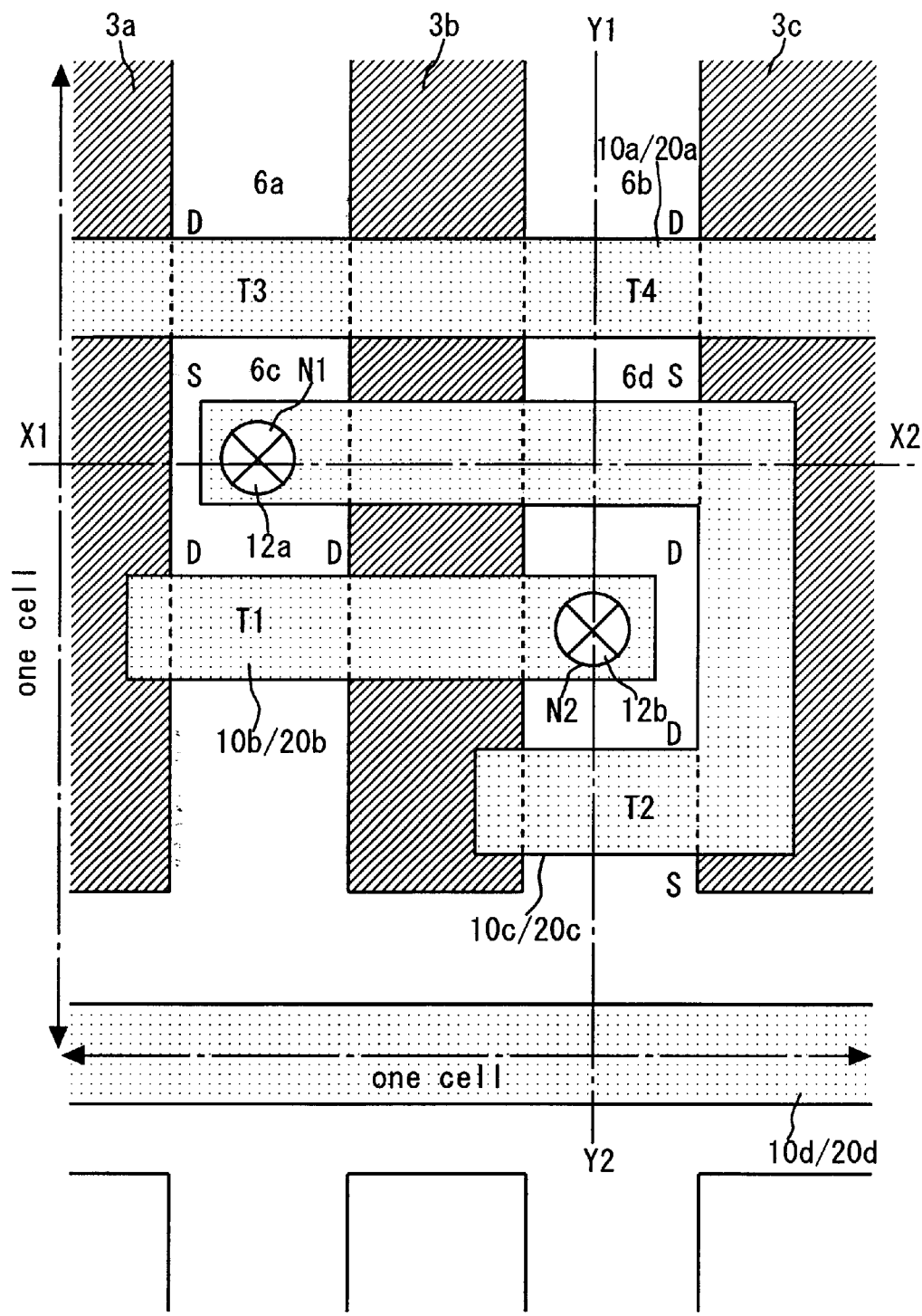
FIGS. 11 to 22 illustrate an exemplary structure of a SRAM cell in a second embodiment according to the present invention, and a method of fabricating the SRAM cell.
Figure 12:
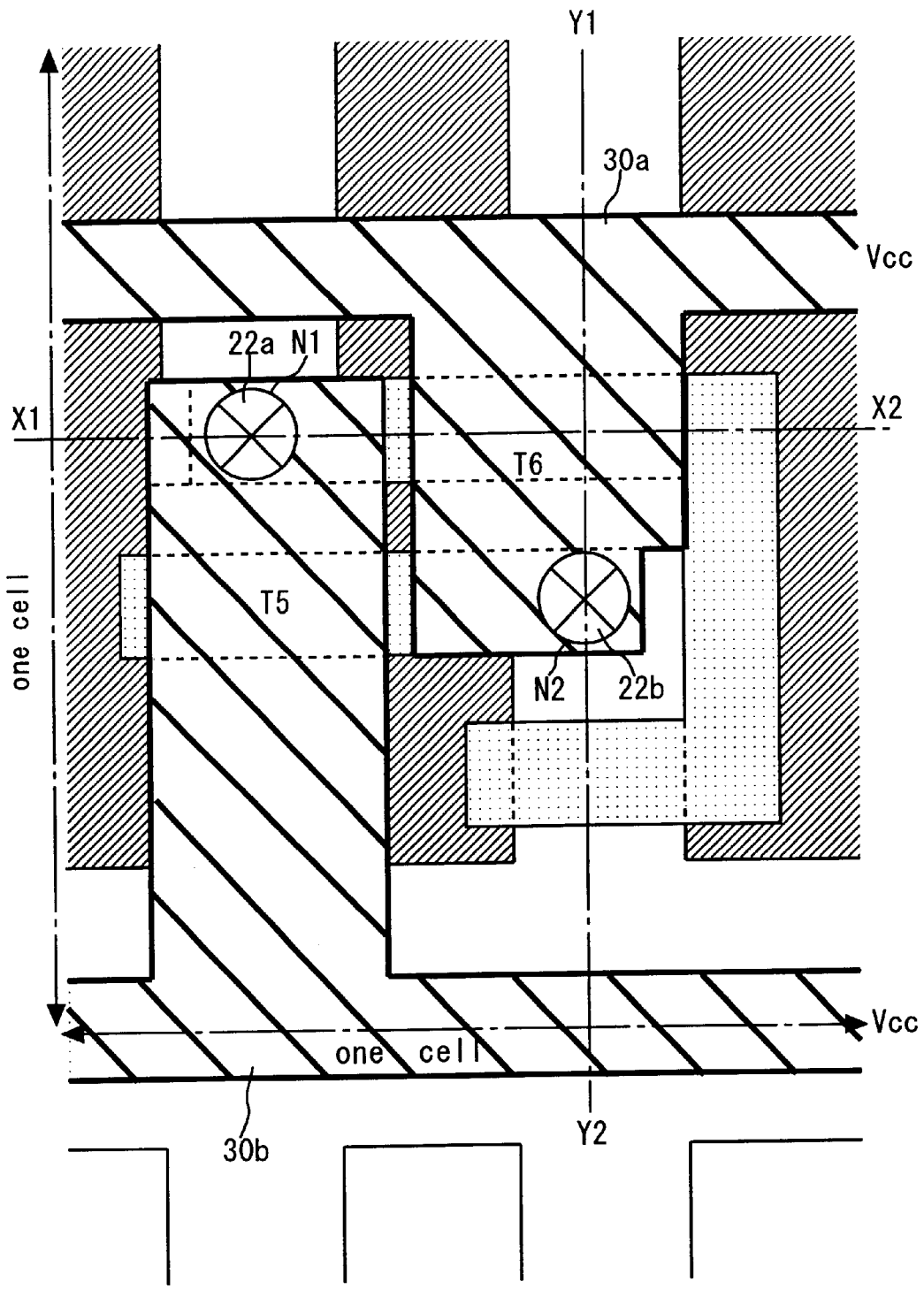
Figure 13:
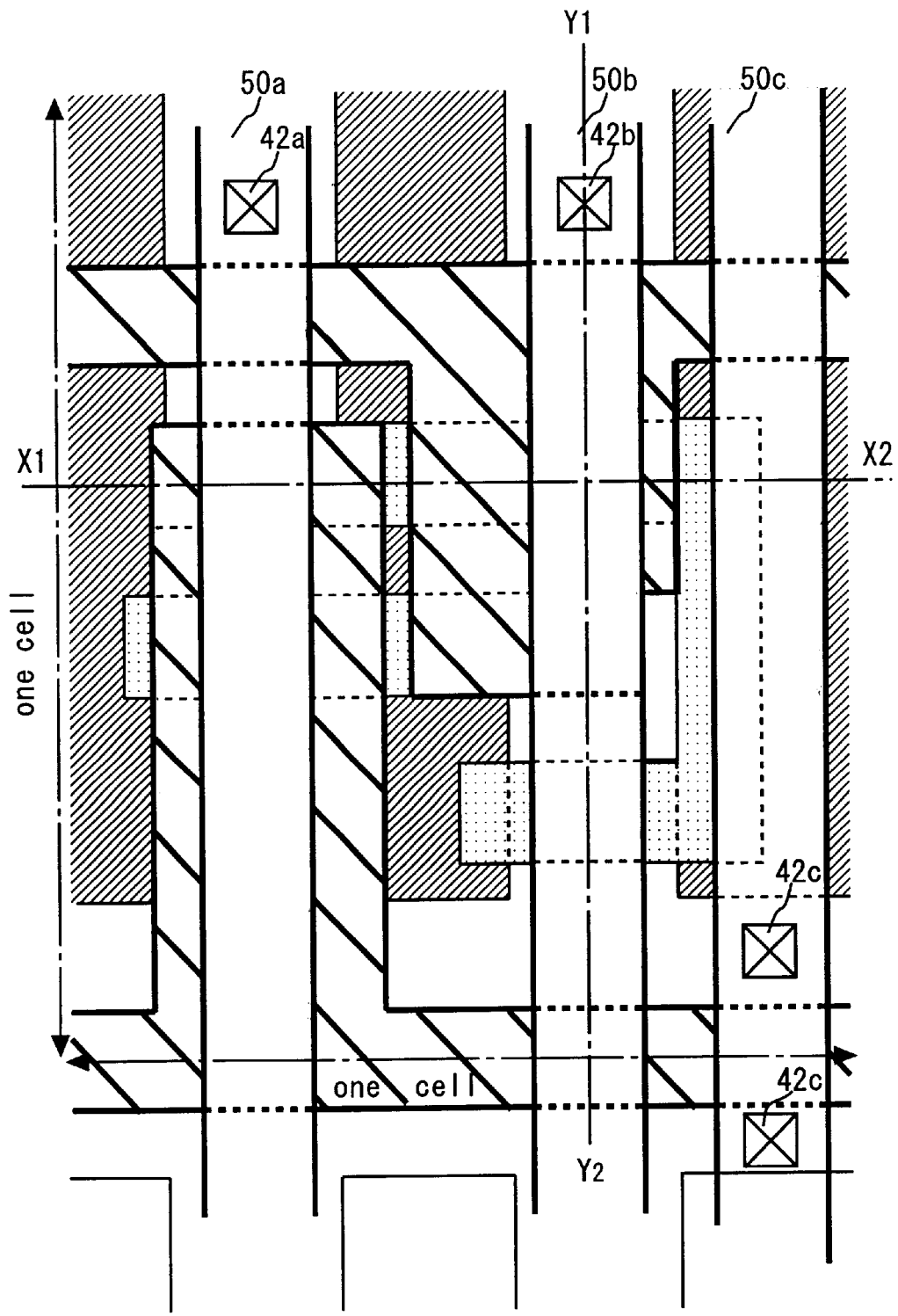

FIGS. 11 to 13 illustrate an exemplary planar layout of the components of the SRAM cell, in which FIG. 11 is a plan view of a first conductive film serving as the gate electrodes of MOS transistors, and a second conductive film serving as the lower gate electrodes of TFTs. FIG. 12 is a plan view of a third conductive film serving as the channels of the TFTs. FIG. 13 is a plan view of a fourth conductive film forming aluminum wiring lines.

Figure 14:
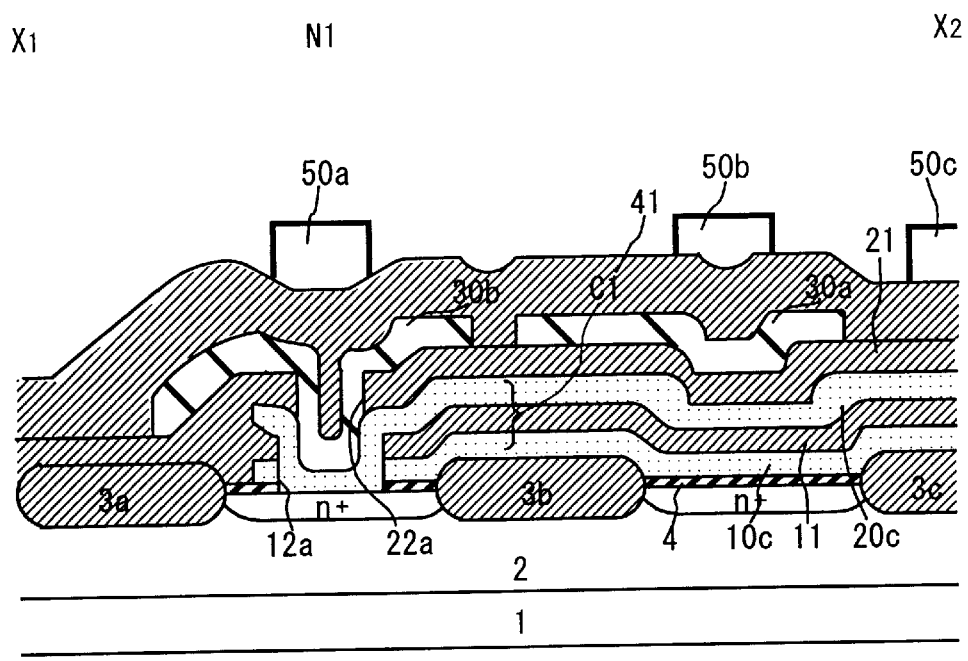
Figure 15:
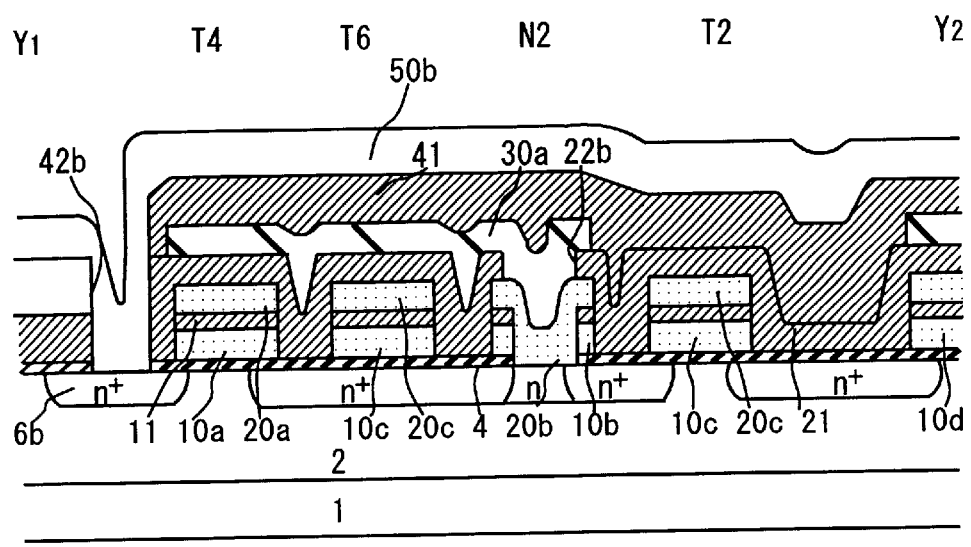

FIGS. 14 and 15 are sectional views taken on lines X1–X2 and Y1–Y2 in FIGS. 11 to 13. FIGS. 16 to 21 illustrate an exemplary method of fabricating the SRAM cell, showing a portion of the SRAM cell corresponding to the sections taken on line X1–X2 in FIGS. 11 to 13. FIG. 22 is a circuit diagram of an equivalent circuit of the SRAM cell in the second embodiment.

The structure of the SRAM cell in the second embodiment will be described in connection with the description of a method of fabricating the SRAM cell with reference to FIGS. 17 to 22.

Figure 16:
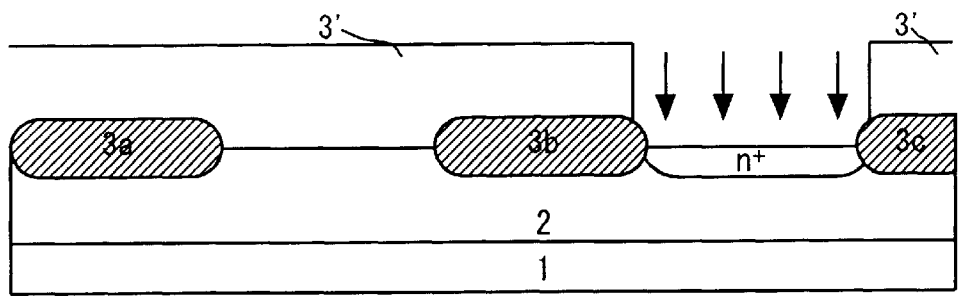

Referring to FIG. 16, a p-type well 2 is formed by doping an n-type silicon substrate 1 of (100) planes having a resistivity of 10a ohm·cm as a workpiece with boron in an impurity concentration in the range of $1.0\times10^{15}$ to $1.0\times10^{17}$ atoms/cm$^2$ by ion implantation and thermal diffusion. Then, 100–1000 nm thick silicon dioxide films 3a, 3b and 3c are formed by a LOCOS process or the like to isolate regions for MOS transistors.

A resist mask 3' is formed on the workpiece, and a region between the silicon dioxide films 3b and 3c is doped with atoms of an n-type impurity, such as arsenic atoms, by ion implantation to form an n+-type region, and then the resist mask 3' is removed. The region between the silicon dioxide films 3b and 3c serves as a portion of the source region of an access MOS transistor T4 which is formed later, and underlies a first conductive film member 10c.

Figure 17:
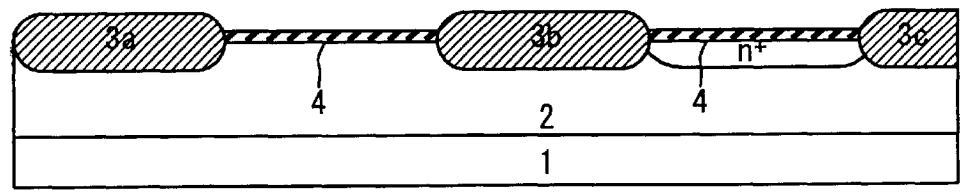

Then, as shown in FIG. 17, a 10–100 nm thick gate oxide film 4 is formed on portions of the surface of the workpiece to be used as the active regions of MOS transistors.

Figure 18:
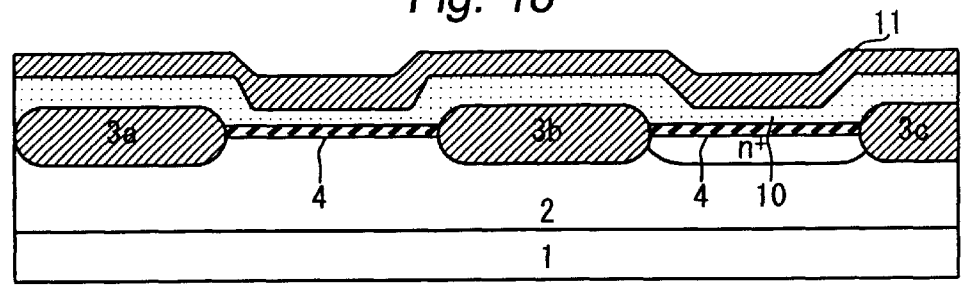

Then, as shown in FIG. 18, a first conductive film 10 of polysilicon containing an n-type impurity, such as phosphor, a metal silicide or a metal polycide is deposited on the surface of the workpiece, and then, a 100–1000 nm thick first layer insulating film 11 of SiO$_2$ or the like is deposited over the first conductive film 10.

Figure 19:
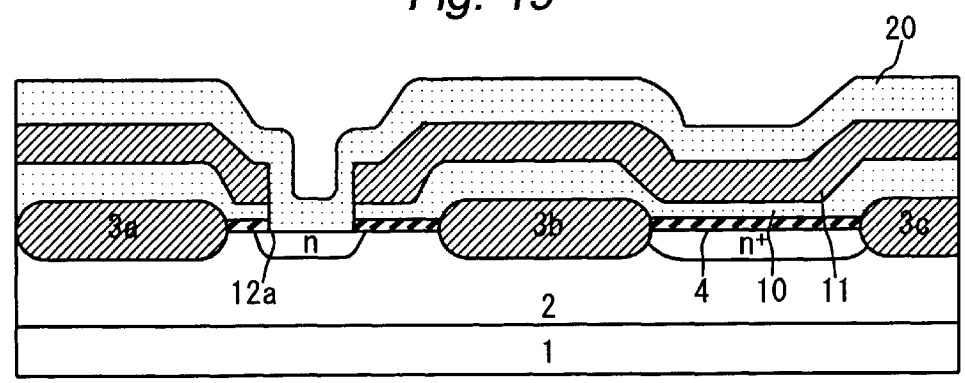

Then, as shown in FIGS. 11 and 19, viaholes 12a and 12b are formed through the first layer insulating film 11, the first conductive film 10 and the gate oxide film 4 by photolithography and etching. Then, a second conductive film 20 of polysilicon or the like is deposited, and the second conductive film 20 is doped with an n-type impurity, such as phosphorus, by ion implantation in a dose in the range of $1.0\times^{12}$ to $1.0\times10^{13}$ atoms/cm$^2$.

Figure 20:
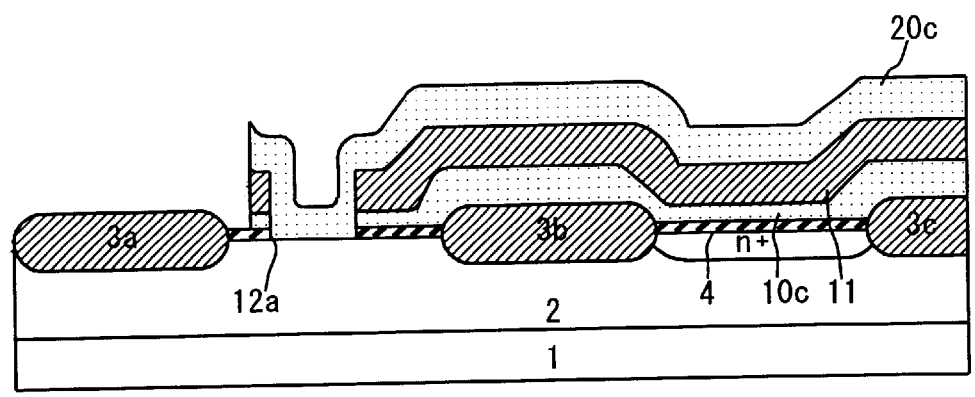

Then, as shown in FIGS. 11 and 20, the second conductive film 20, the first layer insulating film 11 and the first conductive film 10 are patterned simultaneously. The patterns include layer connection through the viaholes 12a and 12b by photolithography and etching to form first conductive film members 10a, 10b, 10c and 10d, and second conductive film members 20a, 20b, 20c and 20d in the same planar shape.

The first conductive film member 10a serves as a common gate electrode shared by access MOS transistors T3 and T4, and a word line. The first conductive film members 10b and 10c serve as the gate electrodes of the drive MOS transistors T1 and T2, respectively. The first conductive film member 10d serves as the gate electrode of an access MOS transistor included in an adjacent memory cell.

The second conductive film members 20b and 20c serve as the lower gate electrodes of TFTs and the second conductive film members 20a and 20d form capacitors together with an insulating film which will be formed later.

After the completion of the foregoing patterning process, atoms of an n-type impurity, such as arsenic, are ion-implanted in the patterned film using a mask formed by photolithography to form the source and drain regions of the MOS transistors T1 to T4 and, at the same time, the second conductive film members 20a to 20d are formed in a low resistance.

Figure 21:
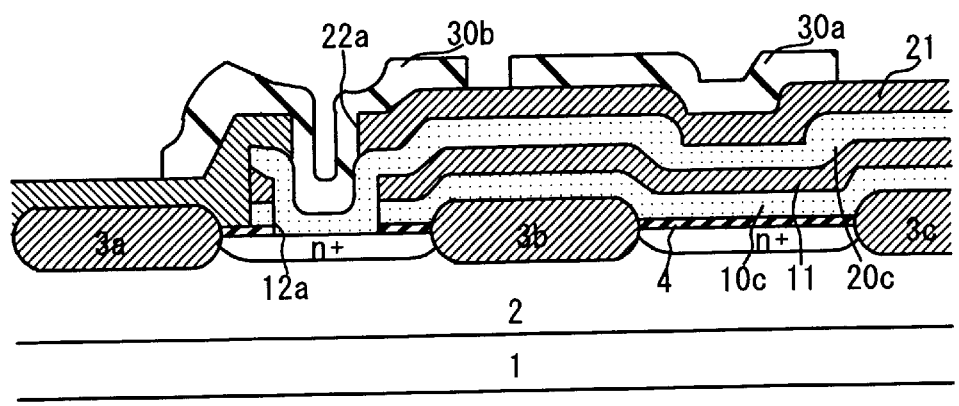
Figure 22:
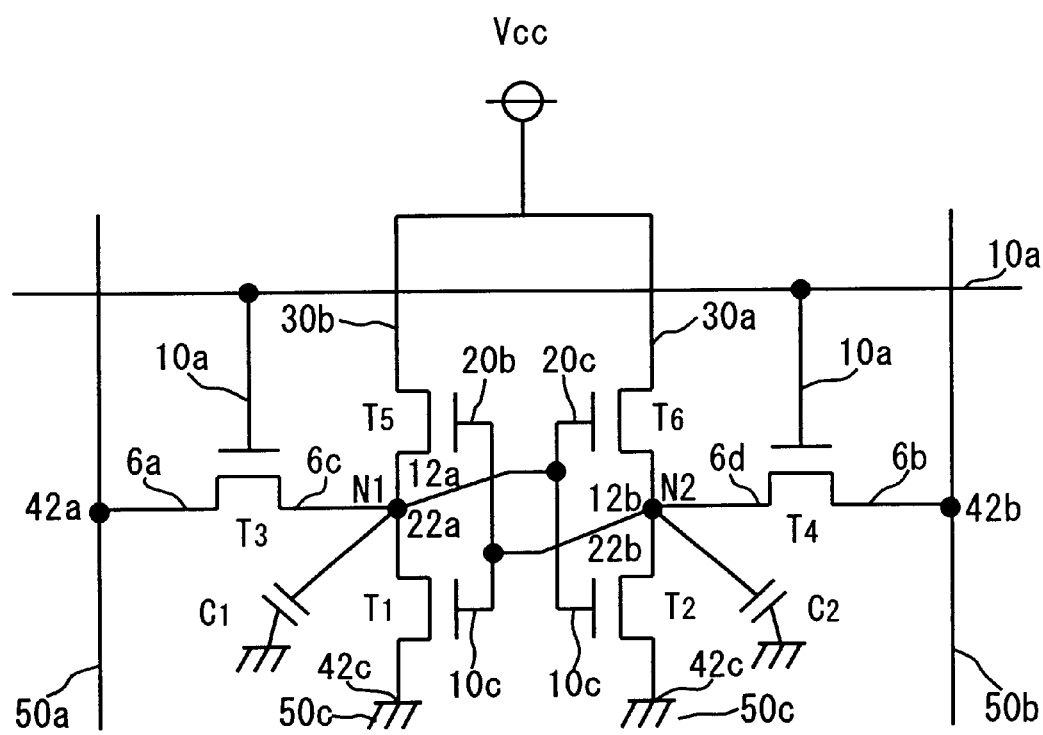

As shown in FIG. 21, a 100–1000 nm thick second layer insulating film 21 of SiO$_2$ or the like is deposited. Then, as shown in FIGS. 12 and 21, viaholes 22a and 22b are formed in the second layer insulating film 21 by photolithography and etching. The viaholes 12a and 12b can be substituted by the viaholes 22a and 22b, and the viaholes 12a and 12b may be omitted.

A third conductive film 30 (including members 30a and 30b) of polysilicon or the like is deposited, and the third conductive film 30 is processed by photolithography and etching to form third conductive film members 30a and 30b.

The third conductive film members 30a and 30b serve as the channels of the TFTs and also as power feed lines for feeding power of supply voltage VCC. The surfaces of the third conductive film members 30a and 30b are doped with a p-type impurity, such as boron, by ion implantation in a dose in the range of $1.0 \times 10^{12}$ to $1.0 \times 10^{13}$ atoms/cm$^2$ to form the channel regions of the TFTs. Then, atoms of a p-type impurity, such as boron, are implanted by ion implantation in a dose in the range of $1.0 \times 10^{14}$ to $1.0 \times 10^{15}$ atoms/cm$^2$ using a mask formed by photolithography to form the sources and drains of the TFTs T5 and T6, and low-resistance regions in the power feed lines for feeding power of supply voltage VCC.

Referring to FIGS. 14 and 15, a 100–1000 nm thick insulating film 41 of SiO$_2$ or the like is deposited by a CVD process or the like. Then, as shown in FIG. 13, layer viaholes 42a, 42b and 42c are formed in the insulating film 41, a 500–2000 nm thick fourth conductive film of aluminum is deposited, and the fourth conductive film is patterned to form aluminum wiring lines 50a, 50b and 50c. The aluminum wiring lines 50a and 50b are bit lines, and the aluminum wiring line 50c is a grounding line.

A circuit formed in the memory cell thus fabricated will be described with reference to FIG. 22, in which parts like or corresponding to those shown in FIGS. 11 to 21 are designated by the same reference characters.

As shown in FIG. 11, the first conductive film member 10a serves as a common gate electrode shared by the access MOS transistors T3 and T4, and a word line.

The diffused drains 6a and 6b of the access MOS transistors T3 and T4 are connected through the viaholes 42a and 42b to the aluminum wiring lines 50a and 50b, i.e., bit lines, respectively, as shown in FIG. 13.

The source 6c of the access MOS transistor T3 is connected to the node N1 by a diffused layer as shown in FIG. 11, the node N1 is connected through the viahole 12a formed by etching a portion of the gate oxide film 4 to the first conductive film member 10c, and an extension of the first conductive film member 10c serves as the gate of the drive MOS transistor T2.

As shown in FIGS. 12 and 14, one end of the node N1 is connected through the viahole 12a and to the third conductive film member 30b serving as the channel of the TFT. The other end of the third conductive film member 30b serves as a power feed line. The node N1 is connected to the drain of the drive MOS transistor T1 by a diffused layer as shown in FIG. 11.

The source 6d of the access MOS transistor T4 is connected to the node N2 by a diffused layer as shown in FIG. 11. The node N2 is connected through the viahole 12b formed by etching a portion of the gate oxide film 4 to the first conductive film member 10b. The first conductive film member 10b serves as the gate of the drive MOS transistor T1.

As shown in FIGS. 12 and 15, one end of the node N2 is connected through the viahole 22b to the third conductive film member 30a, serving as the channel region of the TFT T6. The other end of the third conductive film member 30a serves as a power feed line. The node N2 is connected to the drain of the drive MOS transistor T2 by a diffused layer.

The second conductive film members 20c and 20b, the first conductive film members 10c and 10b, and the layer insulating film 11 form capacitors C1 and C2, respectively, to supply charges to the diffused layers 6c and 6d of the nodes N1 and N2.

The respective sources S of the drive MOS transistors T1 and T2 are connected by a diffused region as shown in FIG. 11. As is obvious from FIG. 13, the diffused region is connected through the viaholes 42c to the aluminum wiring line 50c, i.e., a grounding line. The aluminum wiring line 50c is kept at a ground potential VSS and is connected to the sources of all of the drive MOS transistors of the SRAM. Thus, the circuit shown in FIG. 22 is formed.

In the second embodiment, the second conductive film members 20a to 20d, the first layer insulating film 11, and the first conductive film members 10a to 10d are patterned simultaneously. All of the patterns are in the same planar shape so as to include the necessary layer connection. Therefore, any superposing allowances, which must be secured in the conventional SRAM, are not necessary. Hence, the memory cell can be formed in a reduced length and a reduced width.

Since the viaholes 12a and 12b are formed simultaneously through the first layer insulating film 11, the first conductive film 10 and the gate oxide film 4, the second conductive film 20 (such as polysilicon or the like) is deposited. Hence, the second conductive film 20 and the first conductive film 10 are connected to the storage nodes N1 and N2. Thus, the capacitors C1 and C2 formed of the second conductive film 20, the first layer insulating film 11 and the first conductive film 10 can also be connected to the storage nodes N1 and N2. As a result, the immunity of the memory cell to soft error attributable to alpha rays and neutrons can be enhanced.

Since the second conductive film 20, the first layer insulating film 11 and the first conductive film 10 are patterned simultaneously, the resistance element forming processes including an ion implantation process, a photolithographic process and an etching process, which are necessary for fabricating the conventional SRAM, are unnecessary. Hence, the number of processes can be reduced by 15% or more.

Third Embodiment

In a semiconductor device in a third embodiment according to the present invention, the load elements of a SRAM cell are TFTs of an upper gate structure, and the gate electrodes of MOS transistors and the channels of the TFTs are formed simultaneously in the same planar shape.

FIGS. 11, 16 to 20 and 23 to 28 illustrate an exemplary structure of a SRAM cell as a semiconductor device in a third embodiment according to the present invention, and a method of fabricating the SRAM cell.

Figure 23:
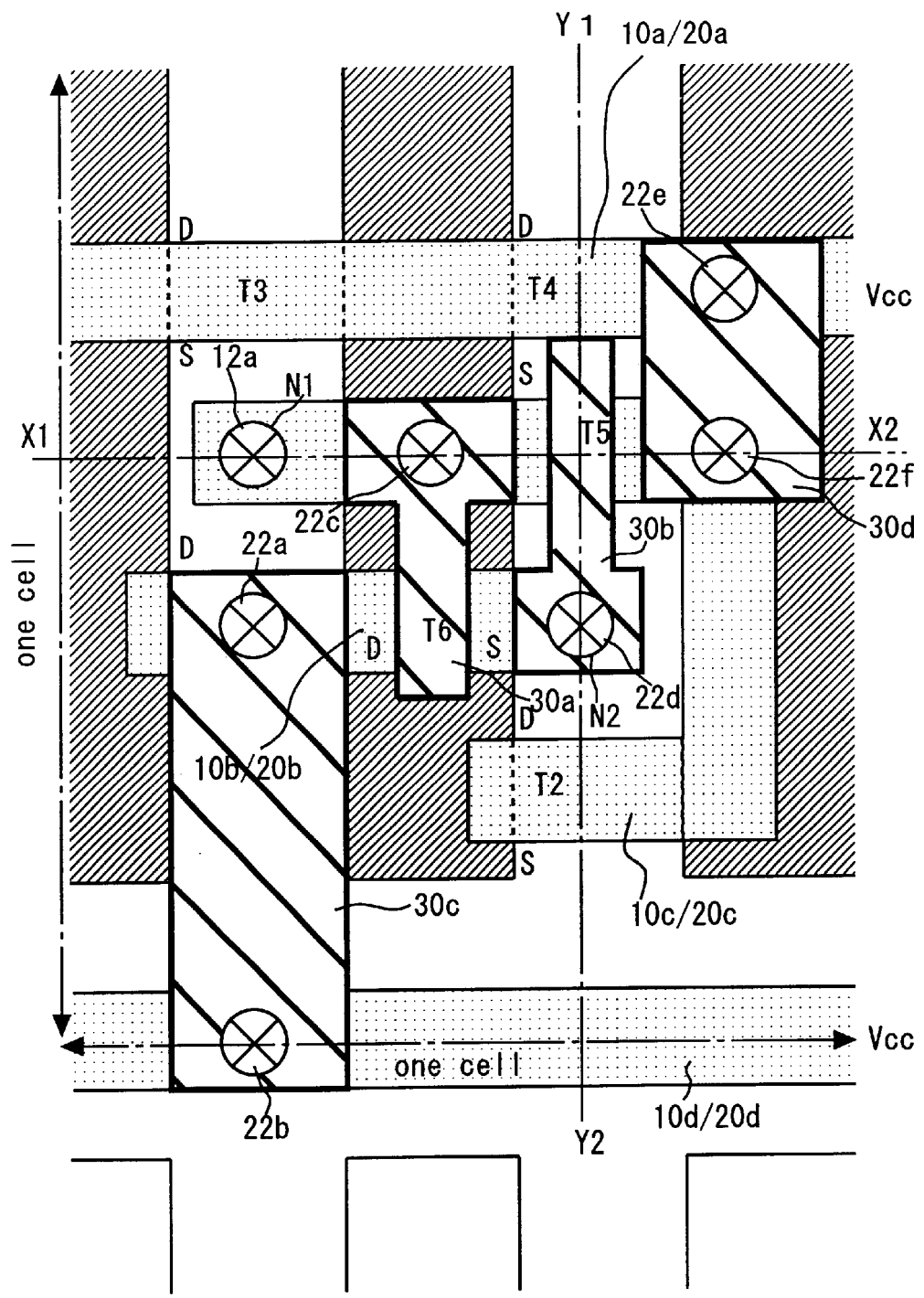
FIGS. 23 to 28 are views for explaining the structure of a SRAM cell as a semiconductor device in a third embodiment according to the present invention, and a method of fabricating the SRAM cell.
Figure 24:
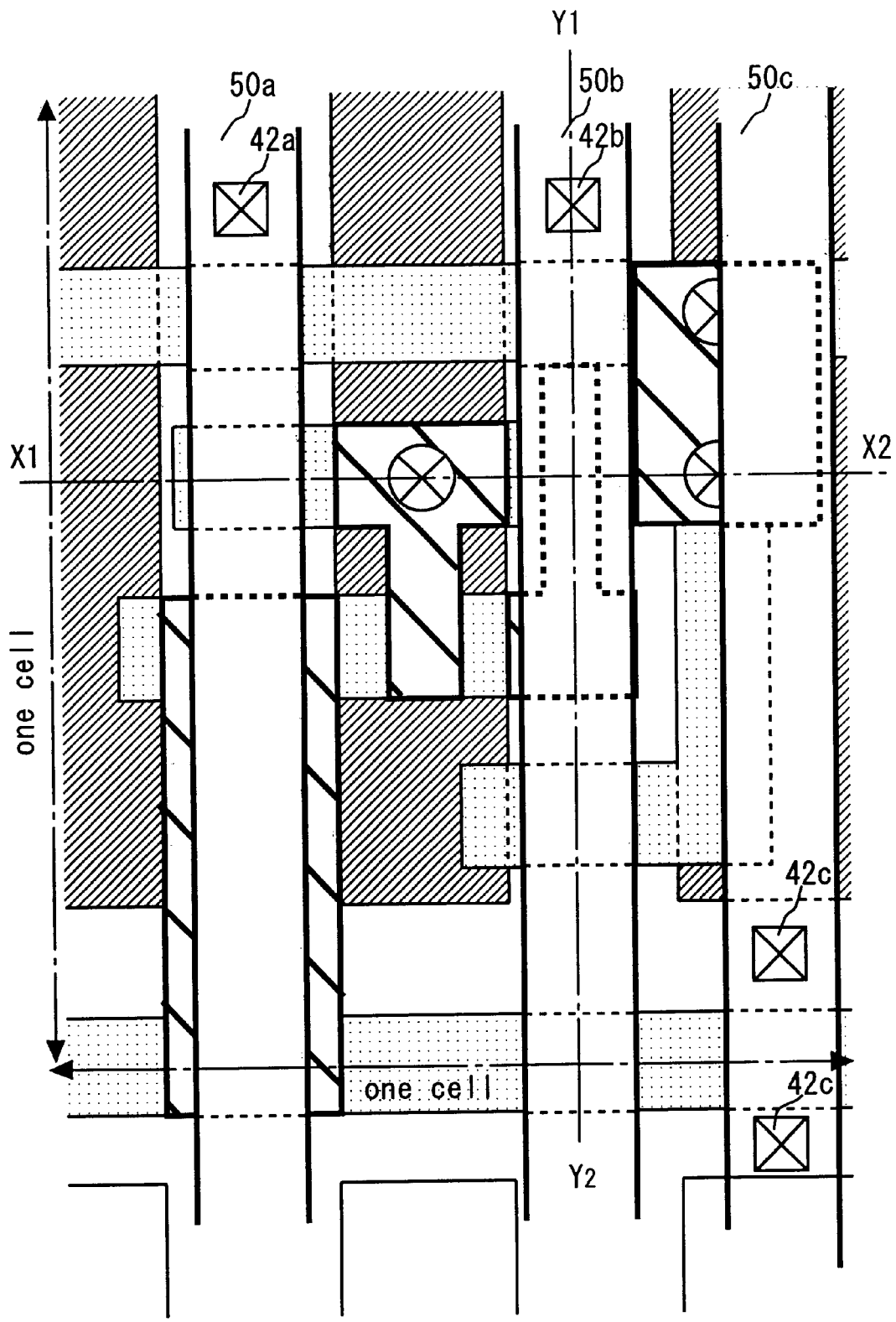

FIGS. 11, 23 and 24 illustrate an exemplary planar layout of the components of the SRAM cell, in which FIG. 11 is a plan view of a first conductive film serving as the gate electrodes of MOS transistors, and a second conductive film serving as the channel regions of TFTs. FIG. 23 is a plan view of a third conductive film serving as the upper gate electrodes of the TFTs, and FIG. 24 is a plan view of a fourth conductive film forming aluminum wiring lines.

Figure 25:
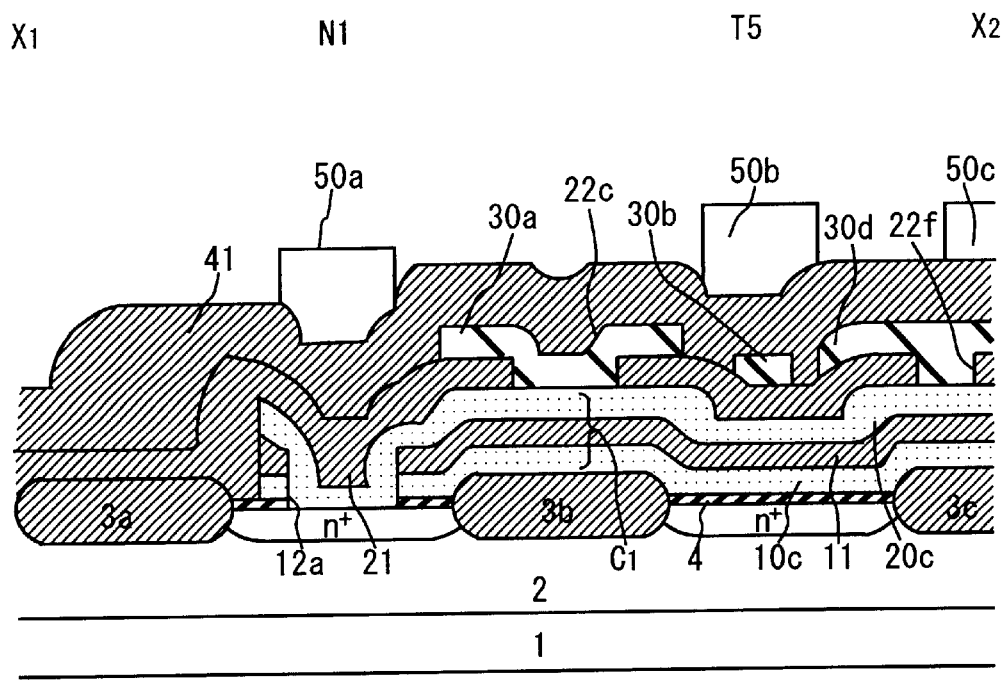
Figure 26:
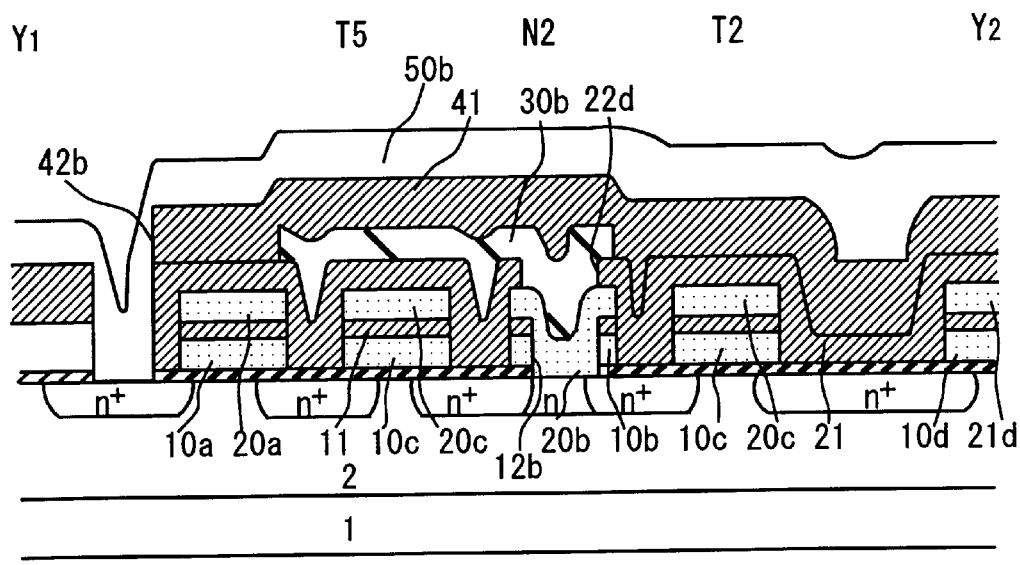

FIGS. 25 and 26 are sectional views taken on lines X1–X2 and Y1–Y2 in FIGS. 11, 23 and 24. FIGS. 16 to 20 and 27 illustrate an exemplary method of fabricating the SRAM cell, showing a portion of the SRAM cell corresponding to the sections taken on line X1–X2 in FIGS. 11, 23 and 24. FIG. 28 is a circuit diagram of an equivalent circuit of the SRAM cell in the third embodiment.

The structure of the SRAM cell in the third embodiment will be described in connection with the description of a method of fabricating the SRAM cell with reference to FIGS. 23 to 28.

Processes similar to those for fabricating the SRAM cell in the second embodiment previously described with reference to FIGS. 11 and 16 to 20 are carried out.

Figure 27:
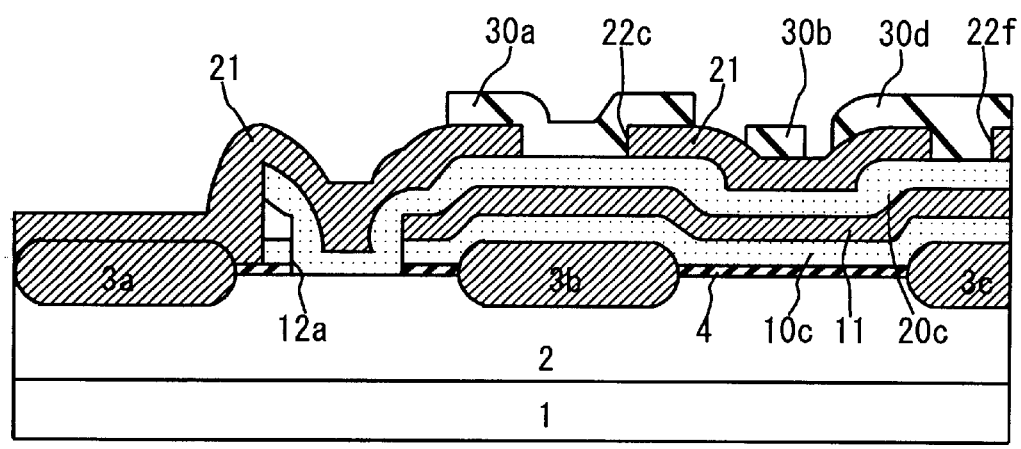
Figure 28:
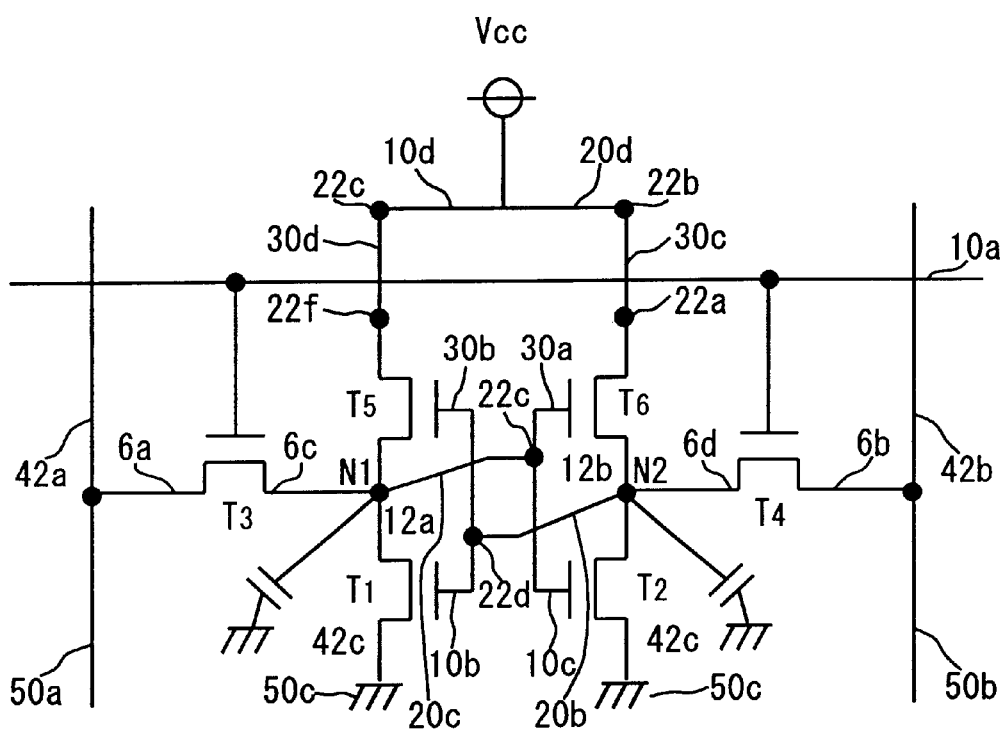

Then, referring to FIG. 27, a 100–1000 nm thick second layer insulating film 21 of $SiO_2$ or the like is deposited. As shown in FIG. 23, layer viaholes 22a to 22f are formed in the second layer insulating film 21 by photolithography and etching. Then, a third conductive film 30 (30a, 30b, 30c, 30d) of polysilicon or the like is deposited, and the third conductive film 30 is doped with a p-type impurity, such as boron, by ion implantation in a dose in the range of $1.0 \times 10^{14}$ to $1.0 \times 10^{15}$ atoms/cm$^2$. Then, the upper gate electrodes 30a and 30b of TFTs T5 and T6, and conductive layers 30c and 30d are formed by photolithography and etching.

Referring to FIGS. 25 and 26, a 100–1000 nm thick insulating film 41 of $SiO_2$ or the like is deposited by a CVD process or the like. Then, as shown in FIG. 24, layer viaholes 42a, 42b and 42c are formed in the insulating film 41, a 500–2000 nm thick fourth conductive film is formed, and the fourth conductive film is patterned to form aluminum wiring lines 50a, 50b and 50c. The aluminum wiring lines 50a and 50b are bit lines, and the aluminum wiring line 50c is a grounding line.

A circuit formed in the memory cell thus fabricated will be described with reference to FIG. 28, in which parts like or corresponding to those shown in FIGS. 11, 16 to 20 and 23 to 27 are designated by the same reference characters.

The formation of the TFTs T5 and T6 by the first conductive film members 10a to 10c is the same as that in the second embodiment. Hence, the description thereof will be omitted.

The connection of the first conductive film members 10a to 10d and the second conductive film members 20a to 20d is the same as that in the second embodiment. In the third embodiment, the second conductive film members 20b and 20c are the channel regions of the TFTS, and the second conductive film members 20a and 20d are power feed lines.

Referring to FIGS. 23 and 25, the second conductive film member 20c is connected through the viahole 22c to the third conductive film member 30a serving as the upper electrode of the TFT T6. The second conductive film member 20c is connected through the viahole 22f to one end of the third conductive film member 30d, and the other end of the third conductive film member 30d is connected through the viahole 22e to the second conductive film member 20a serving as a power feed line.

The second conductive film member 20b is connected through the viahole 22d to the third conductive film member 30b, serving as the upper electrode of the TFT T5. The second conductive film member 20b is connected through the viahole 22a to one end of the third conductive film member 30c, and the other end of the third conductive film member 30c is connected through the viahole 22b to the second conductive film member 20d serving as a power feed line. Thus, the TFTs T5 and T6 are formed.

The aluminum wiring lines 50a to 50c formed by patterning the fourth conductive film are the same as those of the second embodiment. The aluminum wiring lines 50a and 50b, similar to those of the second embodiment, are connected to the diffused drain layers 6a and 6b of the access MOS transistors T3 and T4. The aluminum wiring line 50c serving as a grounding line, similar to that of the second embodiment, is connected to the sources S of the drive MOS transistors T1 and T2. Thus, the circuit shown in FIG. 28 is formed.

In the third embodiment, the second conductive film members 20a to 20d, the first layer insulating film 11, and the first conductive film members 10a to 10d are patterned simultaneously in the same planar shape so as to include the necessary layer connection. Therefore, superposing allowances (which must be secured in the conventional SRAM), are not necessary. Hence, the memory cell can be formed having a reduced length and width.

Since the capacitors C1 and C2 are formed of the second conductive film 20, the first layer insulating film 11 and the first conductive film 10 can be connected to the storage nodes N1 and N2. Thus, the immunity of the memory cell to soft error attributable to alpha rays and neutrons is enhanced.

Since the second conductive film 20, the first layer insulating film 11 and the first conductive film 10 are patterned simultaneously, the resistance element forming processes (including an ion implantation process, a photolithographic process and an etching process, which are necessary for fabricating the conventional SRAM) are unnecessary. Hence, the number of processes can be reduced by 15% or more.

Fourth Embodiment

In a semiconductor device in a fourth embodiment according to the present invention, the load elements of a SRAM cell are TFTs of a double gate structure, wherein the lower gates of TFTs, a first layer insulating film and the gate electrodes of MOS transistors are formed simultaneously.

FIGS. 11, 12, 16 to 21 and 29 to 34 illustrate an exemplary structure of a SRAM cell as a semiconductor device in a fourth embodiment according to the present invention, and a method of fabricating the SRAM cell.

Figure 29:
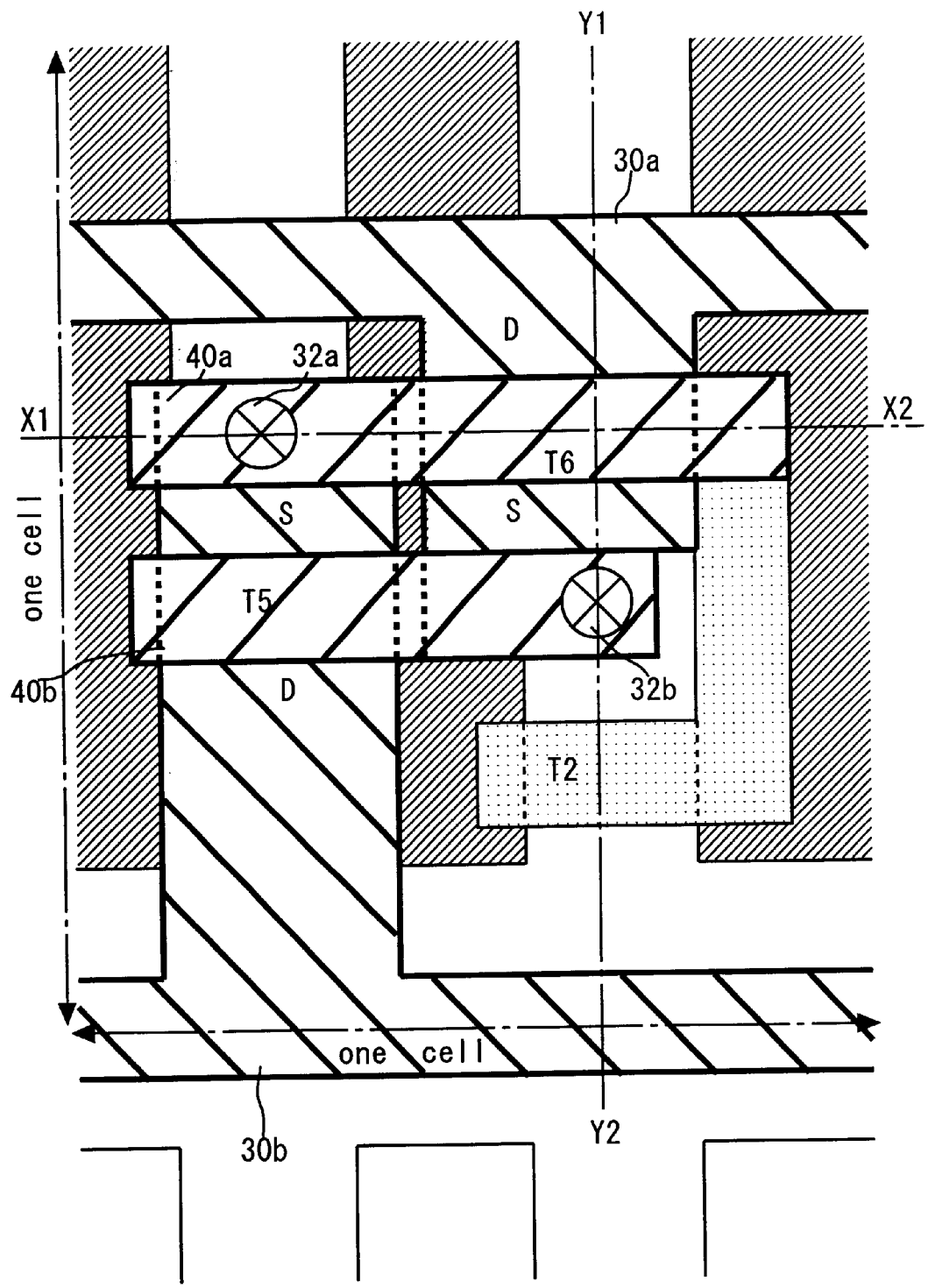
FIGS. 29 to 34 illustrate an exemplary structure of a SRAM cell as a semiconductor device in a fourth embodiment according to the present invention, and a method of fabricating the SRAM cell.
Figure 30:
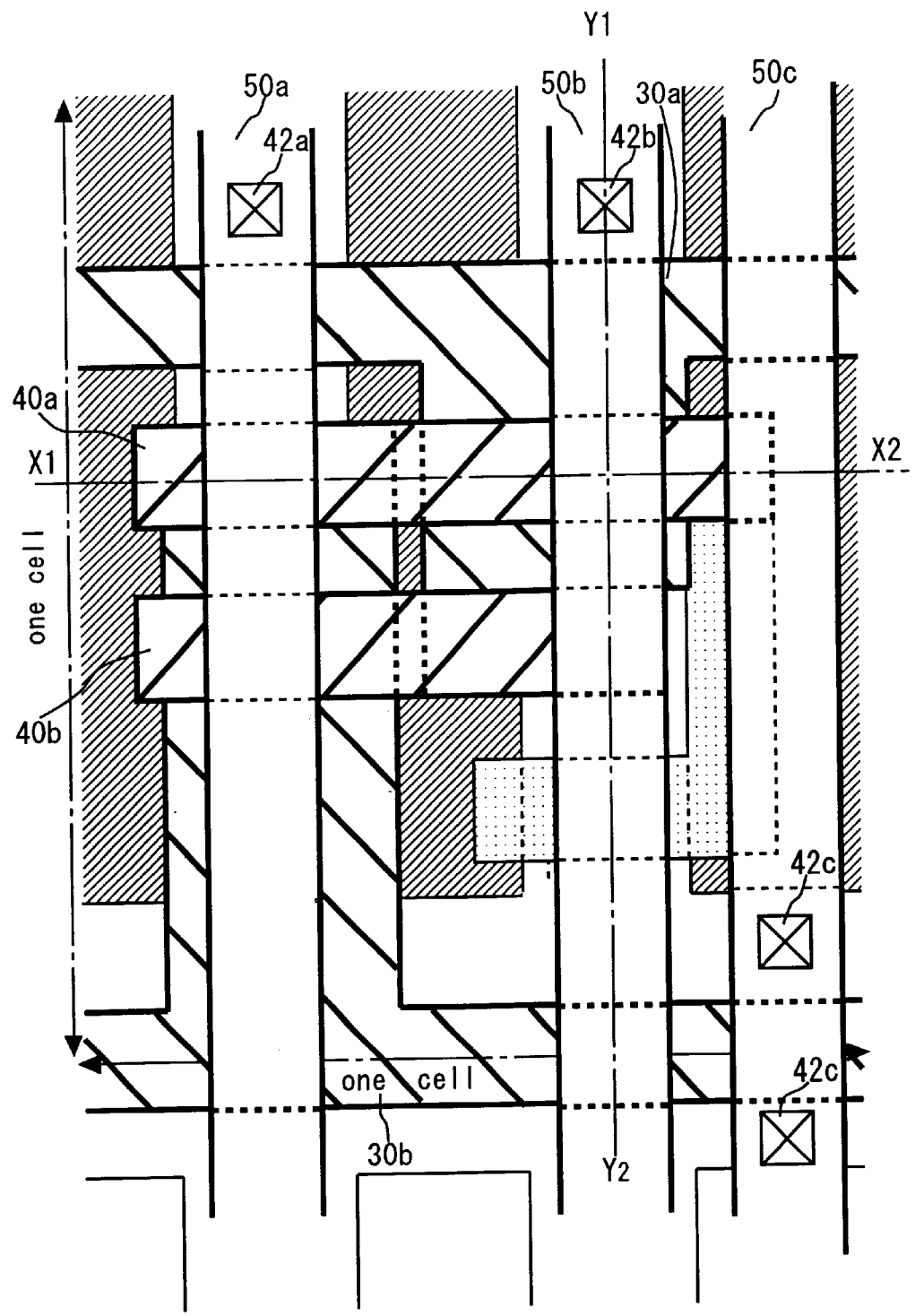

FIGS. 11, 12, 29 and 30 illustrate an exemplary planar layout of the components of the SRAM cell, in which FIG. 11 is a plan view of a first conductive film serving as the gate electrodes of MOS transistors, and a second conductive film serving as the lower gate electrodes of TFTs. FIG. 12 is a planar layout of a third conductive film serving as the channel regions of the TFTs. FIG. 29 is a planar layout of a fourth conductive film serving as the upper gate electrodes of the TFTs. FIG. 30 is a planar layout of aluminum wiring lines formed by patterning a fifth conductive film.

Figure 31:
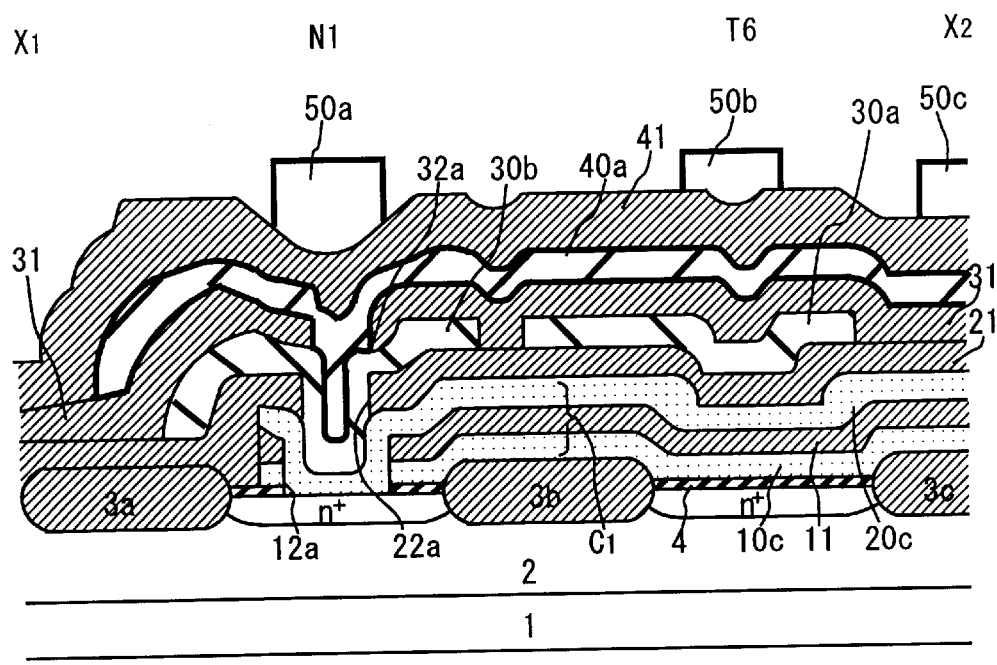
Figure 32:
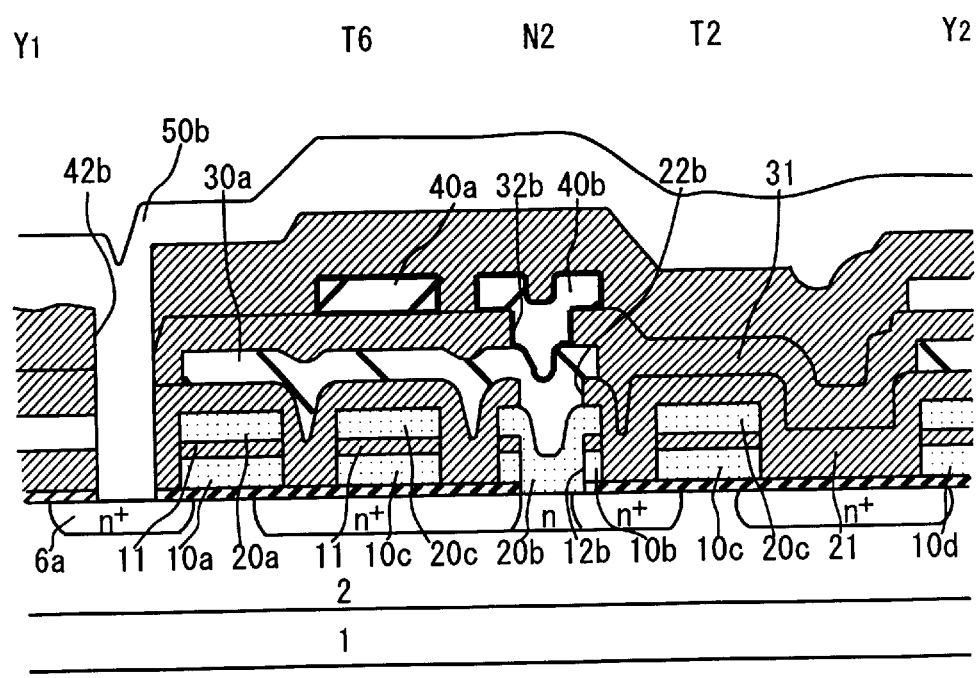

FIGS. 31 and 32 are sectional views showing a portion of the SRAM cell corresponding to the sections taken on lines X1–X2 and Y1–Y2 in FIGS. 11 to 12 and 29 to 30.

FIGS. 16 to 21 and 33 illustrate an exemplary method of fabricating the SRAM cell, showing a portion of the SRAM cell corresponding to the sections taken on line X1–X2 in FIGS. 11, 12, 29 and 30. FIG. 34 is a circuit diagram of an equivalent circuit of the SRAM cell in the fourth embodiment.

The structure of the SRAM cell in the fourth embodiment will be described in connection with the description of a method of fabricating the SRAM cell with reference to FIGS. 11, 12, 16 to 21 and 29 to 34.

Processes similar to those for fabricating the SRAM cell in the second embodiment previously described with reference to FIGS. 11, 12 and 16 to 21 are carried out.

Figure 33:
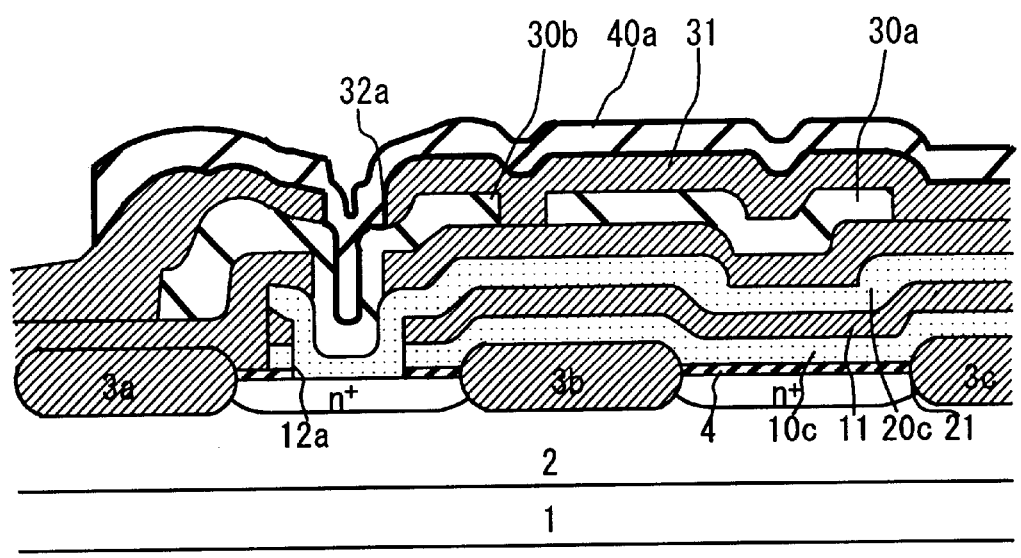
Figure 34:
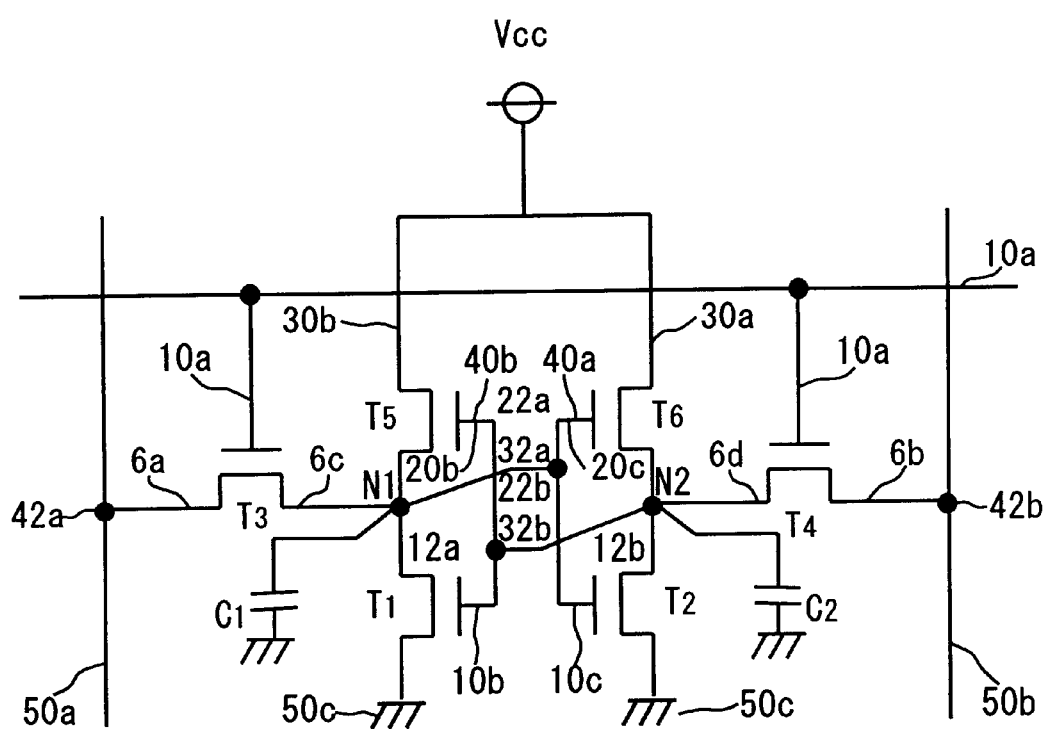

Referring to FIG. 33, a 100–1000 nm thick third layer insulating film 31 of $SiO_2$ or the like is deposited. As shown in FIG. 29, layer viaholes 32a and 32b are formed in the third layer insulating film 31 by photolithography and etching. Then, a fourth conductive film 40 (40a, 40b) of polysilicon or the like is deposited, and the fourth conductive film 40 is doped with a p-type impurity, such as boron, by ion implantation in an impurity concentration in the range of $1.0 \times 10^{14}$ to $1.0 \times 10^{15}$ atoms/cm$^2$. Then, the upper gate electrodes 40b and 40a of TFTs T5 and T6 are formed by photolithography and etching.

Referring to FIGS. 31 and 32, a 100–1000 nm thick insulating film 41 of SiO$_2$ or the like is deposited by a CVD process or the like. Then, as shown in FIG. 30, layer viaholes 42a, 42b and 42c are formed in the insulating film 41, a 500–2000 nm thick fifth conductive film is formed, and the fifth conductive film is patterned to form aluminum wiring lines 50a, 50b and 50c. The aluminum wiring lines 50a and 50b are bit lines, and the aluminum wiring line 50c is a grounding line.

A circuit formed in the memory cell thus fabricated will be described with reference to FIG. 34, in which parts like or corresponding to those shown in FIGS. 11, 12, 16 to 20 and 29 to 33 are designated by the same reference characters.

The formation of the TFTs T5 and T6 by the first conductive film members 10a to 10c is the same as that in the second embodiment and hence the description thereof will be omitted.

The connection of first conductive film members 10a to 10d, second conductive film members 20a to 20d, and third conductive film members 30a to 30d is the same as that in the second embodiment and hence the description thereof will be omitted.

Referring to FIGS. 12 and 31, a node N1 is connected through a viahole 32a formed by etching a portion of a third oxide film 31 to a fourth conductive film member 40a, serving as the upper gate electrode of the TFT T6. The second conductive film member 20c, serving as the lower gate electrode of the TFT T6, and a fourth conductive film member 40a, serving as the upper gate electrode of the TFT T6, are connected to each other through layer viaholes 22a and 32a, as shown in FIG. 31.

Referring to FIGS. 12 and 32, a node N2 is connected through a viahole 32b formed by etching a portion of the third oxide film 31 to a fourth conductive film member 40b, serving as the lower gate electrode of the TFT T5. The second conductive film member 20b serving as the lower gate electrode of the TFT T5, and the fourth conductive film member 40b, serving as the upper gate electrode of the TFT T5, are connected to each other through layer viaholes 22b and 32b, as shown in FIG. 32. Thus, the TFTs T5 and T6 are formed.

Aluminum wiring lines 50a to 50c, formed by patterning a fifth conductive film, are the same as those of the second embodiment. The diffused drains 6a and 6b of access MOS transistors T3 and T4 are connected to the aluminum wiring lines 50a and 50b, i.e., bit lines, in the same manner as that in the second embodiment. The sources S of drive MOS transistors T1 and T2 are connected to the aluminum wiring line 50c, i.e., a grounding line, in the same manner as that in the second embodiment. Thus, a circuit shown in FIG. 28 is formed.

As mentioned above, in the fourth embodiment, the second conductive film members 20a to 20d, the first layer insulating film 11, and the first conductive film members 10a to 10d are formed simultaneously in the same planar shape by patterning films so as to include necessary layer connection. Therefore, superposing allowances, which must be secured in the conventional SRAM, are not necessary. Hence, the memory cell can be formed in a reduced length and width.

Since the capacitors C1 and C2 are formed of the second conductive film 20, the first layer insulating film 11 and the first conductive film 10 can be connected to the storage nodes N1 and N2. Thus, the immunity of the memory cell to soft error attributable to alpha rays and neutrons can be enhanced.

Since the second conductive film 20, the first layer insulating film 11 and the first conductive film 10 are patterned simultaneously, the resistance element forming processes (including an ion implantation process, a photolithographic process and an etching process, which are necessary for fabricating the conventional SRAM) are unnecessary. Hence, the number of processes can be reduced by 15% or more.

Fifth Embodiment

In a semiconductor device in a fifth embodiment according to the present invention, the load elements of a SRAM cell are TFTs of a double gate structure, wherein the gate electrodes of MOS transistors (surface conductive film), a first layer insulating film and the lower gate electrodes of TFTs are formed simultaneously by patterning, and channels of TFTs, a third layer insulating film and the upper electrodes of TFTs are formed simultaneously in the same planar shape by patterning.

FIGS. 11, 16 to 21 and 35 to 41 illustrate an exemplary structure of a SRAM cell as a semiconductor device in a fifth embodiment according to the present invention, and a method of fabricating the SRAM cell.

Figure 35:
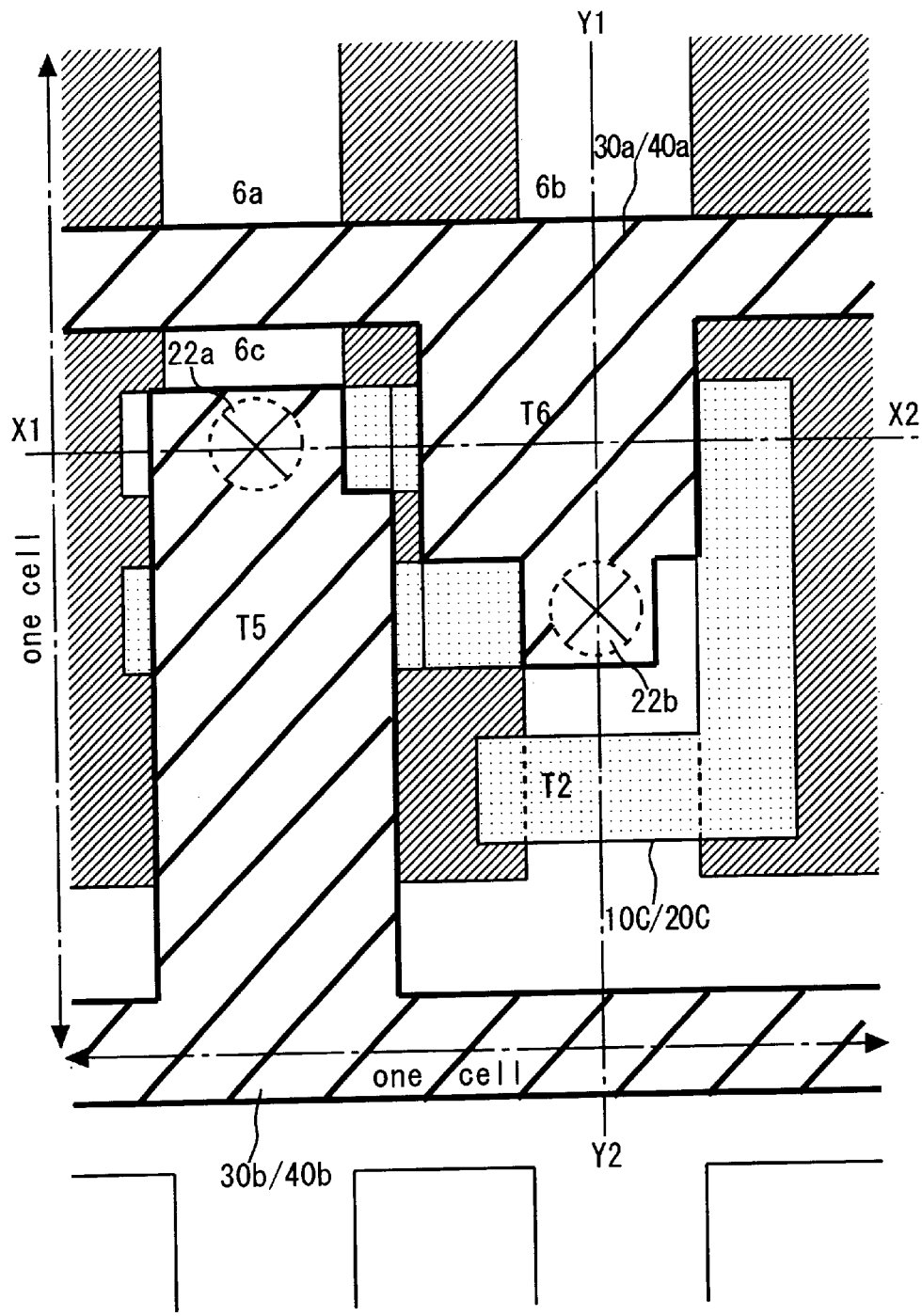
FIGS. 35 to 41 illustrate an exemplary structure of a SRAM cell as a semiconductor device in a fifth embodiment according to the present invention, and a method of fabricating the SRAM cell.
Figure 36:
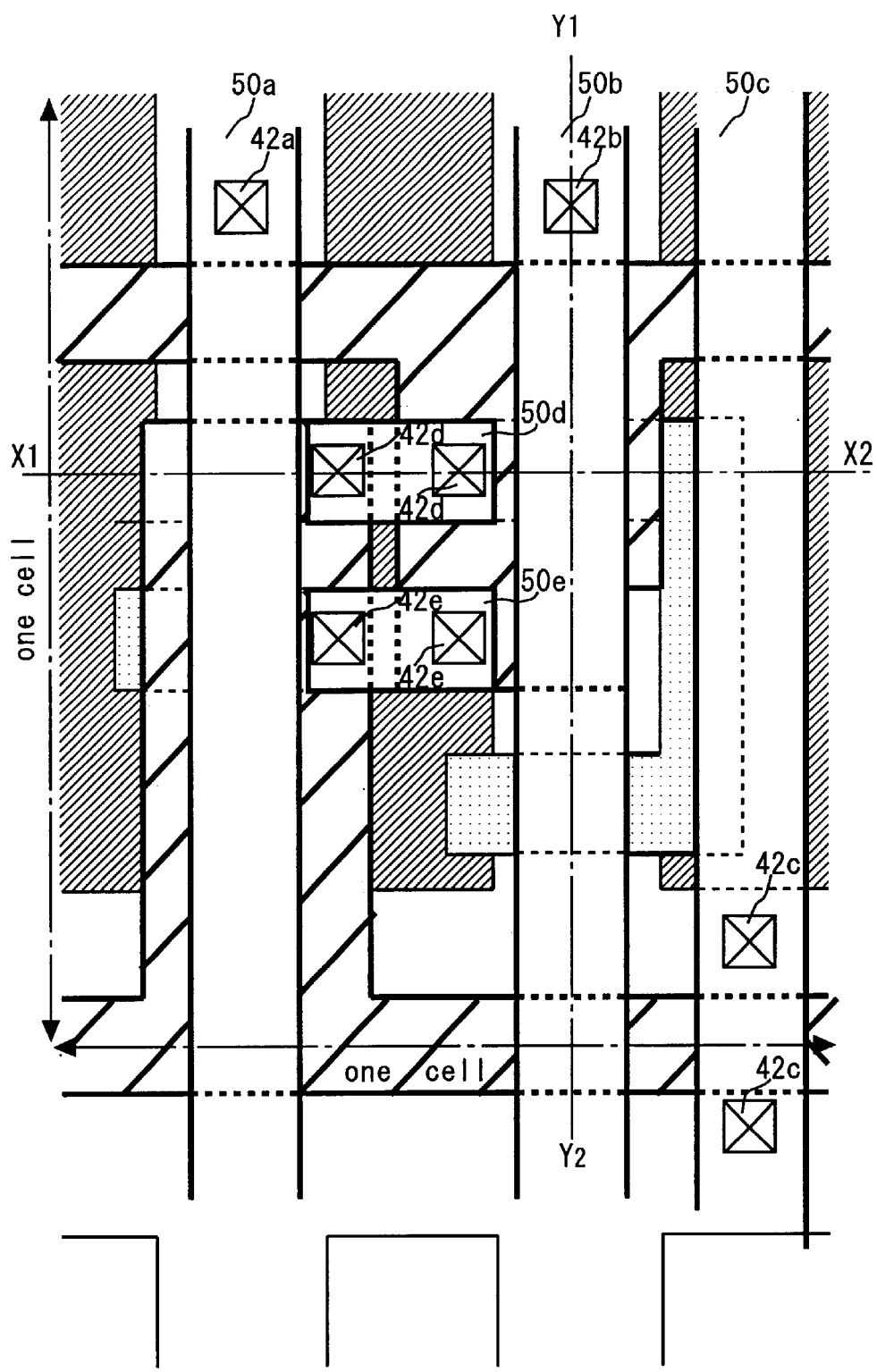

FIGS. 11, 35 and 36 illustrate an exemplary planar layout of the components of the SRAM cell, in which FIG. 11 is a plan view of a first conductive film serving as the gate electrodes of MOS transistors, and a second conductive film serving as the lower gate electrodes of TFTs. FIG. 35 is a planar layout of a third conductive film serving as the channel regions of the TFTs, and a fourth conductive film serving as the upper gate electrodes of the TFTs. FIG. 36 is a planar layout of aluminum wiring lines formed by patterning a fifth conductive film.

Figure 37:
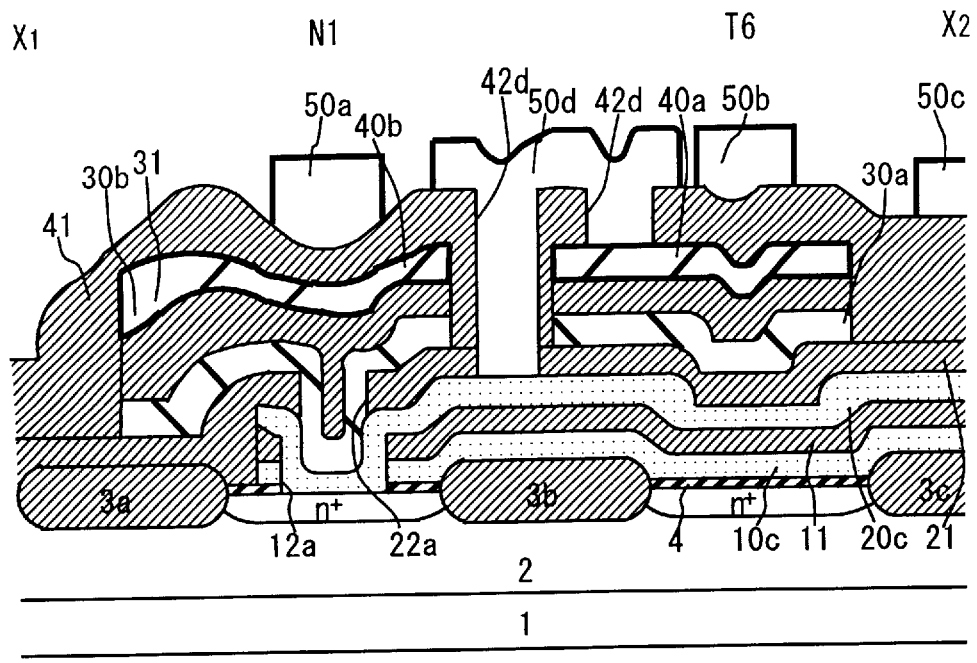
Figure 38:
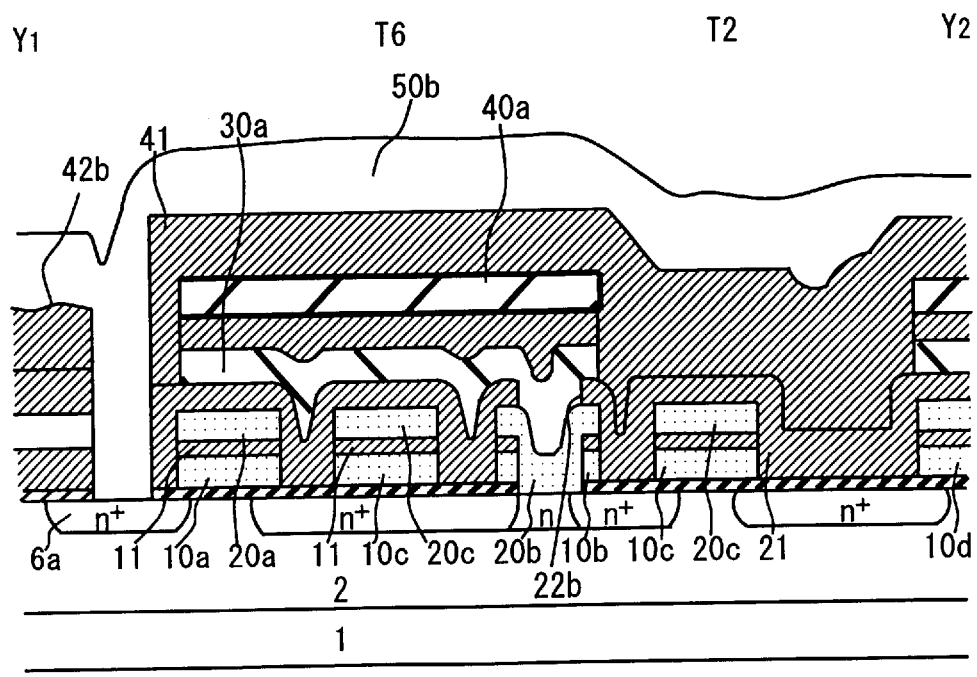

FIGS. 37 and 38 are sectional views showing a portion of the SRAM cell corresponding to the sections taken on lines X1–X2 and Y1–Y2 in FIGS. 11, 35 and 36.

FIGS. 16 to 20 and 39 to 40 illustrate an exemplary method of fabricating the SRAM cell, showing a portion corresponding to a section taken on line X1–X2 in FIGS. 11, 35 and 36.

Figure 41:
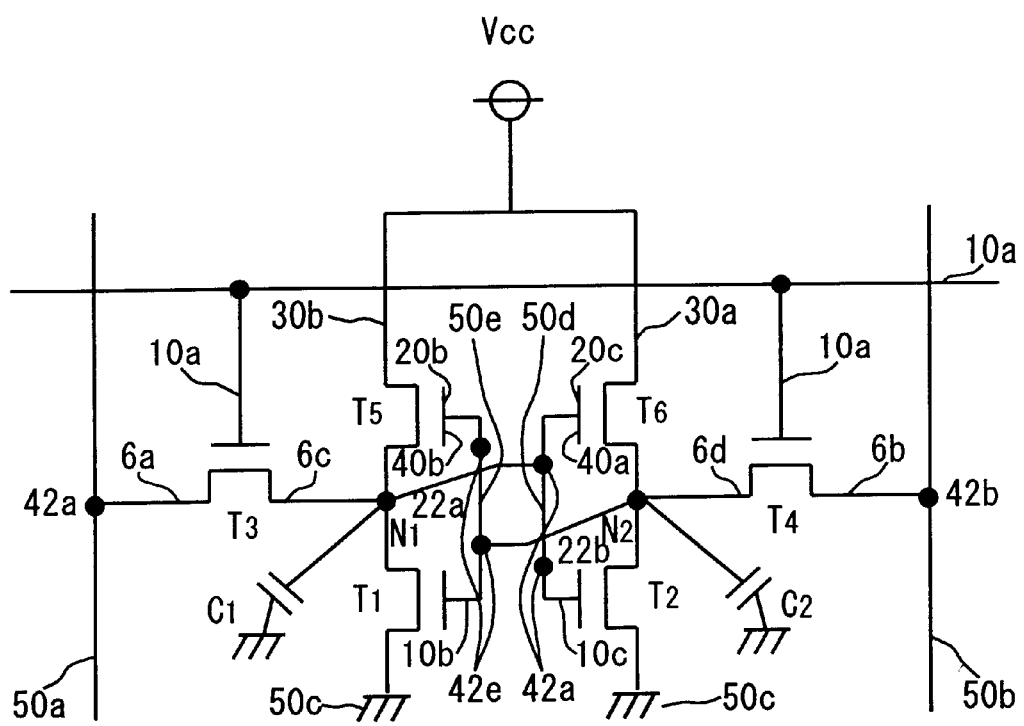

FIG. 41 is a circuit diagram of an equivalent circuit of the SRAM cell in the fifth embodiment.

The structure of the SRAM cell in the fifth embodiment will be described in connection with the description of a method of fabricating the SRAM cell with reference to FIGS. 11, 16 to 20 and 35 to 41.

In the beginning, processes similar to those for fabricating the SRAM cell in the second embodiment previously described with reference to FIGS. 11 and 16 to 20, are carried out.

Figure 39:
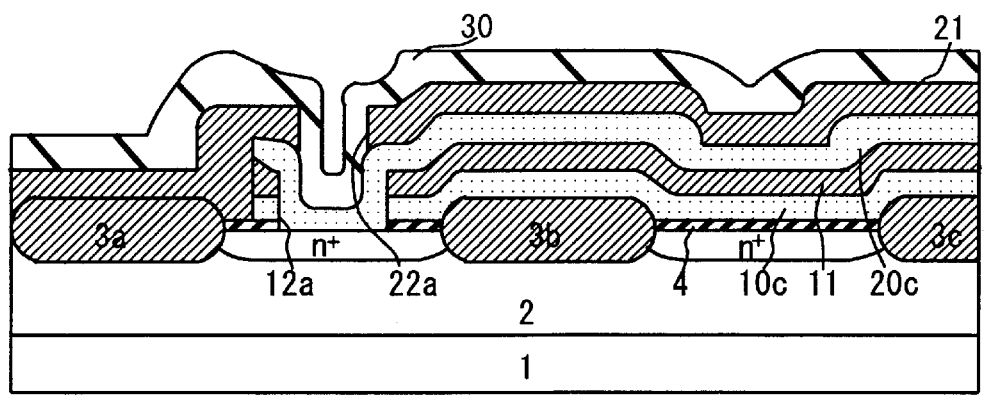

Then, referring to FIG. 39, a 100–1000 nm thick second layer insulating film 21 of SiO$_2$ or the like is deposited. As shown in FIG. 35, layer viaholes 22a and 22b are formed in the second layer insulating film 21 by photolithography and etching. Then, a third conductive film 30 (30a, 30b) of polysilicon or the like is deposited, and the third conductive film 30 is doped with a p-type impurity, such as boron, by ion implantation in a dose in the range of $1.0 \times 10^{12}$ to $1.0 \times 10^{13}$ atoms/cm$^2$ to form the channel regions of TFTs T5 and T6.

Then, the source and drain regions of the TFTs T5 and T6, and low-resistance regions of power feed lines for feeding power of a supply voltage VCC are formed by ion-implanting atoms of a p-type impurity, such as boron, using a mask formed by photolithography.

Figure 40:
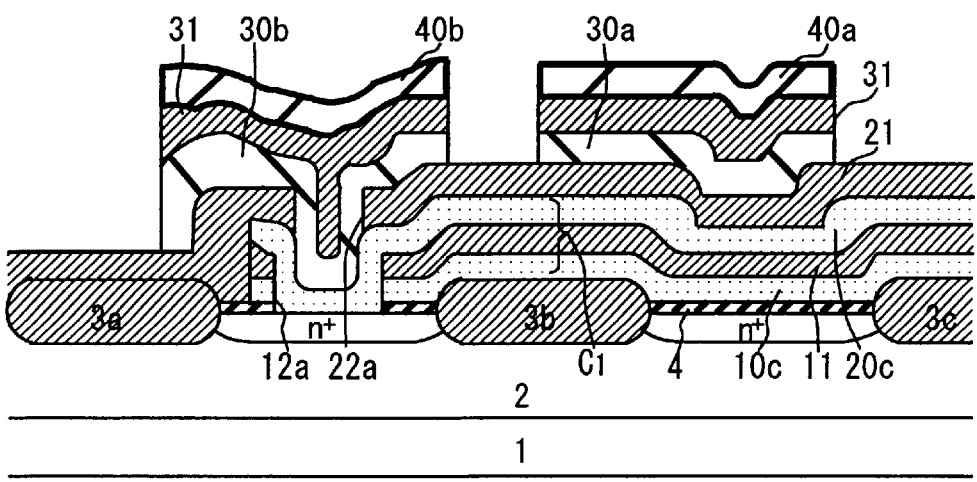

Referring to FIG. 40, a 100–1000 nm thick third layer insulating film 31 of SiO$_2$ or the like is deposited, and a fourth conductive film 40 (40a, 40b) of polysilicon or the like is deposited. Referring to FIG. 35, the third conductive film 30, the third layer insulating film 31, and the fourth conductive film 40 are patterned simultaneously. Thus, the films are patterned to include the viaholes 22a and 22b to form the channel layers 30a and 30b of the TFTs T5 and T6, having portions to which the supply voltage VCC is applied. The channel layers 30a and 30b and the upper gate electrodes 40a and 40b of the TFTs are formed simultaneously in the same planar shape.

Referring to FIGS. 37 and 38, a 100–1000 nm thick insulating film 41 of $SiO_2$ or the like is deposited by a CVD process or the like. Referring to FIG. 36, viaholes 42a, 42b, 42c, 42d and 42e are formed in the insulating film 41, and aluminum wiring lines 50a, 50b, 50c, 50d and 50e are formed by patterning a 500–2000 nm thick fifth conductive film. The aluminum wiring lines 50a and 50b are bit lines, the aluminum wiring line 50c is a grounding line, and the aluminum wiring lines 50d and 50e connect the lower gate electrodes 20c and 20b of the TFTs and the upper gate electrodes 40a and 40b of the TFTs through the viaholes 42d and 42e, respectively.

The structure of the SRAM cell will be described with reference to FIG. 41 showing an equivalent circuit of the SRAM cell in the fifth embodiment. In FIG. 41, parts like or corresponding to those shown in FIGS. 11, 16 to 20 and 35 to 40 are designated by the same reference characters.

The connection of nodes N1 and N2, the first conductive film members 10c and 10b, the second conductive film members 20c and 20b, and the third conductive film members 30a and 30b are the same as that in the second embodiment. Hence, the description thereof will be omitted.

Referring to FIGS. 36 and 37, the node N1 is connected to the second conductive film member 20c, serving as the lower gate electrode of the TFT T6. The second conductive film member 20c is connected through the viahole 42d, and the fifth conductive film member 50d is connected to the fourth conductive film member 40a, serving as the upper gate electrode of the TFT T6. Thus, the lower and the upper electrodes of the TFT T6 are connected to each other.

A node N2 is connected to the second conductive film member 20b serving as the lower gate electrode of the TFT T5. The second conductive film member 20b is connected through the viahole 42e, and the fifth conductive film member 50e is connected to the fourth conductive film member 40b, serving as the upper gate electrode of the TFT T5. Thus, the lower and upper gate electrodes of the TFT T5 are connected to each other.

The fifth conductive film members 50a to 50c, i.e., aluminum wiring lines, are similar to those of the second embodiment. The diffused drain layers 6a and 6b of access MOS transistors T3 and T4 are connected to the aluminum wiring lines 50a and 50b, i.e., bit lines, in the same manner as those of the second embodiment. The sources S of drive MOS transistors T1 and T2 are connected to the aluminum wiring line 50c, i.e., a grounding line, by the same manner as those of the second embodiment. Thus, a circuit shown in FIG. 41 is formed.

As mentioned above, in the fifth embodiment, the second conductive film members 20b and 20c (including the lower gate electrodes of the TFTs T5 and T6, the first layer insulating film 11, and the first conductive film members 10b and 10c), serving as the gate electrodes of the MOS transistors T1 to T4, are patterned simultaneously in the same planar shape so as to include the necessary viaholes. The fourth conductive film members 40a and 40b, serving as the upper gate electrodes of the TFTs T5 and T6, the third layer insulating film 31, and the third conductive film members 30a and 30b, serving as the channel regions of the TFTs T5 and T6, are patterned simultaneously in the same planar shape so as to include necessary viaholes. Therefore, superposing allowances, which must be secured in the conventional SRAM, are not necessary. Hence, the memory cell can be formed in a reduced length and width.

Since the capacitors are formed of the second conductive film 20, the first layer insulating film 11 and the first conductive film 10 can be connected to the storage nodes N1 and N2. Thus, the immunity of the memory cell to soft error attributable to alpha rays and neutrons can be enhanced.

Since the capacitors are formed of the third conductive film 30, the third layer insulating film 31 and the fourth conductive film 40 can be connected to the storage nodes N1 and N2. Thus, the immunity of the memory cell to soft error attributable to alpha rays and neutrons can be enhanced.

Since the first conductive film 10, the first layer insulating film 11 and the second conductive film 20 are patterned simultaneously, and the third conductive film 30, the third layer insulating film 31 and the fourth conductive film 40 are patterned simultaneously, the resistance element forming processes (including an ion implantation process, a photolithographic process and an etching process, which are necessary for fabricating the conventional SRAM) are unnecessary. Hence, the number of processes can be reduced by 15% or more.

Sixth Embodiment

In a sixth embodiment, the load elements of a SRAM cell are TFT of a double gate structure, wherein the lower gate electrodes of the TFTs, a gate oxide film under the TFTs and channels of the TFT are formed simultaneously by patterning in the same shape.

FIGS. 16, 17 and 42 to 53 illustrate an exemplary structure of a SRAM cell as a semiconductor device in a sixth embodiment according to the present invention, and a method of fabricating the SRAM cell.

Figure 42:
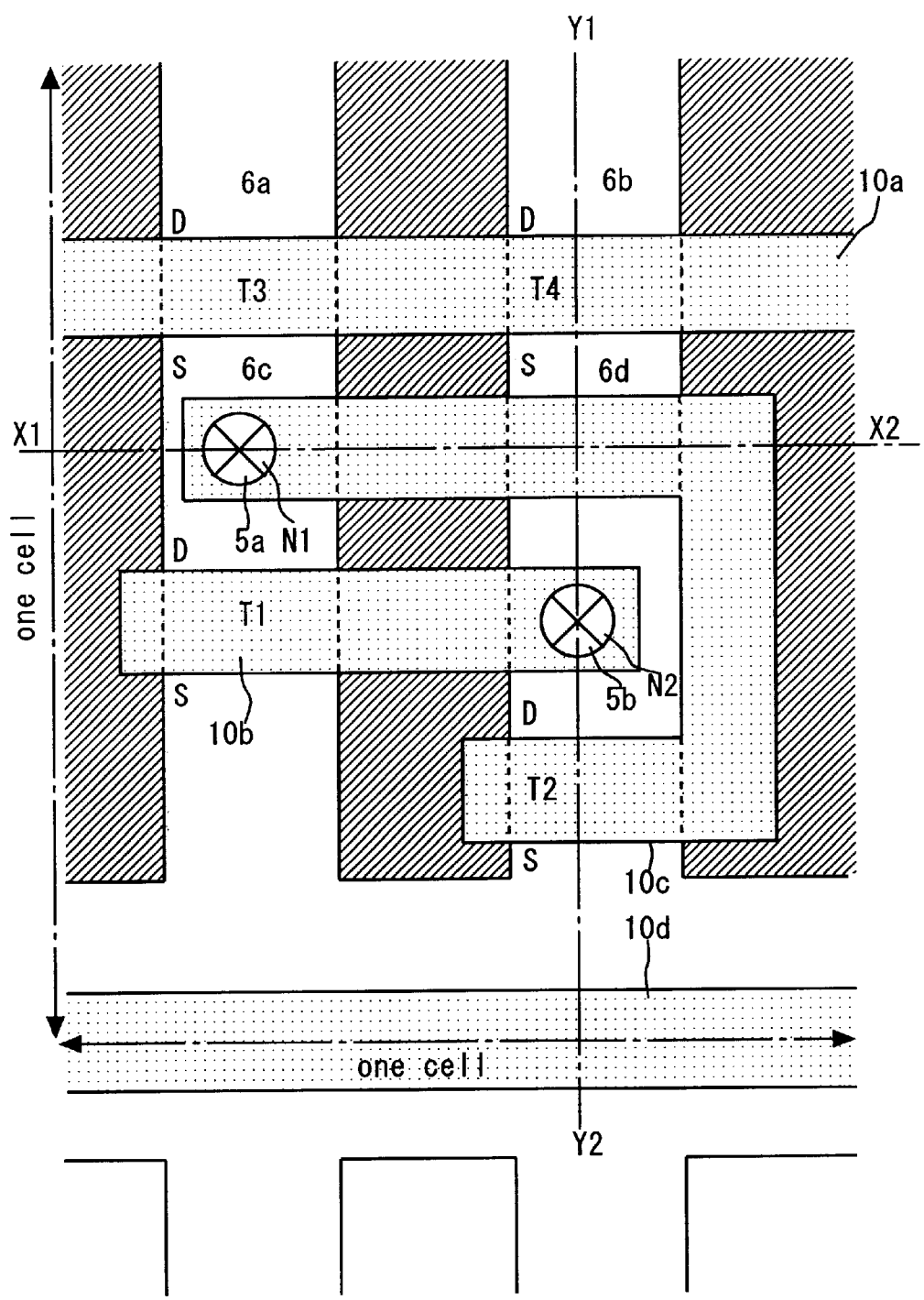
FIGS. 42 to 53 illustrate an exemplary structure of a SRAM cell as a semiconductor device in a sixth embodiment according to the present invention, and a method of fabricating the SRAM cell.
Figure 43:
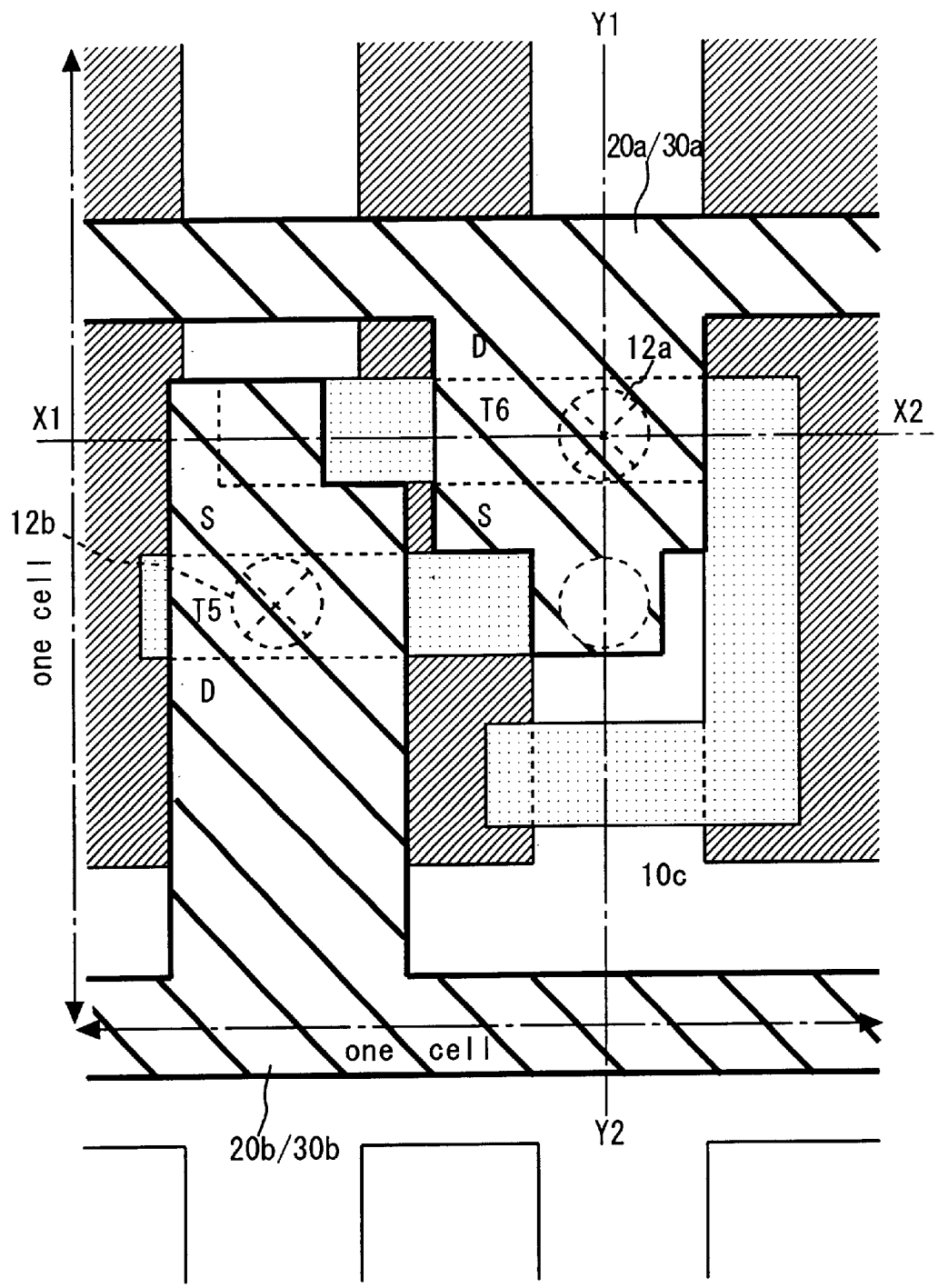
Figure 44:
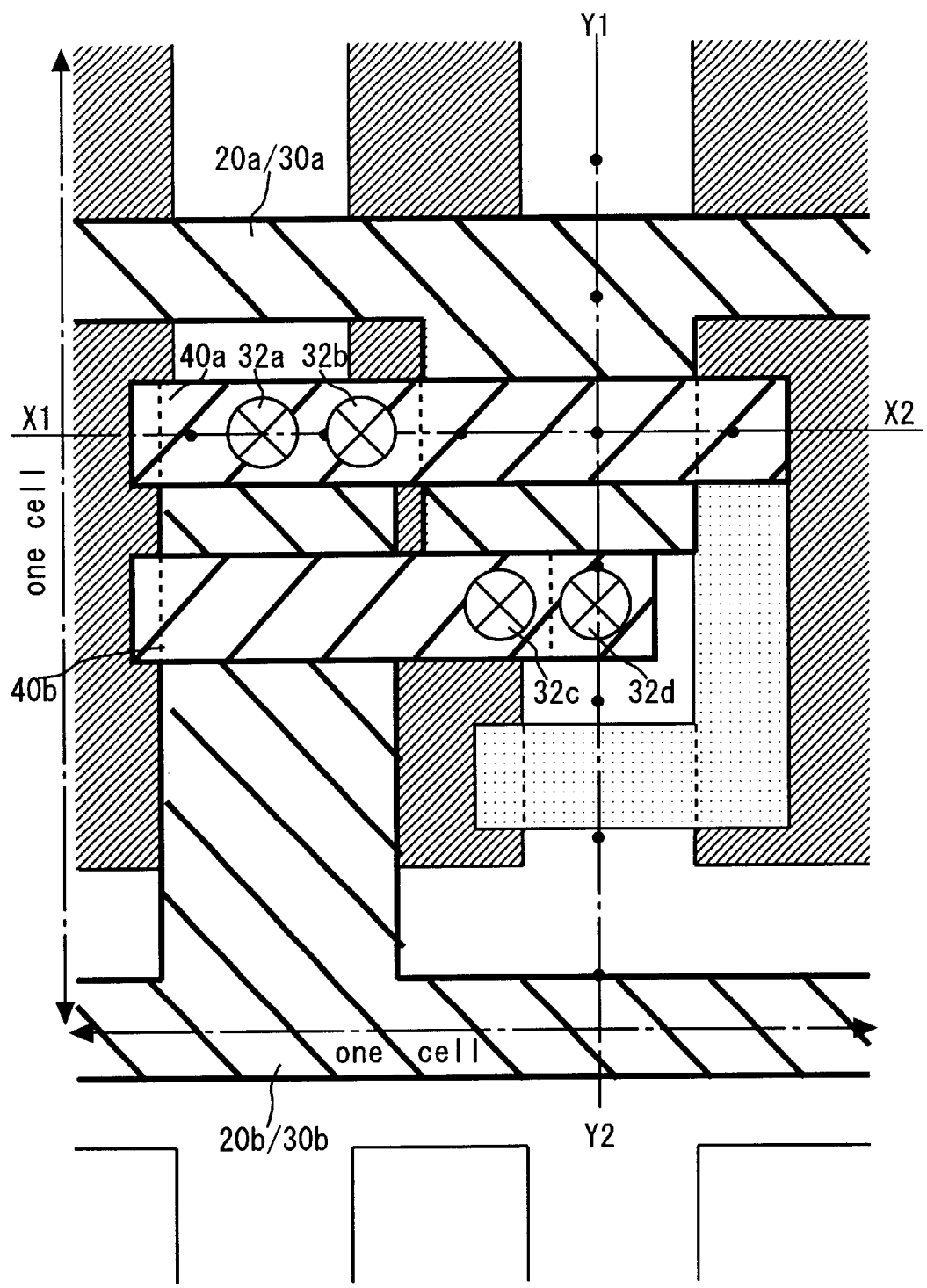
Figure 45:
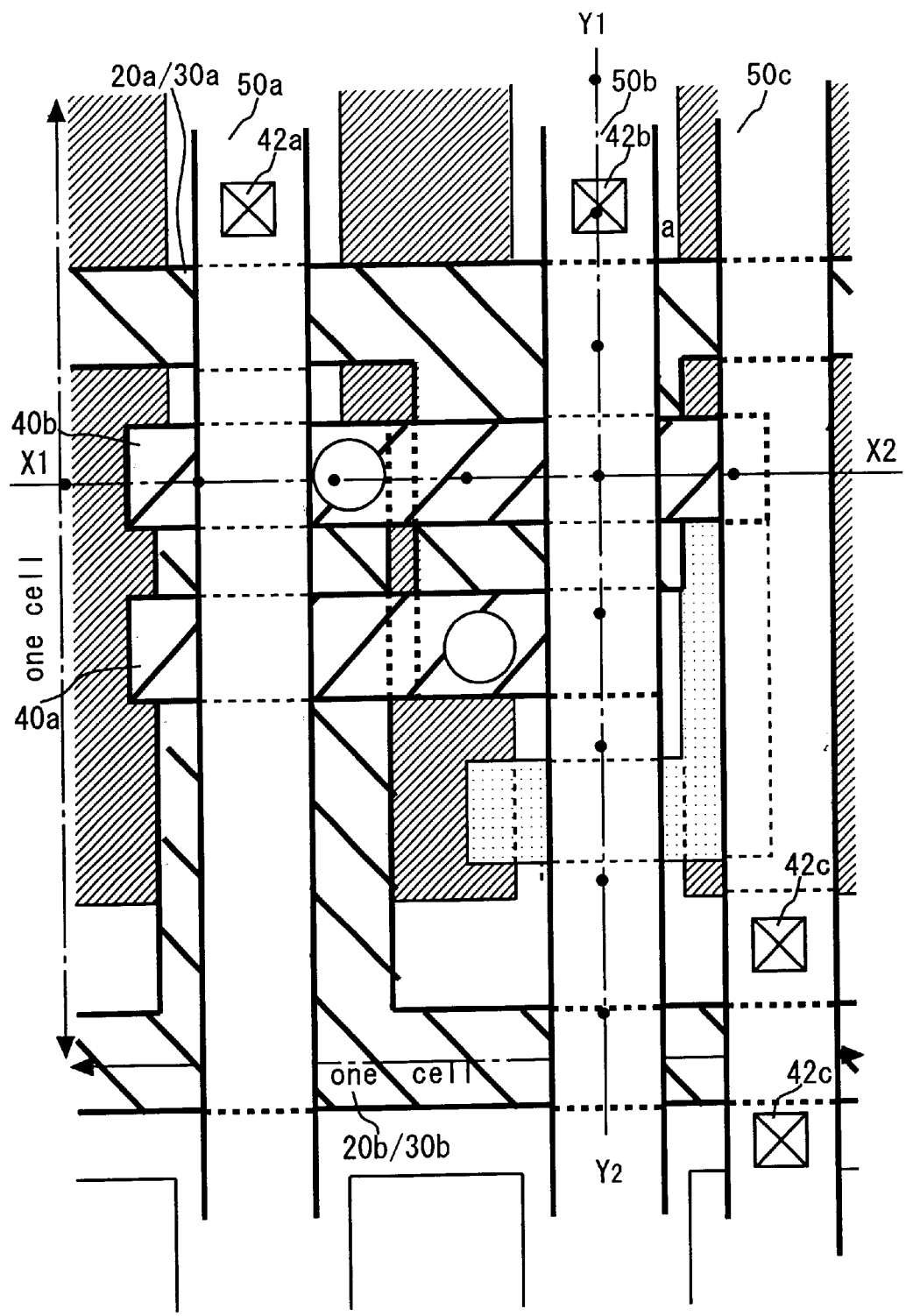

FIGS. 42 to 45 illustrate an exemplary planar lay out of the components of the SRAM cell, in which FIG. 42 is a plan view of a first conductive film serving as the gate electrodes of MOS transistors. FIG. 43 is a plan view of a second conductive film serving as the lower gate electrodes of TFTs, and a third conductive film serving as the channel regions of the TFTs. FIG. 44 is a plan view of a fourth conductive film serving as the upper gate electrodes of the TFTs. FIG. 45 is a plan view of aluminum wiring lines formed by patterning a fifth conductive film.

Figure 46:
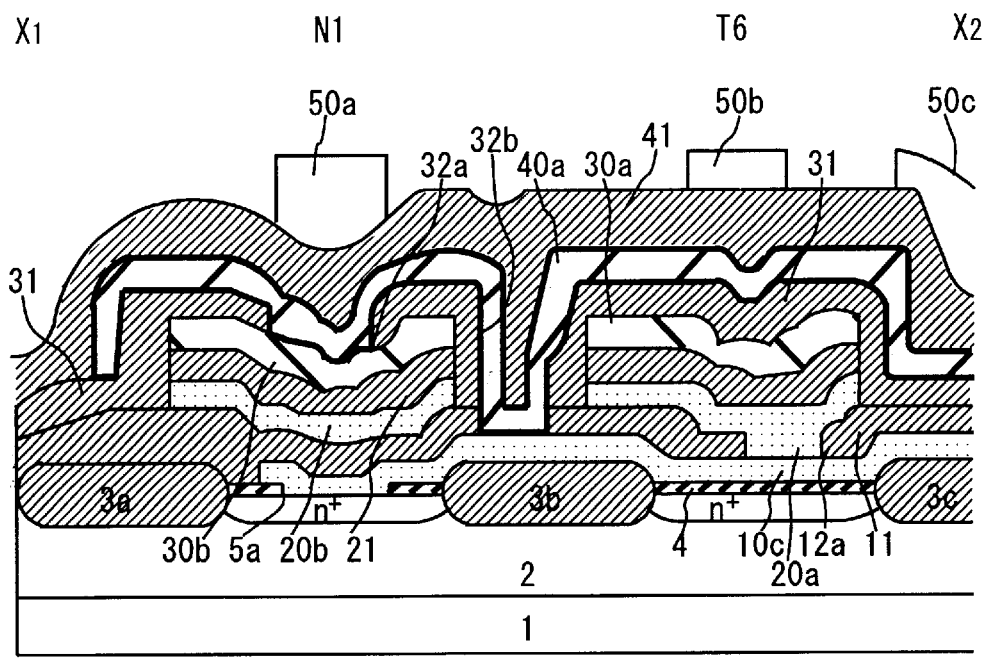
Figure 47:
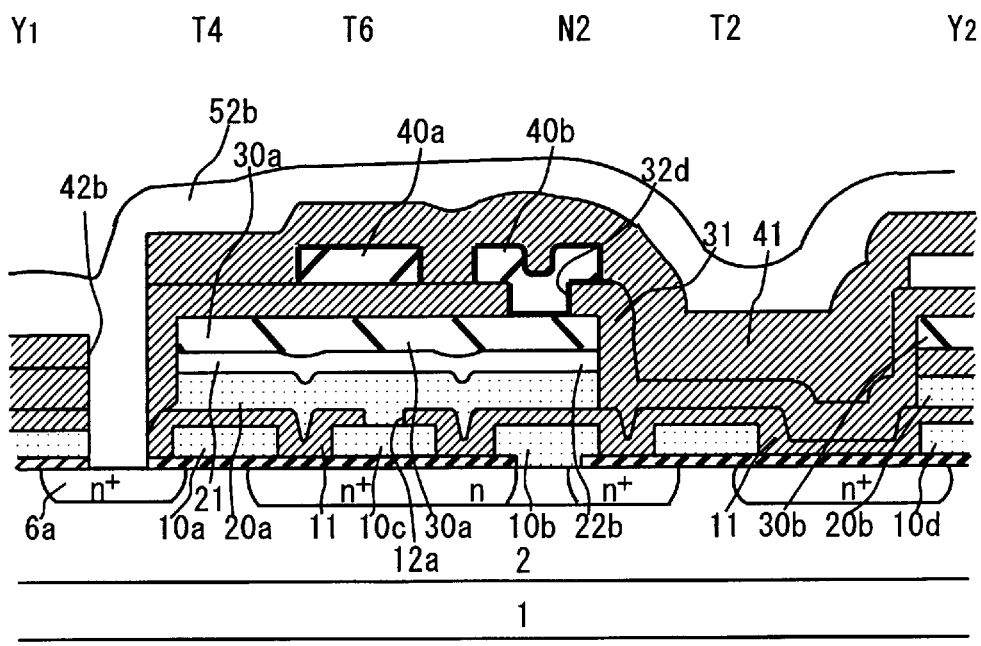

FIGS. 46 and 47 are sectional views taken on lines X1–X2 and Y1–Y2 in FIGS. 42 to 45. FIGS. 16, 17 and 48 to 52 illustrate an exemplary method of fabricating the SRAM cell, taken on line X1–X2 in FIGS. 42 to 45. FIG. 53 is a circuit diagram of an equivalent circuit of the SRAM cell in the sixth embodiment.

The structure of the SRAM cell in the sixth embodiment will be described in connection with the description of a method of fabricating the SRAM cell with reference to FIGS. 16, 17 and 42 to 52.

First, processes similar to the processes for fabricating the SRAM cell in the second embodiment previously described with reference to FIGS. 16 and 17 are carried out.

Figure 48:
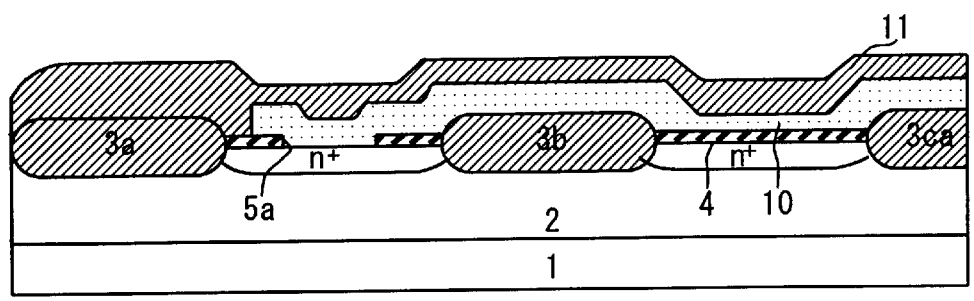

Then, referring to FIGS. 42 and 48, viaholes 5a and 5b are formed in a gate oxide film 4 by photolithography and etching, a first conductive film 10 of polysilicon or the like is deposited over the gate oxide film 4, and the first conductive film 10 is patterned by photolithography and etching to form the gate electrodes 10a, 10b, 10c and 10d of MOS transistors. The sources and drains of MOS transistors T1 to T4 are formed by ion-implanting an n-type impurity, such as arsenic, using a mask formed by photolithography. Then, a 100–1000 nm thick first layer insulating film 11 of $SiO_2$ or the like is deposited.

Figure 49:
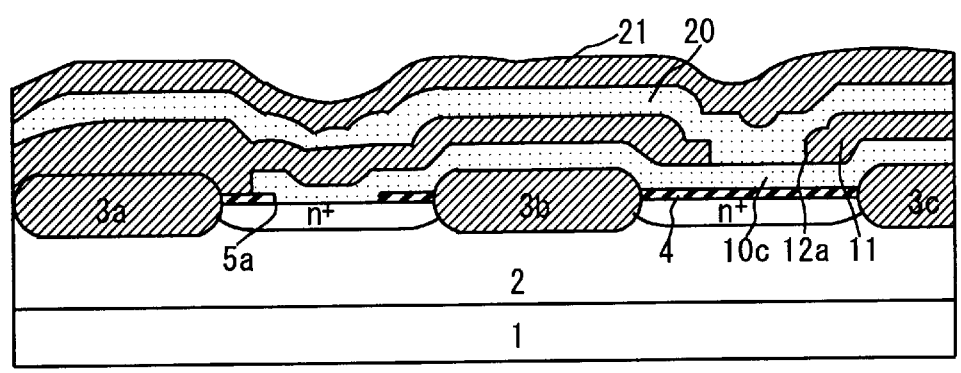

Referring to FIGS. 43 and 49, viaholes 12a and 12b are formed in the first layer insulating film 11 by photolithography and etching. A second conductive film 20 of polysilicon or the like is deposited over the first layer insulating film 11, and the surface of the second conductive film 20 is doped with an n-type impurity, such as phosphorus, by ion implantation in a dose in the range of $1.0 \times 10^{12}$ to $1.0 \times 10^{13}$ atoms/$cm^2$, and then a 100–1000 nm thick second layer insulating film 21 of $SiO_2$ or the like is deposited.

Figure 50:
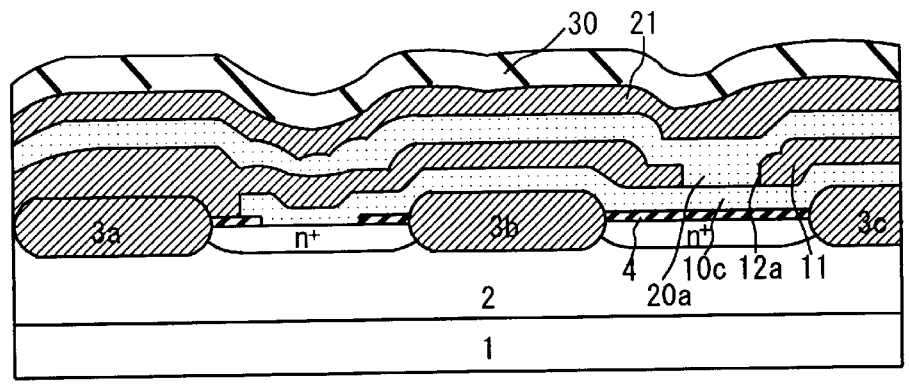

Referring to FIG. 50, a third conductive film 30 of polysilicon or the like is deposited over the second layer insulating film 21.

Figure 51:
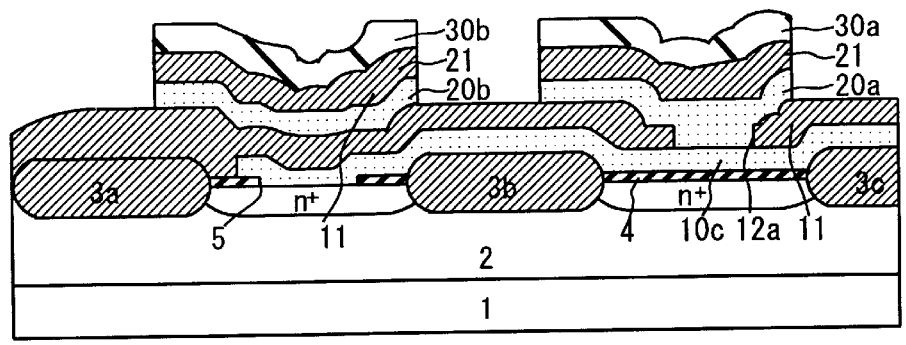

Referring to FIGS. 43 and 51, the third conductive film 30, the second layer insulating film 21 and the second conductive film 20 are patterned simultaneously, and in the same shape, so as to include the viaholes 12a and 12b extending between the first conductive film 10 and the second conductive film 20 by photolithography and etching to form third conductive film members 30b and 30a, serving as power feed line for feeding power of a supply voltage VCC and the channels of TFTs T5 and T6. Second conductive film members 20b and 20a serving as the lower gate electrodes of the TFT T5 and T6 are also simultaneously patterned in the same shape. Subsequently, the surface of the third conductive film 30 is doped by ion implantation with a p-type impurity, such as boron, in a dose in the range of $1.0 \times 10^{12}$ to $1.0 \times 10^{13}$ atoms/$cm^2$ to form the channel regions of the TFTs T5 and T6. Then, a p-type impurity, such as boron, is ion-implanted using a mask formed by photolithography to form the source and drain regions of the TFTs T5 and T6 and low-resistance regions in power feed lines for feeding power of the supply voltage VCC.

Figure 52:
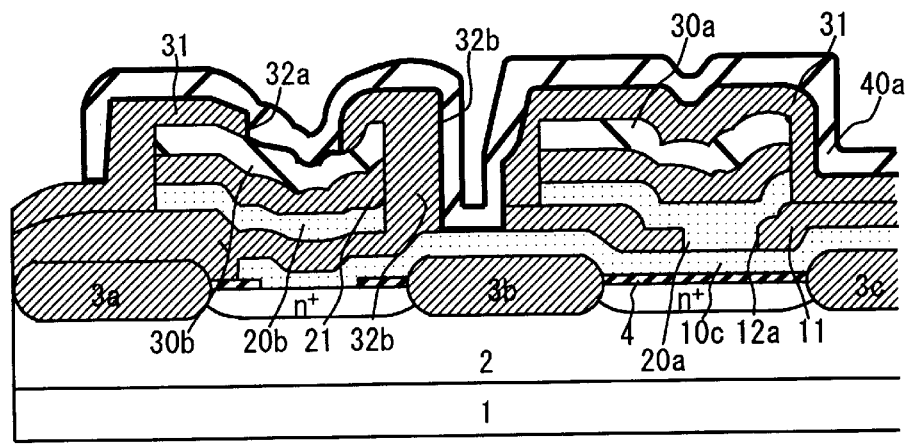
Figure 53:
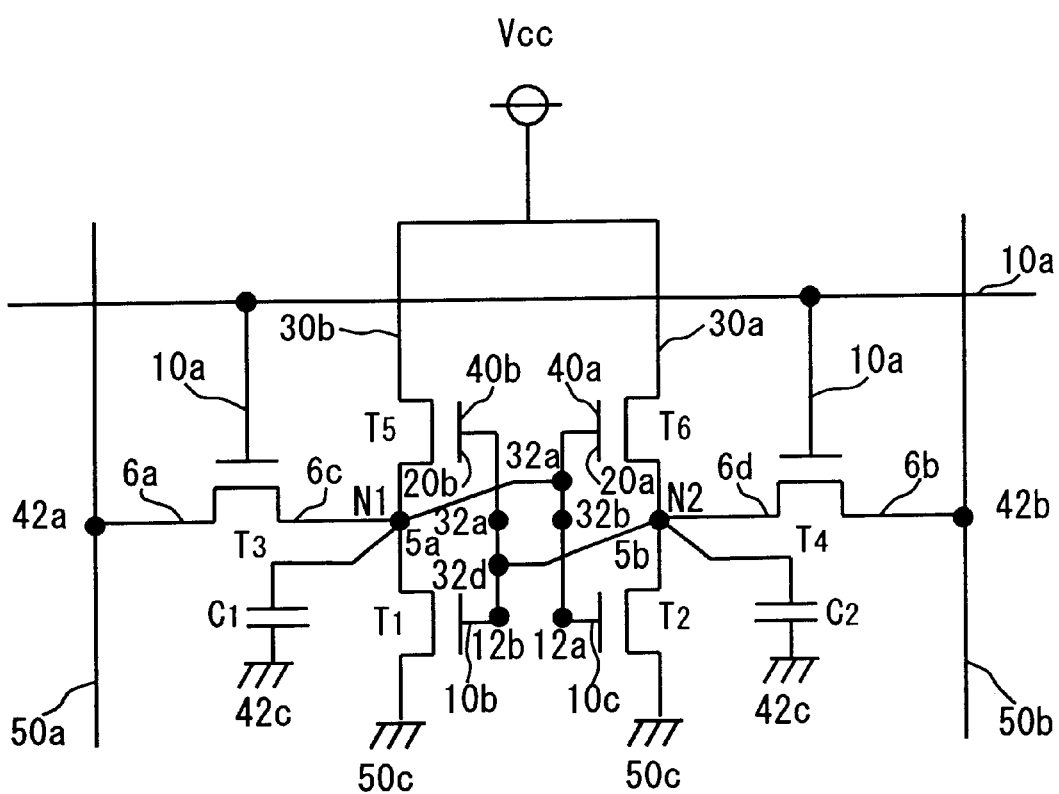

Referring to FIG. 52, a 100–1000 nm thick third layer insulating film 31 of $SiO_2$ or the like is deposited. Referring to FIG. 44, viaholes 32a, 32b and 32c are formed in the third layer insulating film 31 by photolithography and etching. Then, a fourth conductive film 40 (40a, 40b) of polysilicon or the like is deposited, and the fourth conductive film 40 is patterned by photolithography and etching to form the upper gate electrodes 40b and 40a of the TFTs T5 and T6.

Referring to FIGS. 46 and 47, a 100–1000 nm thick insulating film 41 of $SiO_2$ or the like is deposited. As shown in FIG. 45, viaholes 42a, 42b and 42c are formed in the insulating film 41, a 500–2000 nm thick fifth conductive film is formed and the fifth conductive film is patterned to form aluminum wiring lines 50a, 50b and 50c. The aluminum wiring lines 50a and 50b are bit lines, and the aluminum wiring line 50c is a grounding line.

The structure of the memory cell formed will be described in connection with a circuit shown in FIG. 53. In FIG. 53, parts like or corresponding to those shown in FIGS. 16, 17 and 42 to 52 are designated by the same reference characters.

The first conductive film members 10a, 10b, 10c and 10d of the sixth embodiment are the same in planar shape as the first conductive film members 10a, 10b, 10c and 10d of the second embodiment. Connecting holes 12a and 12b are connected to the nodes N1 and N2 in the second embodiment, and viaholes 5a and 5b are connected to the nodes N1 and N2 in the sixth embodiment, which are substantially similar. Hence, the description thereof will be omitted.

The connection of the second conductive film and the conductive films formed over the second conductive film in the sixth embodiment is different from that in the second embodiment.

Referring to FIGS. 44 and 46, the first conductive film member 10c connected to the node N1 is connected through the viahole 32b to the fourth conductive film member 40a, and the fourth conductive film member 40a is connected through the viahole 32a to the third conductive film member 30b, serving as the channel region of the TFT T5. Thus, the node N1 is connected to the third conductive film member 30b serving as the channel region of the TFT T5.

The node N1 is connected through the first conductive film member 10c and the viahole 12a to the second conductive film member 20a serving as the lower gate electrode of the TFT T6. The first conductive film member 10c is connected through the viahole 32b to the fourth conductive film member 40a, serving as the upper gate electrode of the TFT T6. Thus, the upper and the lower gate electrodes of the TFT T6 are connected to each other.

The node N2 is connected through the first conductive film member 10b and the viahole 32c to the fourth conductive film member 40b. The fourth conductive film member 40b is connected through the viahole 32d to the third conductive film member 30a, serving as the channel region of the TFT T6. Thus, the node N2 is connected to the third conductive film member 30a serving as the channel region of the TFT T6.

The node N2 is connected through the first conductive film member 10b and the viahole 12b to the second conductive film member 20b, serving as the lower gate electrode of the TFT T5. The first conductive film member 10b is connected through the viahole 32c to the fourth conductive film member 40b, serving as the upper gate electrode of the TFT T5. Thus, the upper and the lower gate electrode of the TFT T6 are connected to each other. Thus, the TFTs T5 and T6 are formed.

The connection of the diffused drain layers 6a and 6b of access MOS transistors T3 and T4 to the aluminum wiring lines 50a and 50b, i.e., bit lines, is the same as that in the second embodiment. Hence, the description thereof will be omitted.

The connection of the sources S of drive MOS transistors T1 and T2 to the aluminum wiring line 50c, i.e., a grounding line, is the same as that in the second embodiment and hence the description thereof will be omitted. Thus, the circuit shown in FIG. 53 is formed.

As mentioned above, the channels 30b and 30a of the TFTs T5 and T6, the second insulating film 21, and the lower gate electrodes 20b and 20a of the TFTs T5 and T6 are patterned simultaneously in the same planar shape. Therefore, superposing allowances, which must be secured in the conventional SRAM, are not necessary. Hence, the memory cell can be formed in a reduced length and width.

Since capacitors C1 and C2 are formed of the second conductive film 20, the second layer insulating film 21 and the third conductive film 30 can be connected to the nodes N1 and N2. Thus, the immunity of the memory cell to soft error attributable to alpha particles and neutrons can be enhanced.

Since the second conductive film 20, the second layer insulating film 21 and the third conductive film 30 are patterned simultaneously, processes (including an ion implantation process, a photolithographic process and an etching process, which are necessary for fabricating the conventional SRAM) are unnecessary, and hence, the number of processes can be reduced by 15% or more.

Seventh Embodiment

The load elements of a SRAM cell in a seventh embodiment according to the present invention are TFTs of a double gate structure, wherein the channels of the TFTs, a third layer insulating film, and the upper gate electrodes of the TFTs are formed by simultaneous patterning.

FIGS. 16, 17 and 54 to 65 illustrate an exemplary structure of a SRAM cell as a semiconductor device in a seventh embodiment according to the present invention, and a method of fabricating the SRAM cell.

Figure 54:
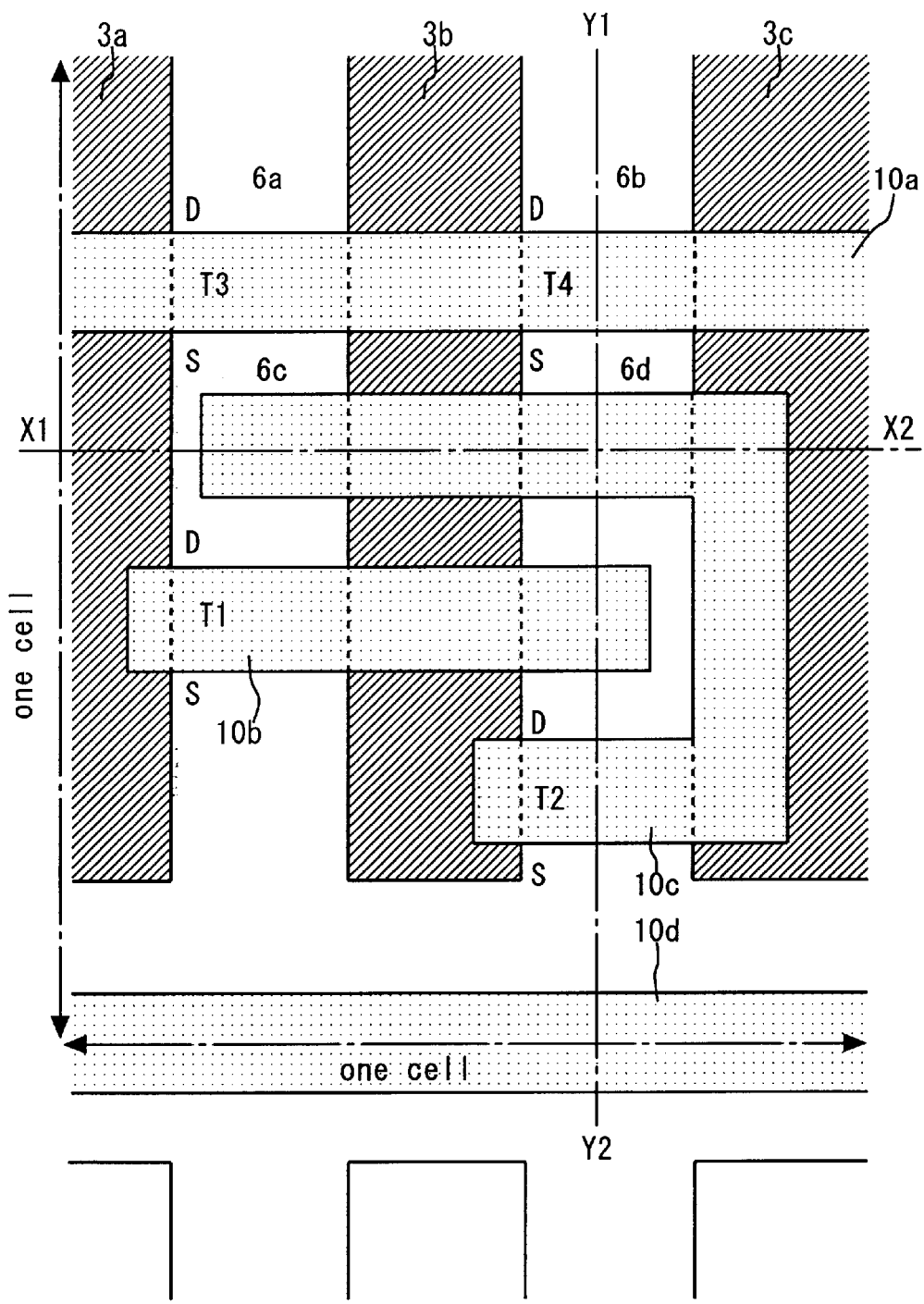
FIGS. 54 to 65 illustrate an exemplary structure of a SRAM cell as a semiconductor device in a seventh embodiment according to the present invention, and a method of fabricating the SRAM cell.
Figure 55:
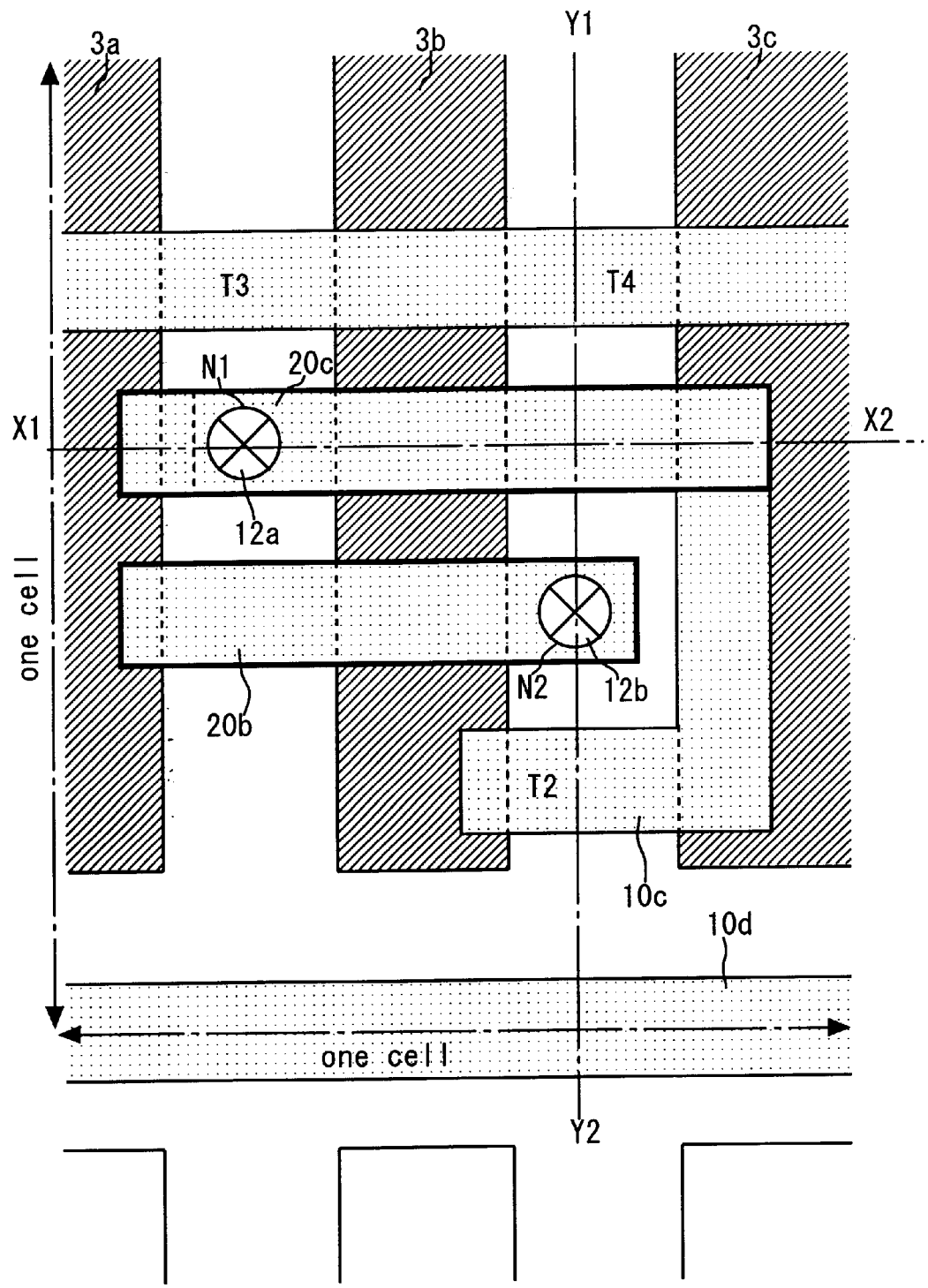
Figure 56:
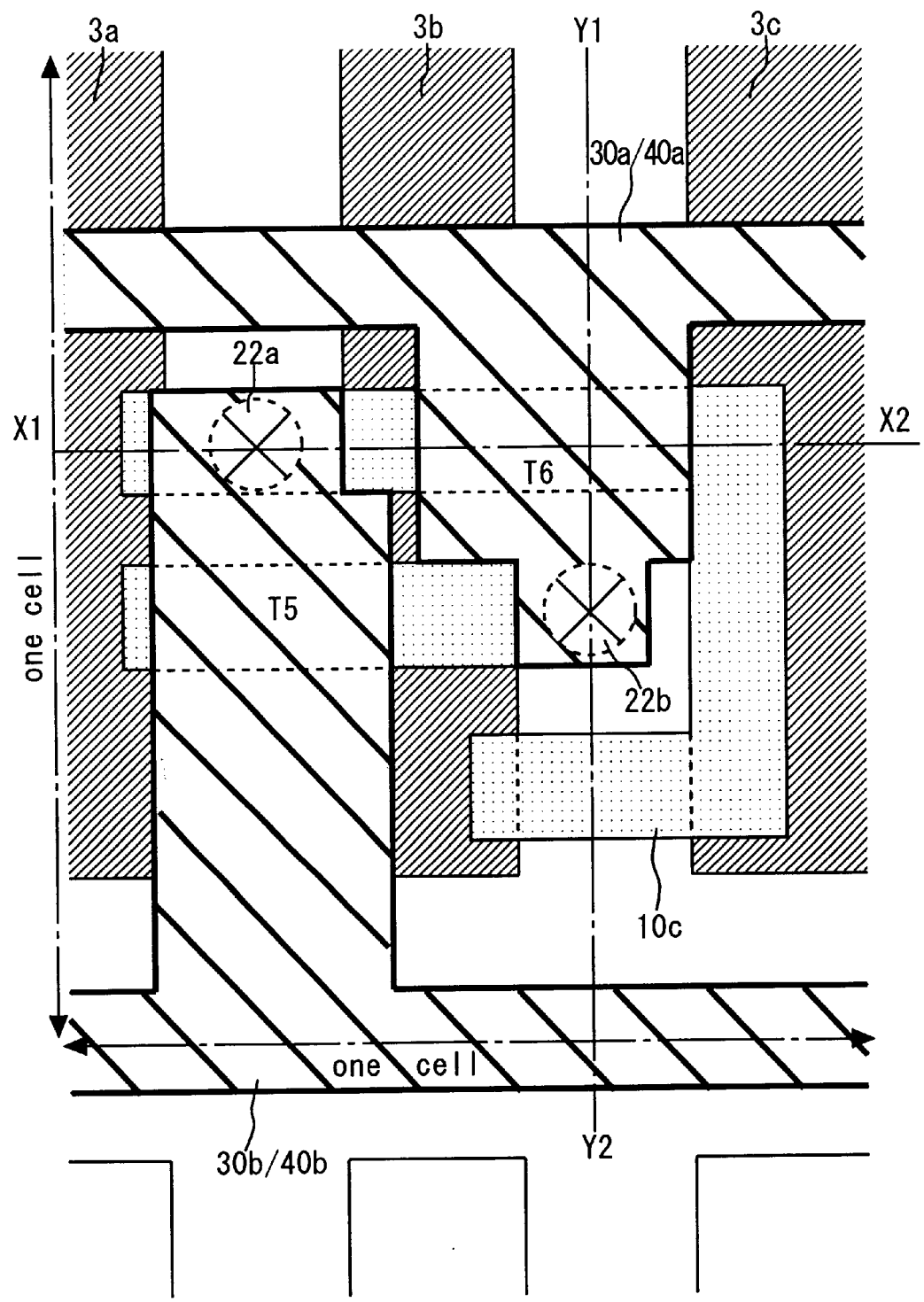
Figure 57:
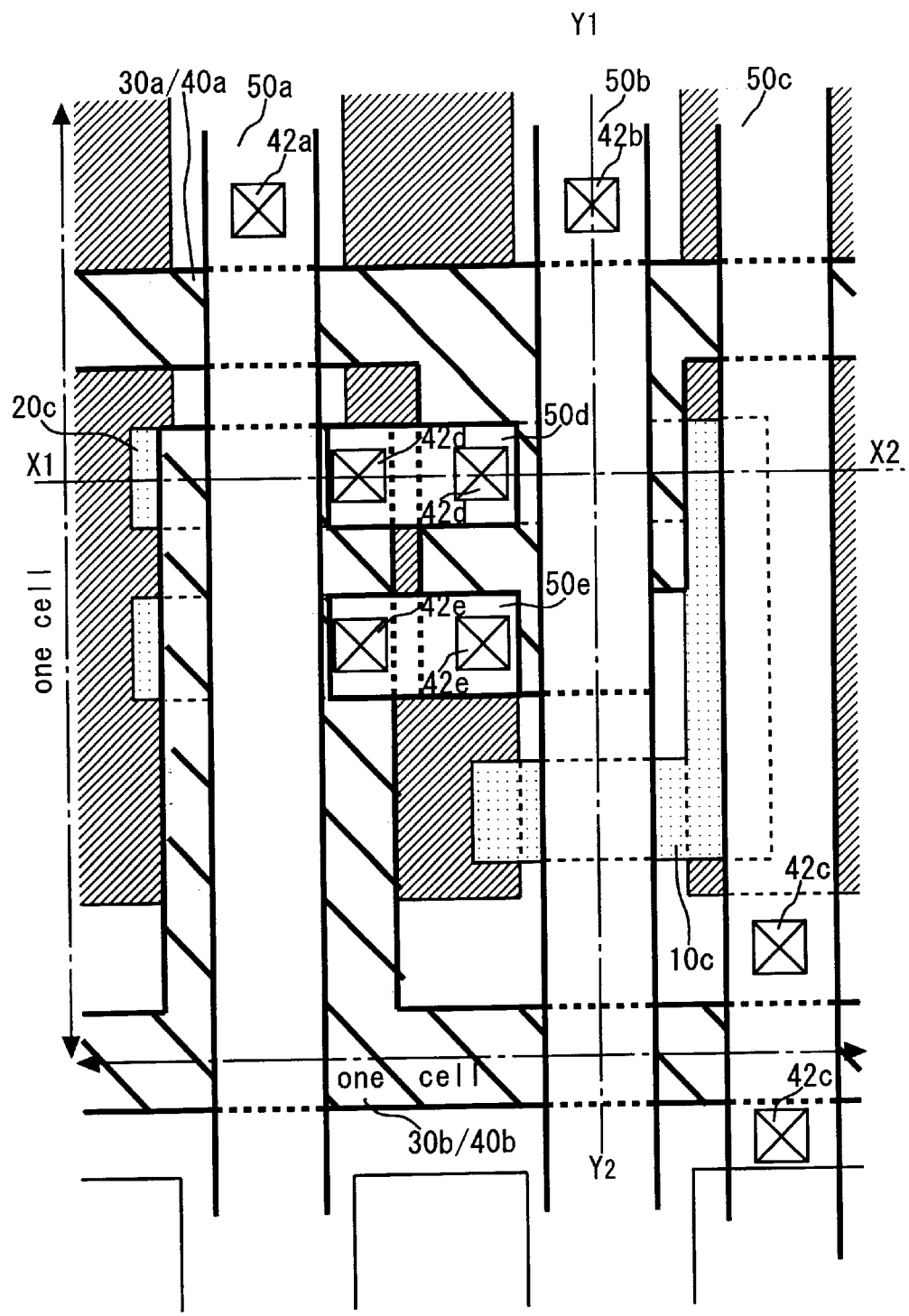

FIGS. 54 to 57 illustrate an exemplary planar layout of the components of the SRAM cell, in which FIG. 54 is a plan view of a first conductive film serving as the gate electrodes of MOS transistors. FIG. 55 is a plan view of a second conductive film serving as the lower gate electrodes of the TFTs. FIG. 56 is a plan view of a third conductive film serving as the channel regions of the TFTs, and a fourth conductive film serving as the upper gate electrodes of the TFTs, and FIG. 57 is a plan view of aluminum wiring lines formed by patterning a fifth conductive film.

Figure 58:
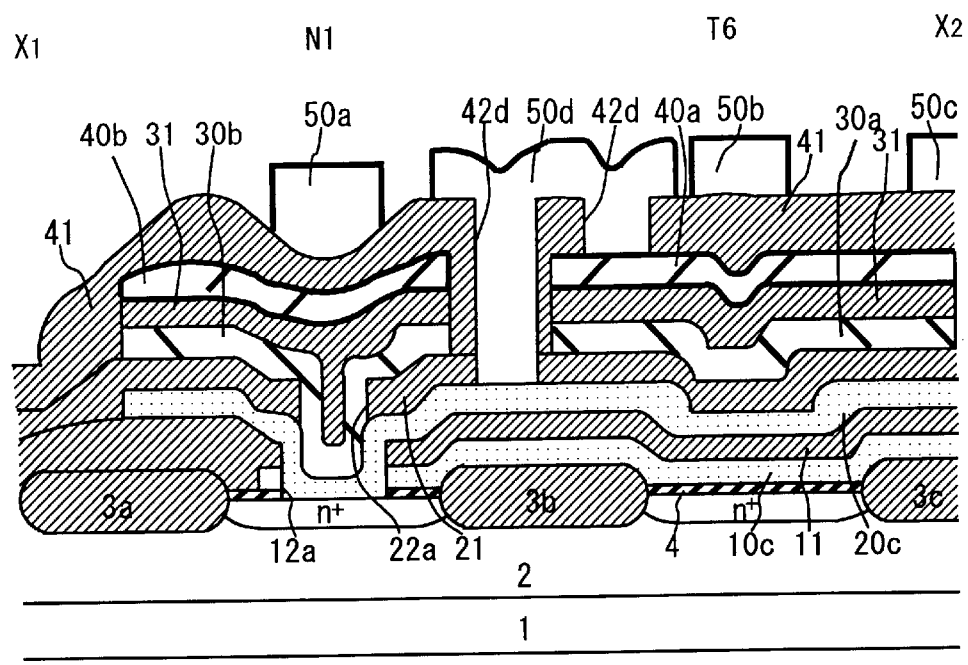
Figure 59:
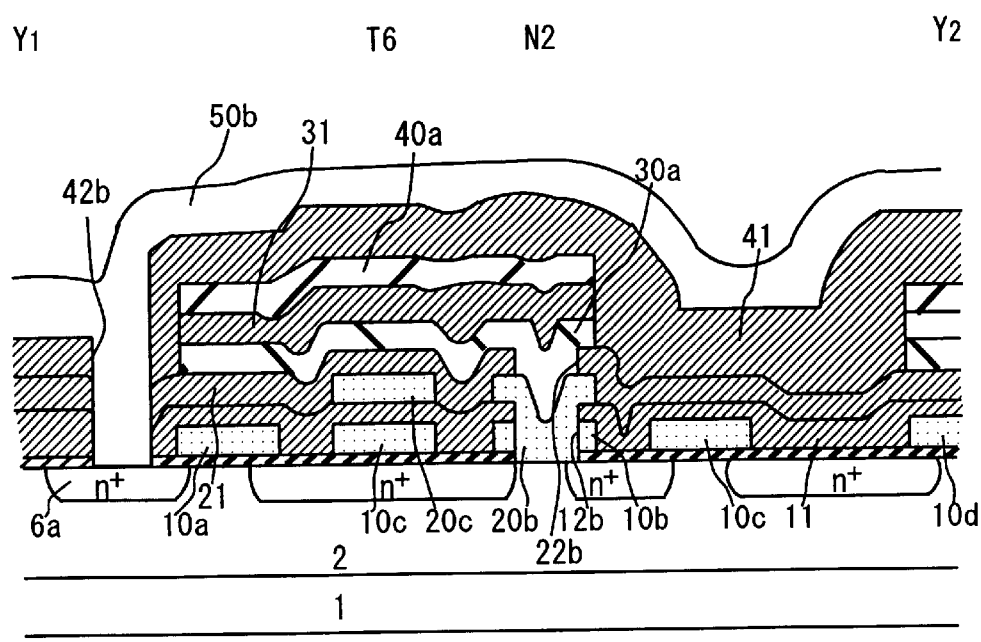

FIGS. 58 and 59 are sectional views taken on lines X1–X2 and Y1–Y2 in FIGS. 54 to 57. FIGS. 16, 17 and 60 to 64 are sectional views for explaining a method of fabricating the SRAM cell, taken on line X1–X2 in FIGS. 54 to 57. FIG. 65 is a circuit diagram of an equivalent circuit of the SRAM cell in the seventh embodiment.

The structure of the memory cell in the seventh embodiment will be described with reference to FIG. 16, 17 and 54 to 65 in connection with a method of fabricating the memory cell.

First, processes similar to those for fabricating the SRAM cell in the second embodiment previously described with reference to FIGS. 16 and 17 are carried out.

Figure 60:
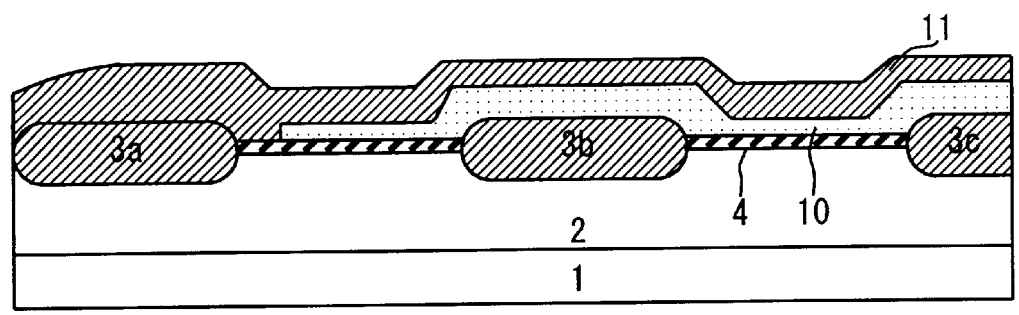

Then, referring to FIGS. 54 and 60, a first conductive film 10 of polysilicon or the like is deposited, and the first conductive film 10 is patterned by photolithography and etching to form first conductive film members 10a, 10b, 10c and 10d for the gate electrodes of MOS transistors T1 to T4. Subsequently, an n-type impurity, such as arsenic, is ion-implanted using a mask formed by photolithography to form the sources and drains of the MOS transistors T1 to T4. Subsequently, a 100–1000 nm thick first layer insulating film 11 of $SiO_2$ or the like is deposited.

Figure 61:
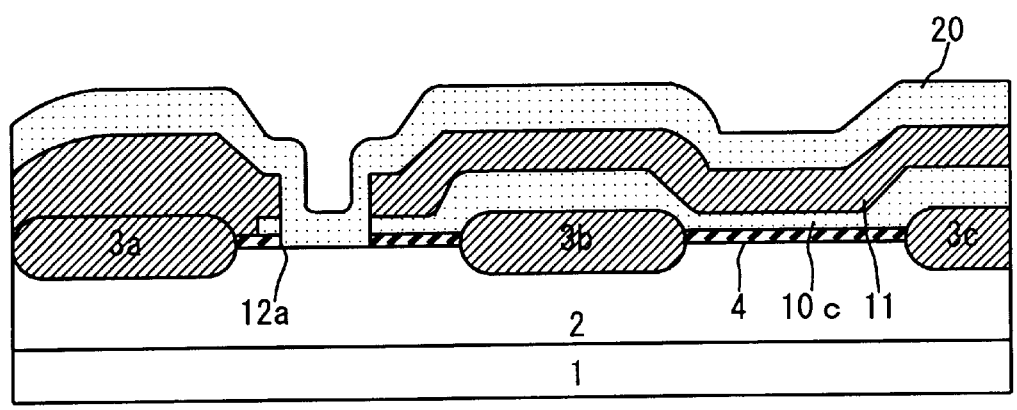

Referring to FIGS. 55 and 61, viaholes 12a and 12b are formed through the first layer insulating film 11, the first conductive film members 10b and 10c, and a gate oxide film 4 by photolithography and etching. A second conductive film 20 of polysilicon or the like is deposited, and the surface of the second conductive film 20 is doped by ion implantation with an n-type impurity, such as phosphorus, in a dose in the range of $1.0 \times ^{12}$ to $1.0 \times 10^{13}$ atoms/cm$^2$.

Figure 62:
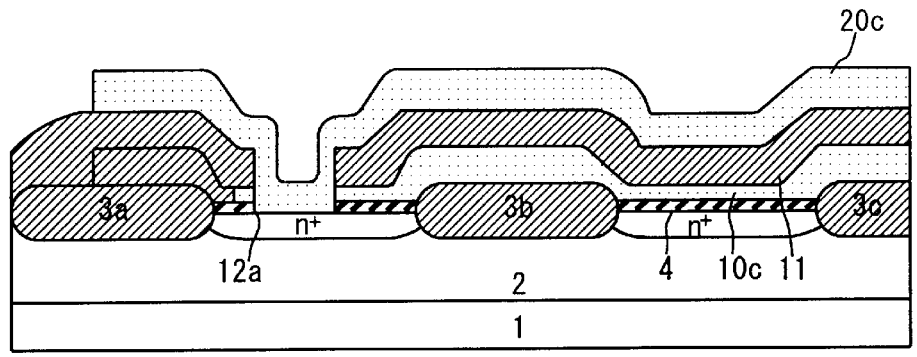

Referring to FIGS. 55 and 62, the second conductive film 20 is patterned by photolithography and etching to form second conductive film members 20b and 20c serving as the lower gates of TFTs T5 and T6.

Figure 63:
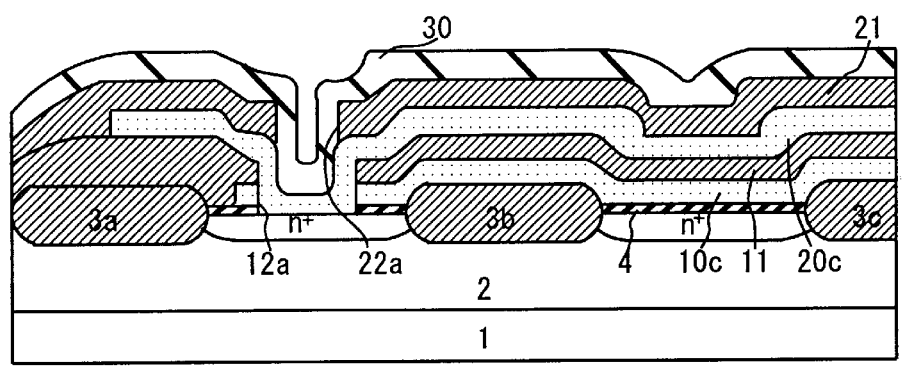

Referring to FIG. 63, a 100–1000 nm thick second layer insulating film 21 of $SiO_2$ or the like is deposited. Then, as shown in FIG. 56, viaholes 22a and 22b are formed in the second layer insulating film 21 by photolithography and etching. Then, a third conductive film of polysilicon or the like is deposited, and the surface of the third conductive film is doped by ion implantation with a p-type impurity, such as boron, in a dose in the range of $1.0 \sim 10^{12}$ to $1.0 \times 10^{13}$ atoms/cm$^2$ to form the channel regions of the TFTs T5 and T6. Then, a p-type impurity, such as boron, is ion-implanted using a mask formed by photolithography to form the sources and drains of the TFTs T5 and T6, and low-resistance regions in power feed lines for feeding power of a supply voltage vcc.

Figure 64:
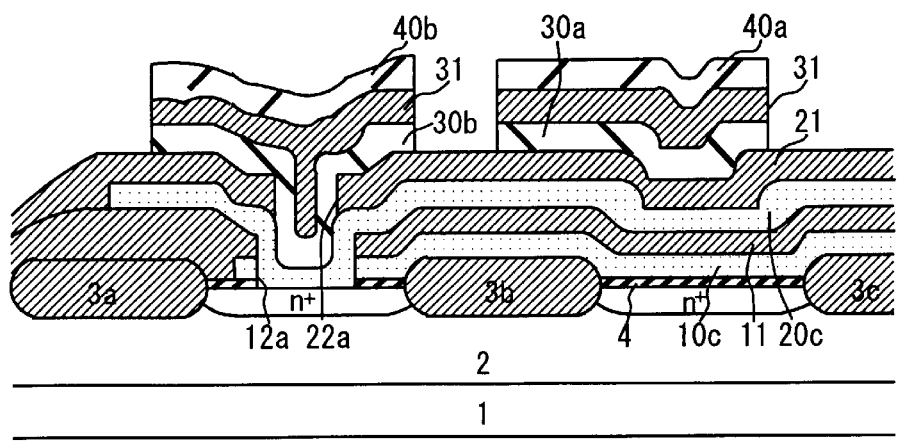
Figure 65:
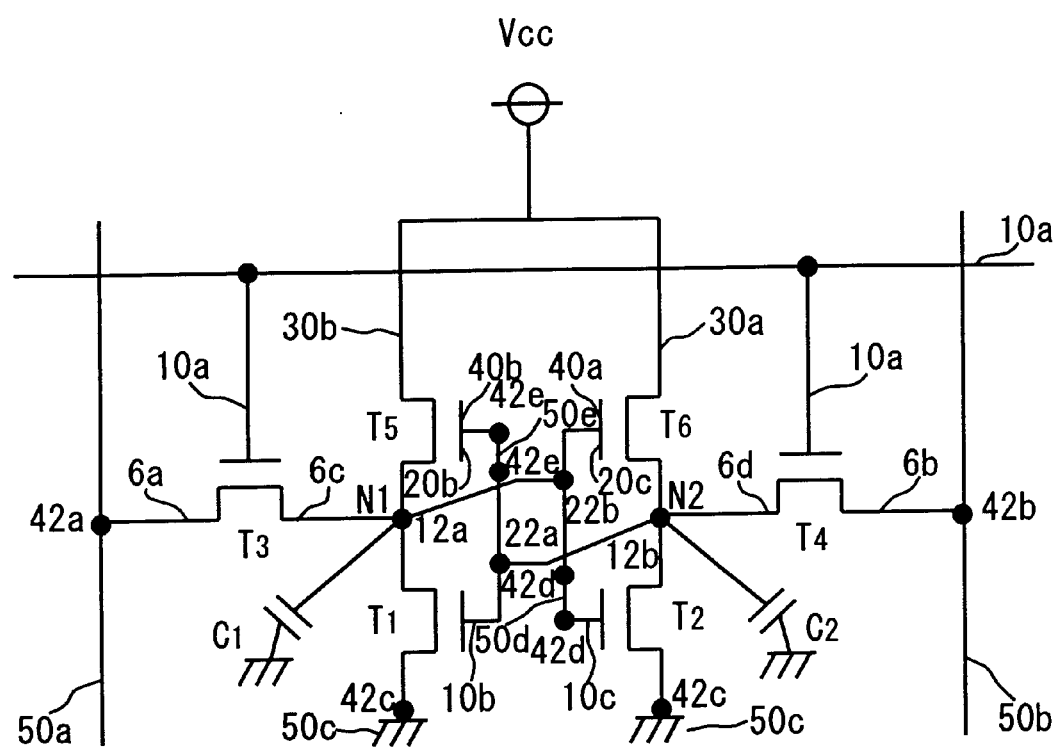

Referring to FIG. 64, a 100–1000 nm thick third layer insulating film 31 of $SiO_2$ or the like is deposited, and then a fourth conductive film 40 (40a, 40b) of polysilicon or the like is deposited. As shown in FIG. 56, the fourth conductive film 40, the third layer insulating film 31 and the third conductive film 30 are patterned simultaneously in the same planar shape by photolithography and etching to form third conductive film members 30b and 30a. The third conductive film members, 30b and 30a, serving as power feed lines and the channels of the TFTs T5 and T6, and fourth conductive film members 40b and 40a serving as the upper gate electrodes of the TFTs T5 and T6 are also simultaneously patterned in the same planar shape.

Referring to FIGS. 58 and 59, a 100–1000 nm thick fourth insulating film 41 of $SiO_2$ or the like is deposited by a CVD process or the like. Then, as shown in FIG. 57, viaholes 42a, 42b, 42c, 42d and 42e are formed in the fourth insulating film 41, a 500–2000 nm thick fifth conductive film of aluminum is deposited, and the fifth conductive film is patterned to form fifth conductive film members 50a, 50b, 50c, 50d and 50e, i.e., aluminum wiring lines. The aluminum wiring lines 50a and 50b are bit lines, the aluminum wiring line 50c is a grounding line, the aluminum wiring line 50d connects the lower electrode 20c and the upper electrode 40a of the TFT T6, and the aluminum wiring line 50e connects the lower electrode 20b and the upper electrode 40a of the TFT T5.

The structure of the fabricated memory cell will be described with reference to FIG. 65 showing an equivalent circuit of the memory cell. In FIG. 65 parts like or corresponding to those shown in FIGS. 16, 17 and 54 to 64 are designated by the same reference characters.

The first conductive film members 10b and 10c of the seventh embodiment are the same in planar shape as those of the second embodiment. The second conductive film members 20b and 20c of the seventh embodiment are different in planar shape from those of the second embodiment. The third conductive film members 30a and 30b of the seventh embodiment are somewhat different in planar shape from those of the second embodiment. However, the connection of the nodes N1 and N2, the first conductive film members 10b and 10c, the second conductive film members 20b and 20c and the third conducive film members 30a and 30b in the seventh embodiment is the same as that in the second embodiment. Hence, the description thereof will be omitted.

The third and fourth conductive film members 30a and 30b and 40a and 40b of the seventh embodiment are the same in planar shape as those of the fifth embodiment, respectively, and their connections are substantially the same as those of the fifth embodiment. Hence, the description thereof will be omitted.

The connection of the lower gate electrodes 20b and 20c and the upper gate electrodes 40a and 40b to the TFTs T5 and T6 by the fifth conductive film members 50d and 50e is the same as that in the fifth embodiment. Hence, the description thereof will be omitted.

The fifth conductive film members 50a to 50c are similar to those of the second embodiment, and the connection of the diffused drain layers 6a and 6b of access MOS transistors T3 and T4 to the aluminum wiring lines 50a and 50b, i.e., the bit lines, is the same as that in the second embodiment.

The connection of the sources S of drive MOS transistors T1 and T2 to the aluminum wiring line 50c, i.e., the grounding line, is the same as that in the second embodiment. Thus, the circuit shown in FIG. 65 is formed.

As mentioned above, the channels 30a and 30b of the TFTs T5 and T6, the third layer insulating film 31, and the upper gate electrodes 40b and 40c, i.e., the fourth conductive film members, of the TFTs T5 and T6 are patterned simultaneously. Thus, the patterns are in the same planar shape and include the necessary viaholes. Therefore, superposing allowances, which must be secured in the conventional SRAM, are not necessary. Hence, the memory cell can be formed in a reduced length and width.

Since capacitors C1 and C2 are formed of the first conductive film 10, the first layer insulating film 11 and the second conductive film 20 can be connected to the nodes N1 and N2. Thus, the immunity of the memory cell to soft error attributable to alpha particles and neutrons can be enhanced.

Since the third conductive film 30, the third layer insulating film 31 and the fourth conductive film 40 are patterned simultaneously, conventional processes (including an ion implantation process, a photolithographic process and an etching process, which are necessary for fabricating the conventional SRAM) are unnecessary. Hence, the number of processes can be reduced by 15% or more.

Eighth Embodiment

The load elements of a SRAM cell in a eighth embodiment according to the present invention are TFTs of a double gate structure, wherein the gate electrodes of MOS transistors, a first layer insulating film, the lower gate electrodes of the TFTs, a second layer insulating film, and the channels of the TFTs are formed by simultaneous patterning.

The structure of a SRAM cell as a semiconductor device in an eighth embodiment according to the present invention, and a method of fabricating the SRAM cell will be described with reference to FIGS. 16 to 19 and 66 to 74.

Figure 66:
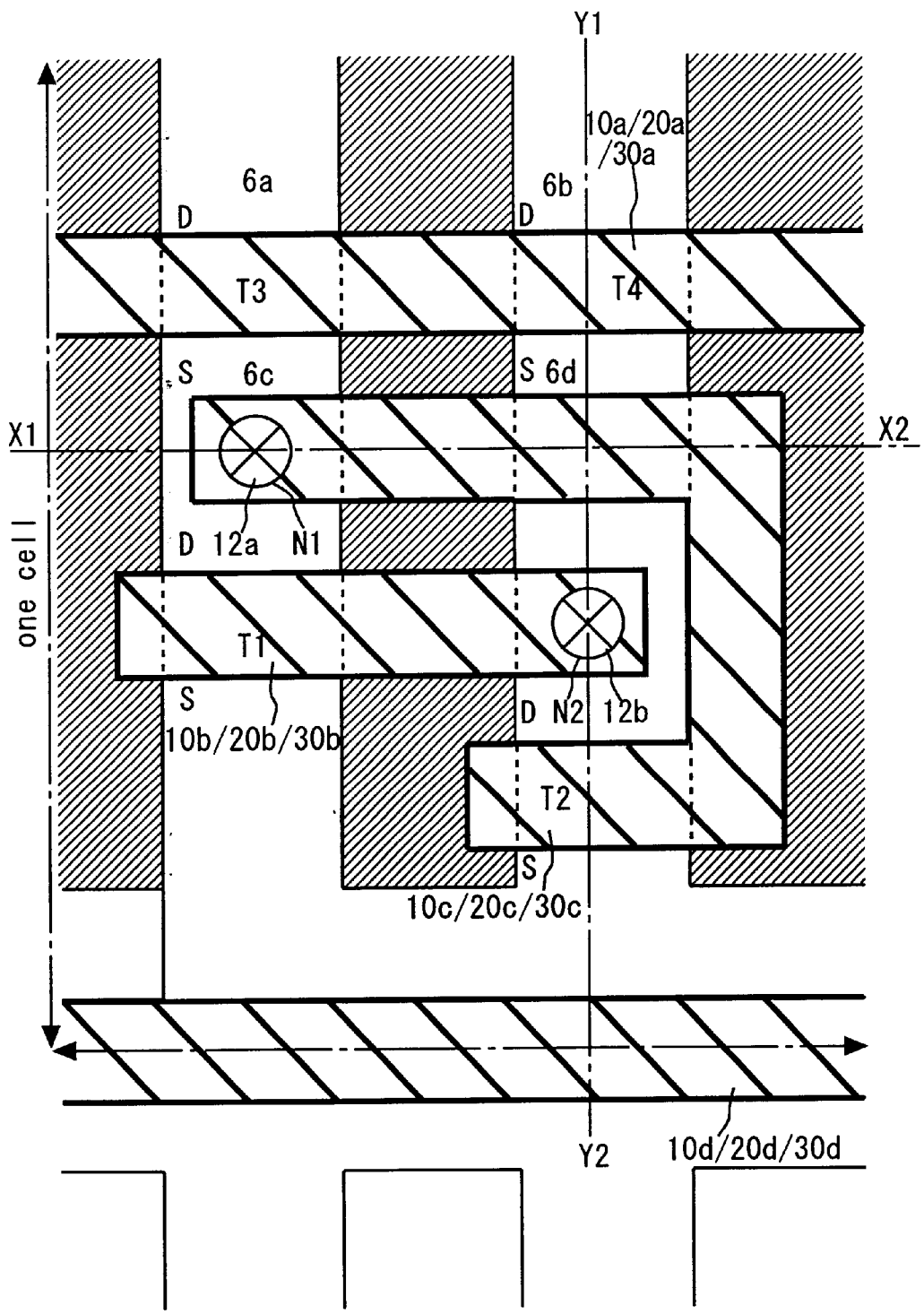
FIGS. 66 to 74 illustrate an exemplary structure of a SRAM cell as a semiconductor device in a eighth embodiment according to the present invention, and a method of fabricating the SRAM cell.
Figure 67:
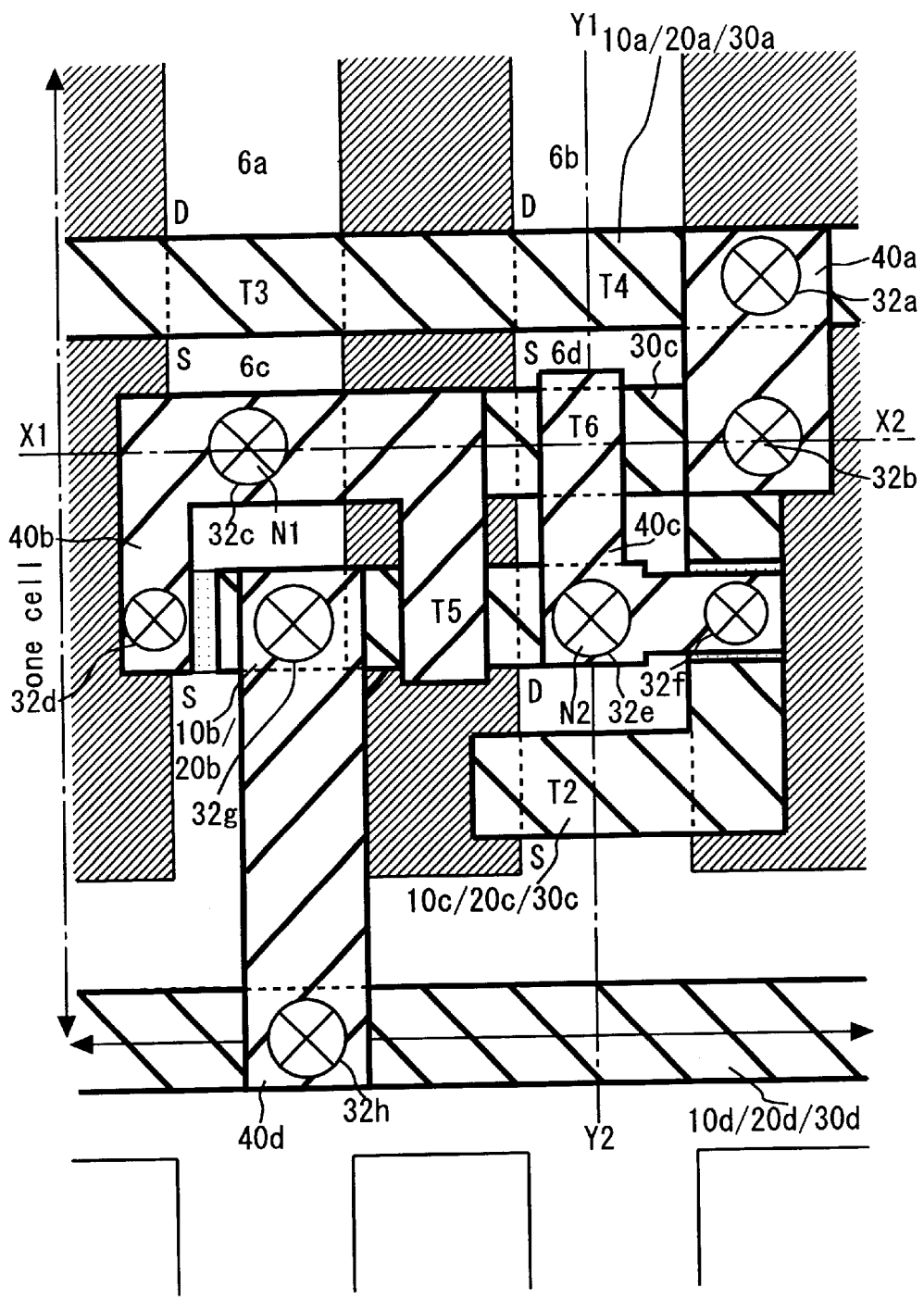
Figure 68:
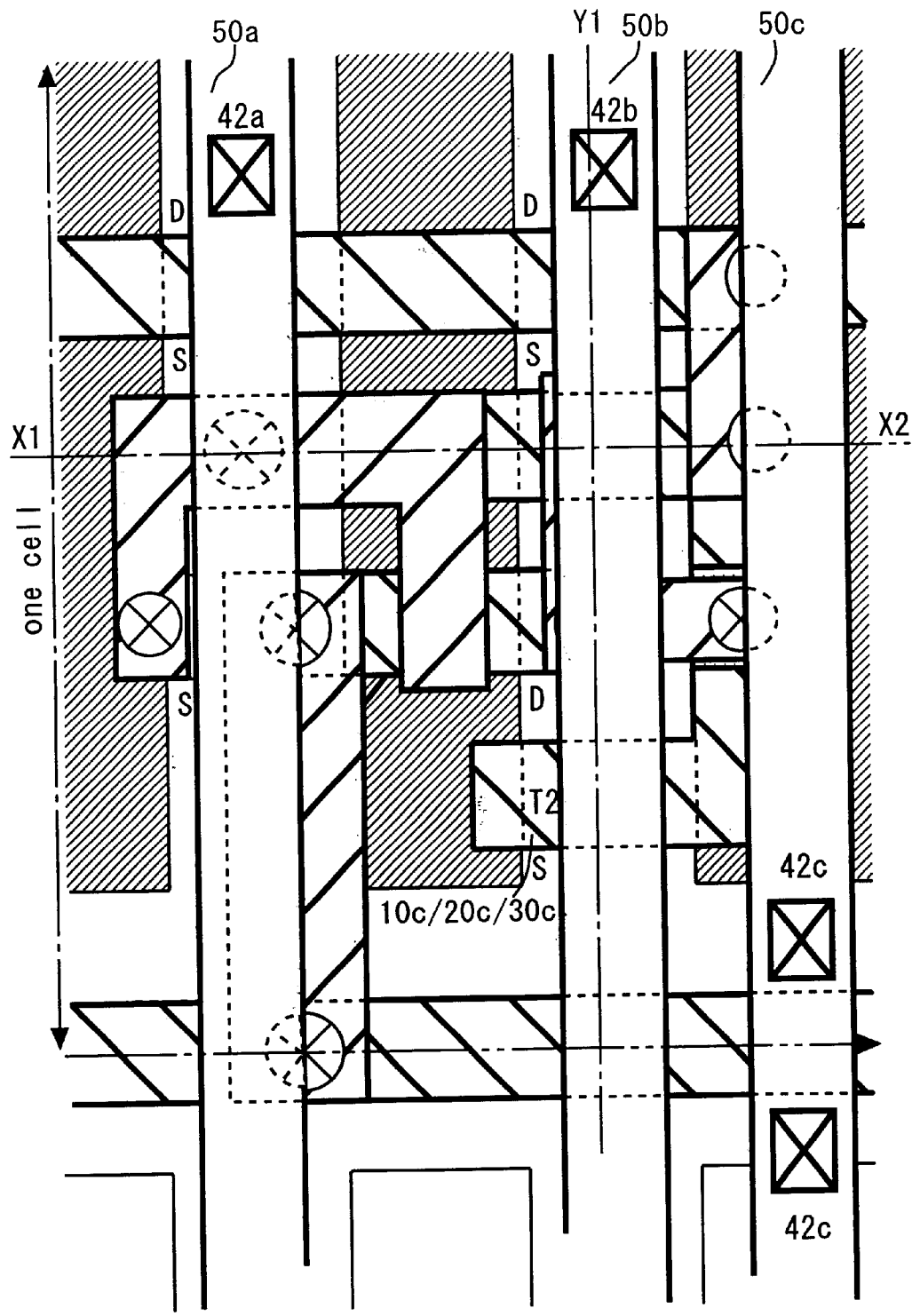

FIGS. 66 to 68 illustrate an exemplary planar layout of the components of the SRAM cell, in which FIG. 66 is a plan view of a first conductive film serving as the gate electrodes of MOS transistors, a second conductive film serving as the lower electrodes of TFTs, and a third conductive film serving as the channel region of the TFTs. FIG. 67 is a plan view of a fourth conductive film serving as the upper gate electrodes of the TFTs. FIG. 68 is a plan view of aluminum wiring lines formed by patterning a fifth conductive film.

Figure 69:
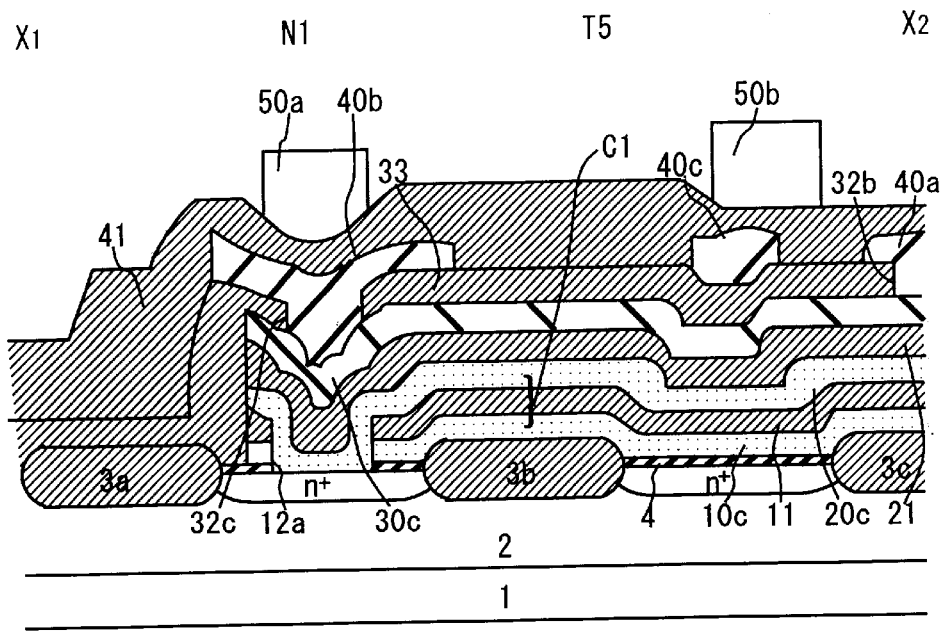
Figure 70:
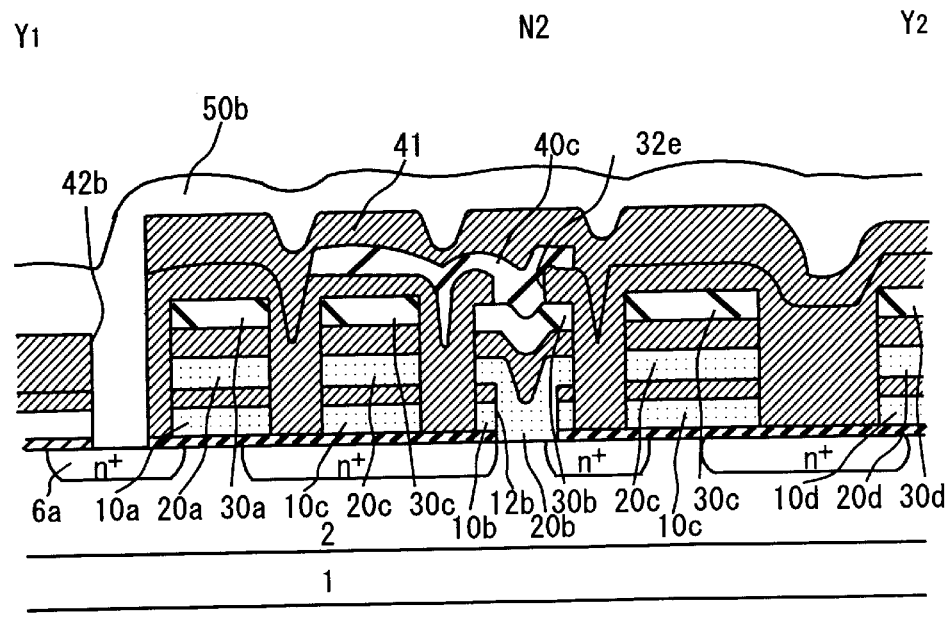

FIGS. 69 and 70 are sectional views taken on lines X1–X2 and Y1–Y2 in FIGS. 66 to 68. FIGS. 16 to 19 and 71 to 73 are sectional views taken on lines X1–X2 and Y1–Y2 in FIGS. 66 to 68. FIG. 74 is a circuit diagram of an equivalent circuit of the SRAM cell in the seventh embodiment.

The structure of the memory cell in the eighth embodiment will be described with reference to FIGS. 16 to 19 and 68 to 74 in connection with a method of fabricating the memory cell.

First, processes similar to those for fabricating the SRAM cell in the second embodiment previously described with reference to FIGS. 16 to 19 are carried out.

Figure 71:
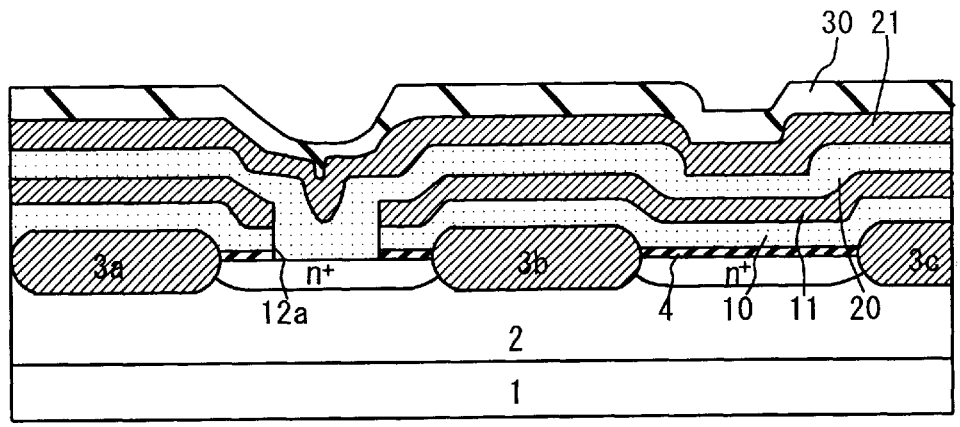

Then, referring to FIG. 71, a 100–1000 nm thick second layer insulating film 21 of $SiO_2$ or the like is deposited. A third conductive film 30 of polysilicon or the like is deposited, and the surface of the third conductive film 30 is doped with a p-type impurity, such as boron, by ion implantation in a dose in the range of $1.0 \times 10^{12}$ to $1.0 \times 10^{13}$ atoms/cm$^2$ to form the channel regions of the TFTs. Then, a p-type impurity, such as boron, is ion-implanted using a mask formed by lithography to form the source regions and drain regions of TFTs T5 and T6, and low-resistance regions in power feed lines for feeding power of a supply voltage VCC.

Figure 72:
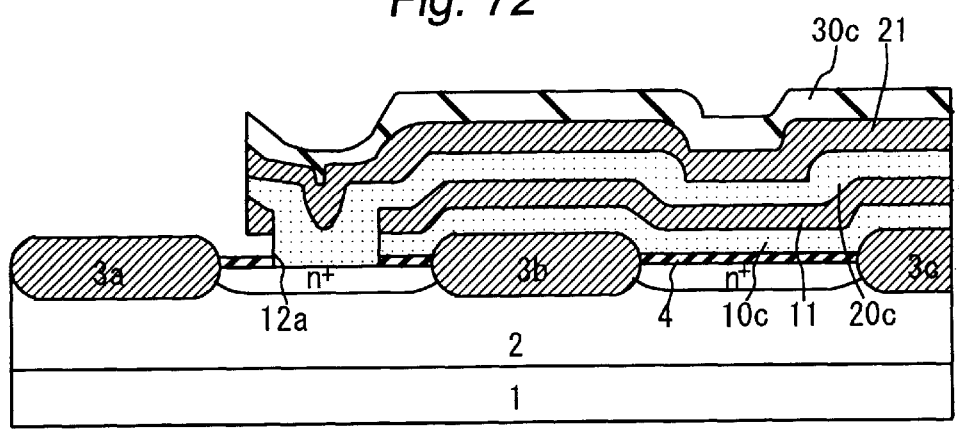

Referring to FIGS. 66 and 72, the first conductive film 10, the first layer insulating film 11, the second conductive film 20, the second layer insulating film 21 and the third conductive film 30 are patterned simultaneously. The films are patterned in the same planar shape by photolithography and etching so as to include viaholes 12a and 12b for connecting the first conductive film 10 and the second conductive film 20 to nodes N1 and N2. As a result, the gate electrodes 10a, 10b and 10c of MOS transistors T1 to T4, the lower gate electrodes 20b and 20c of the TFTs T5 and T6, the channels 30b and 30c of the TFTs T5 and T6, and power feed lines 30a and 30d are formed for feeding power of a supply voltage VCC. Then, an n-type impurity, such as arsenic, is ion-implanted using a mask formed by photolithography to form the source regions and drain regions of the MOS transistors T1 to T4.

Figure 73:
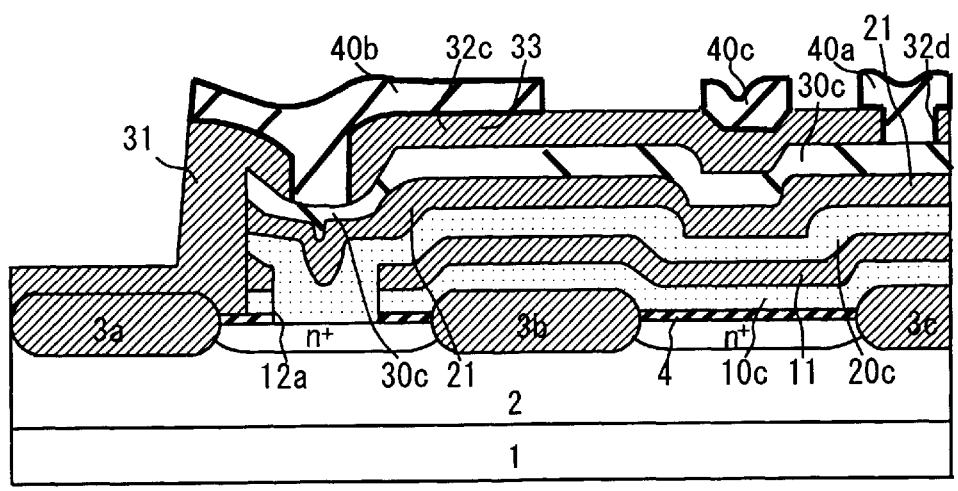
Figure 74:
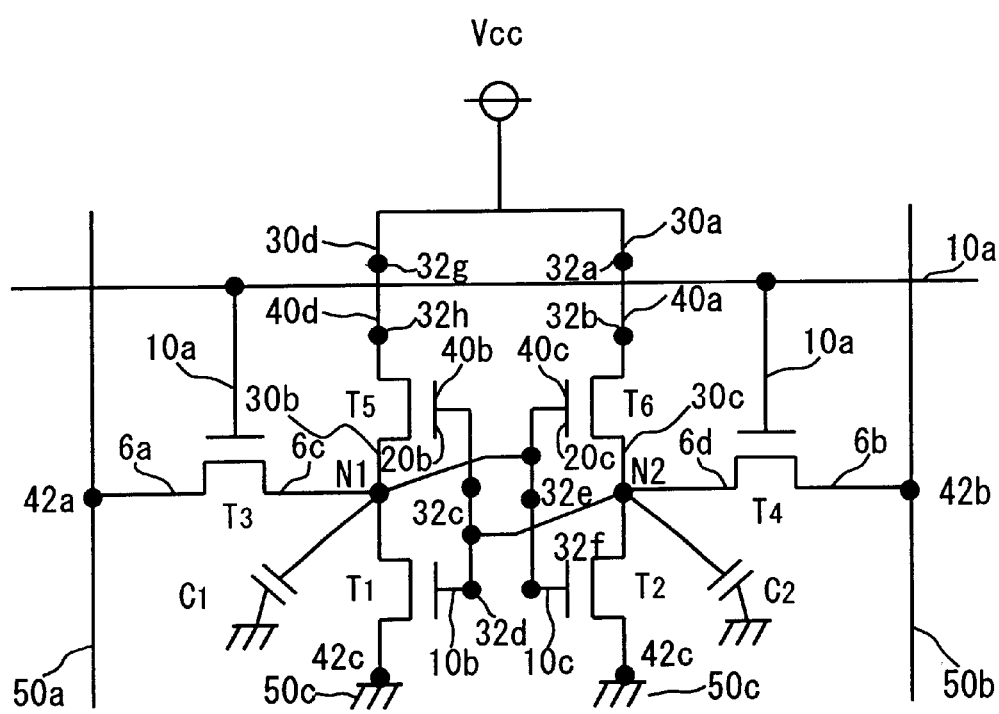
Figure 75:
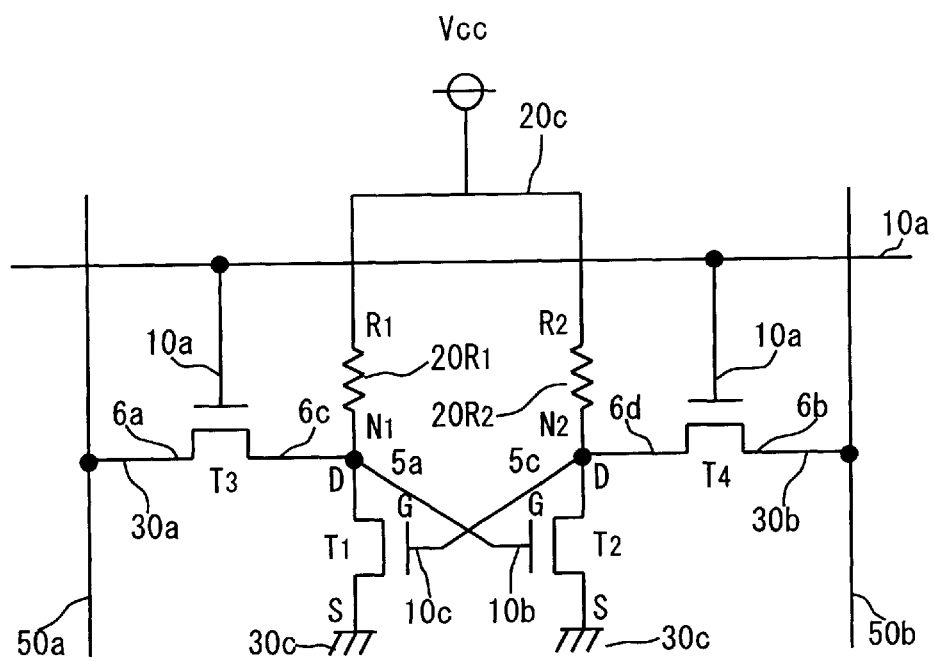
FIG. 75 shows an equivalent circuit of the conventional flip-flop SRAM cell.
Figure 76:
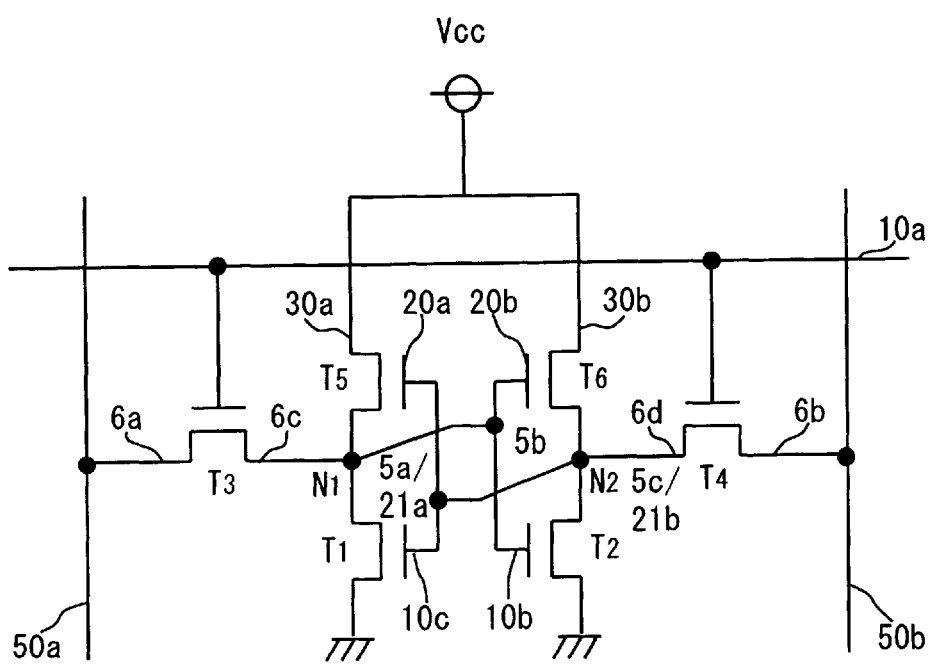
FIG. 76 is an equivalent circuit of a flip-flop SRAM cell provided with thin-film transistors as load elements.
Figure 77:
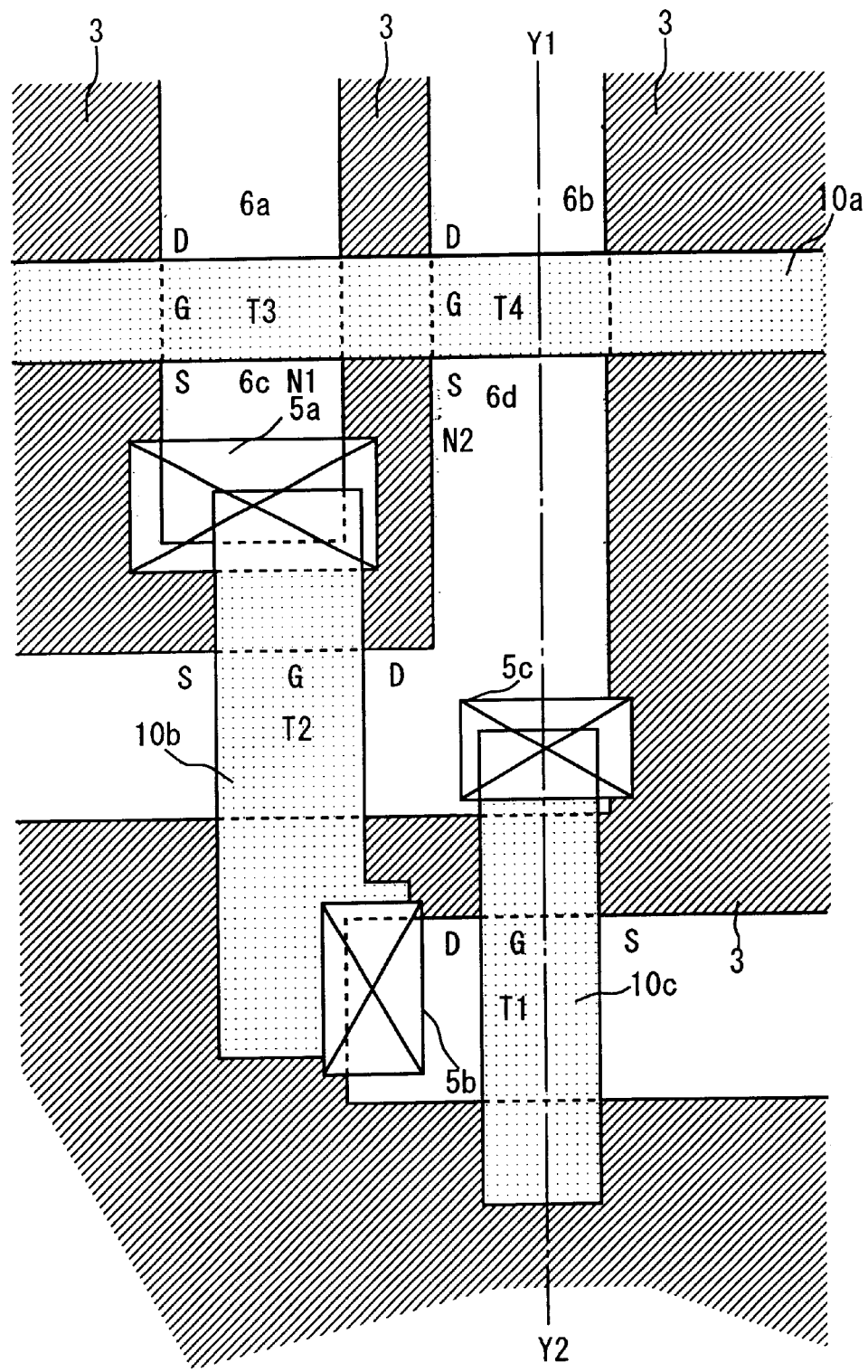
FIGS. 77 to 81 illustrate an exemplary structure of a conventional SRAM cell of a high-resistance load type for one bit and a method of fabricating the same SRAM.
Figure 78:
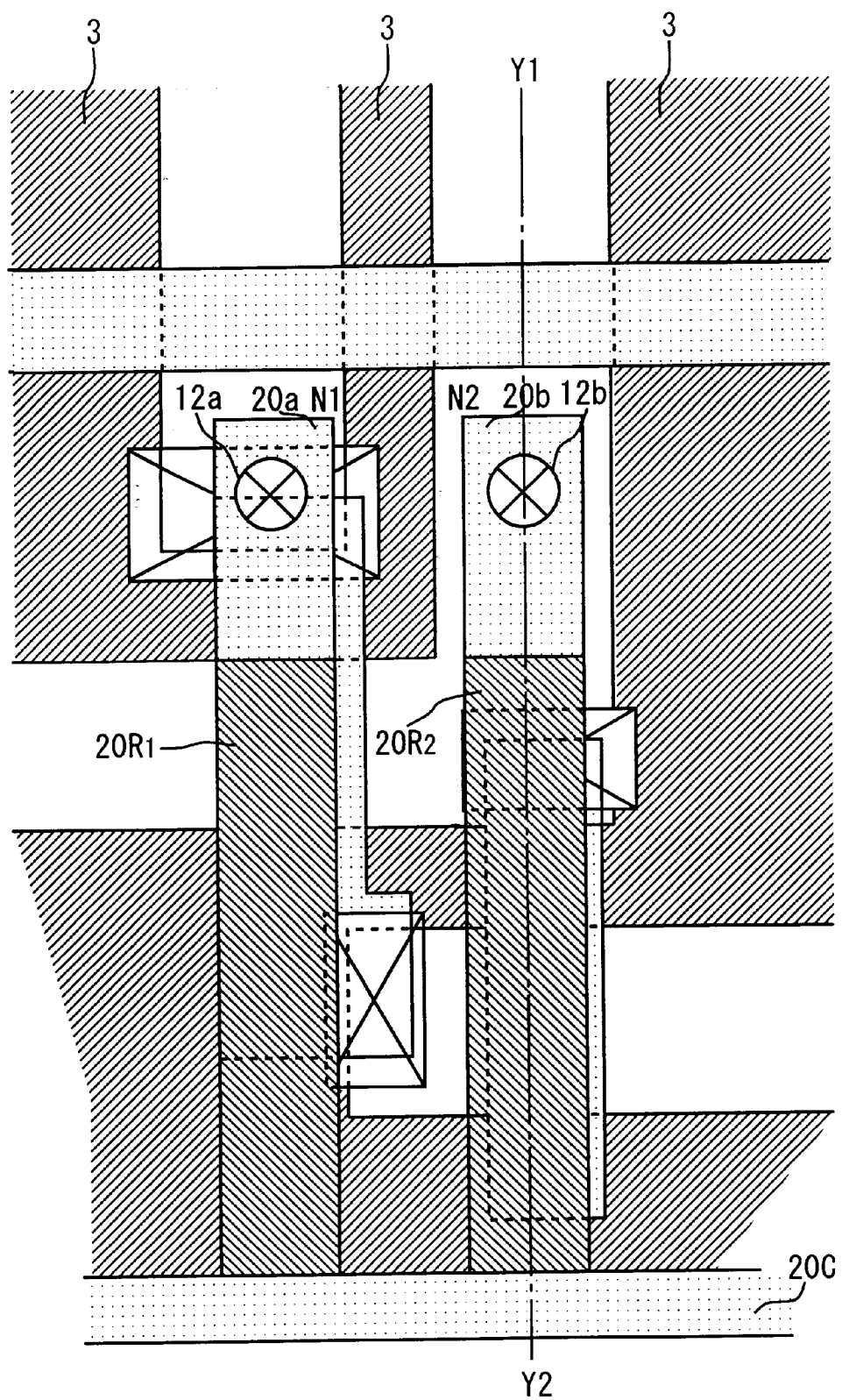
Figure 79:
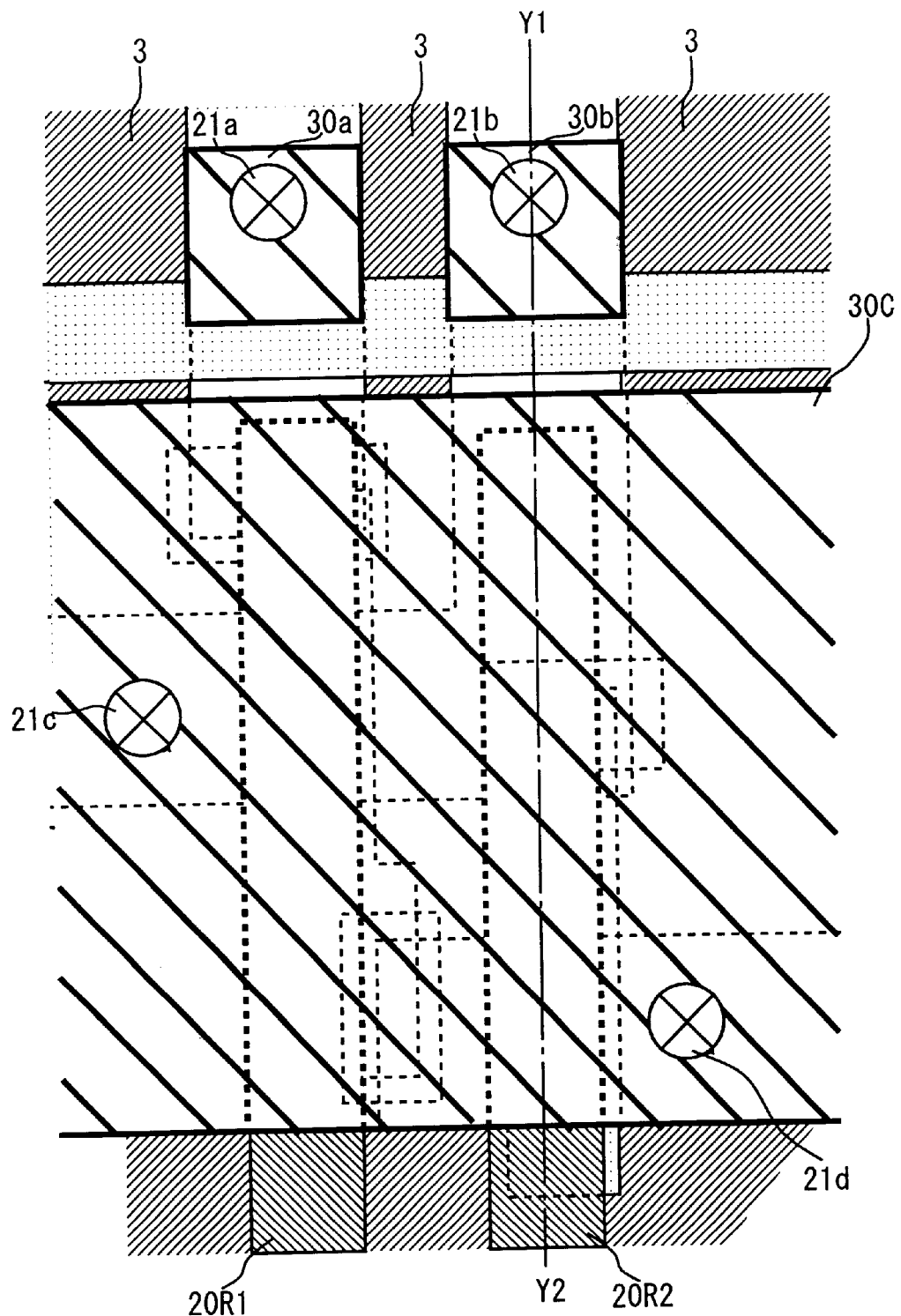
Figure 80:
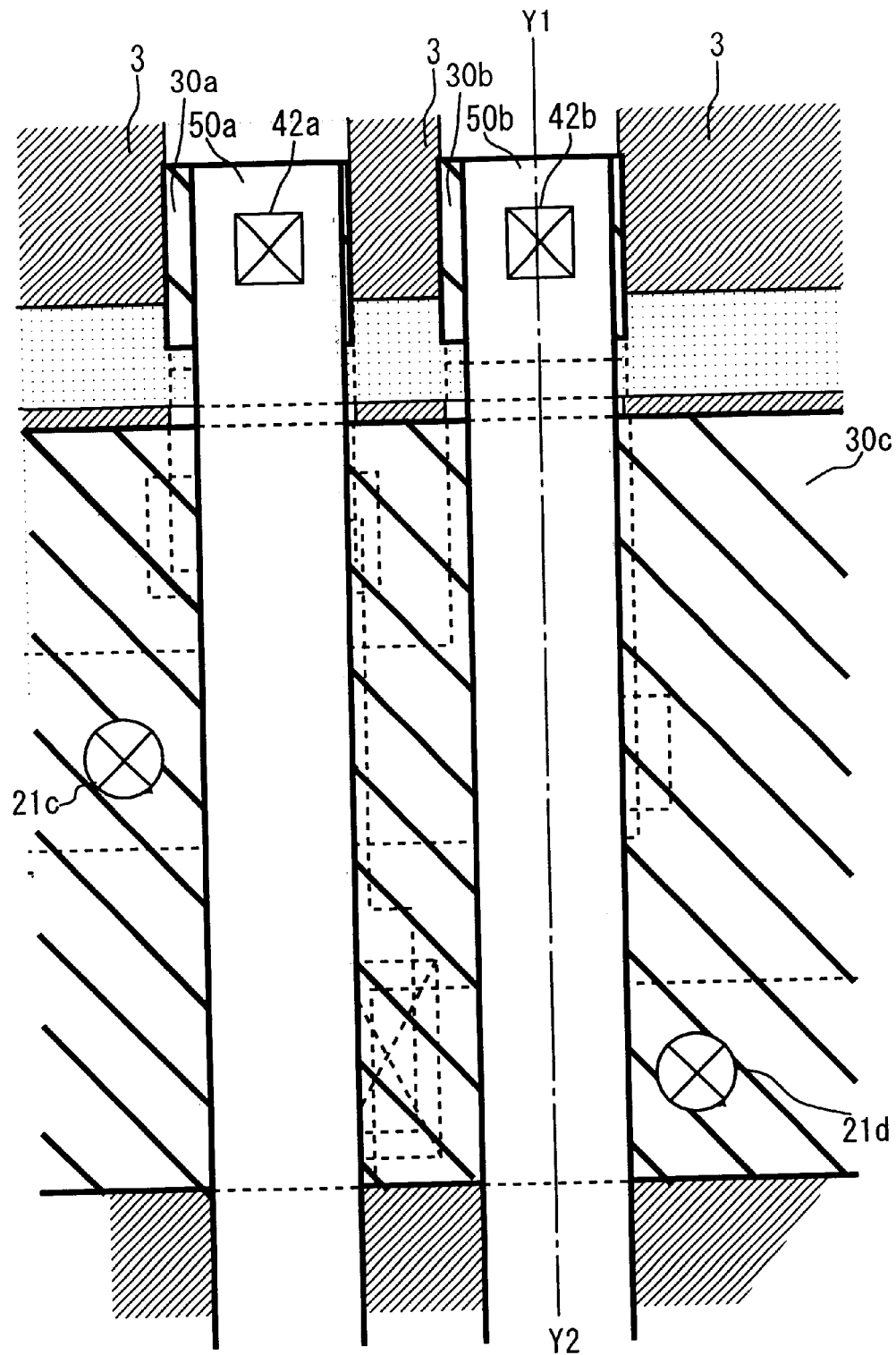
Figure 81:
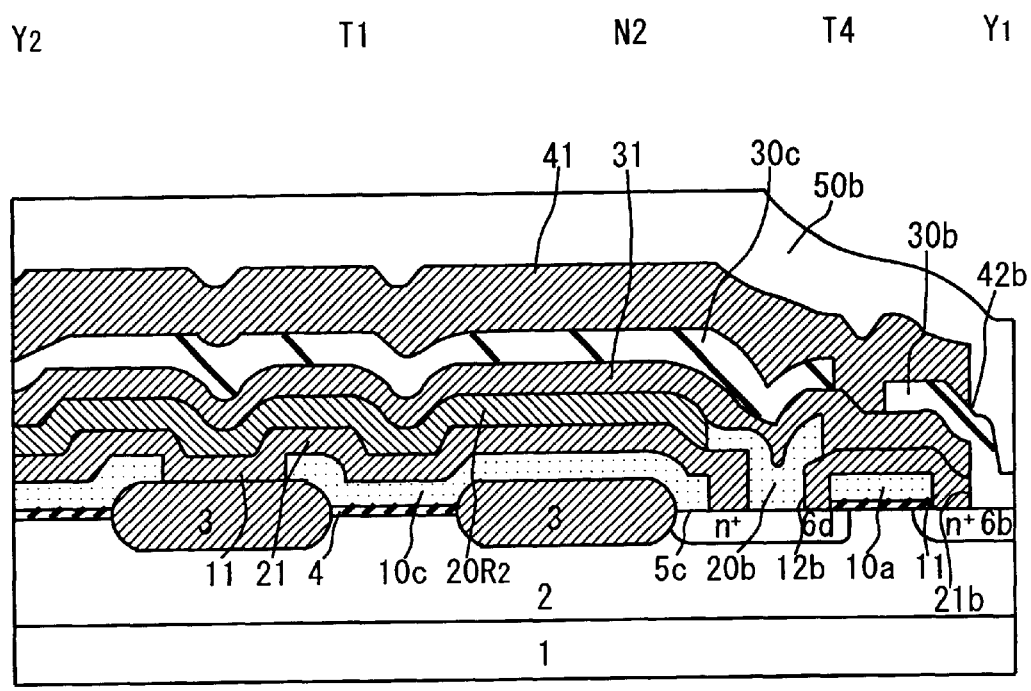
Figure 82:
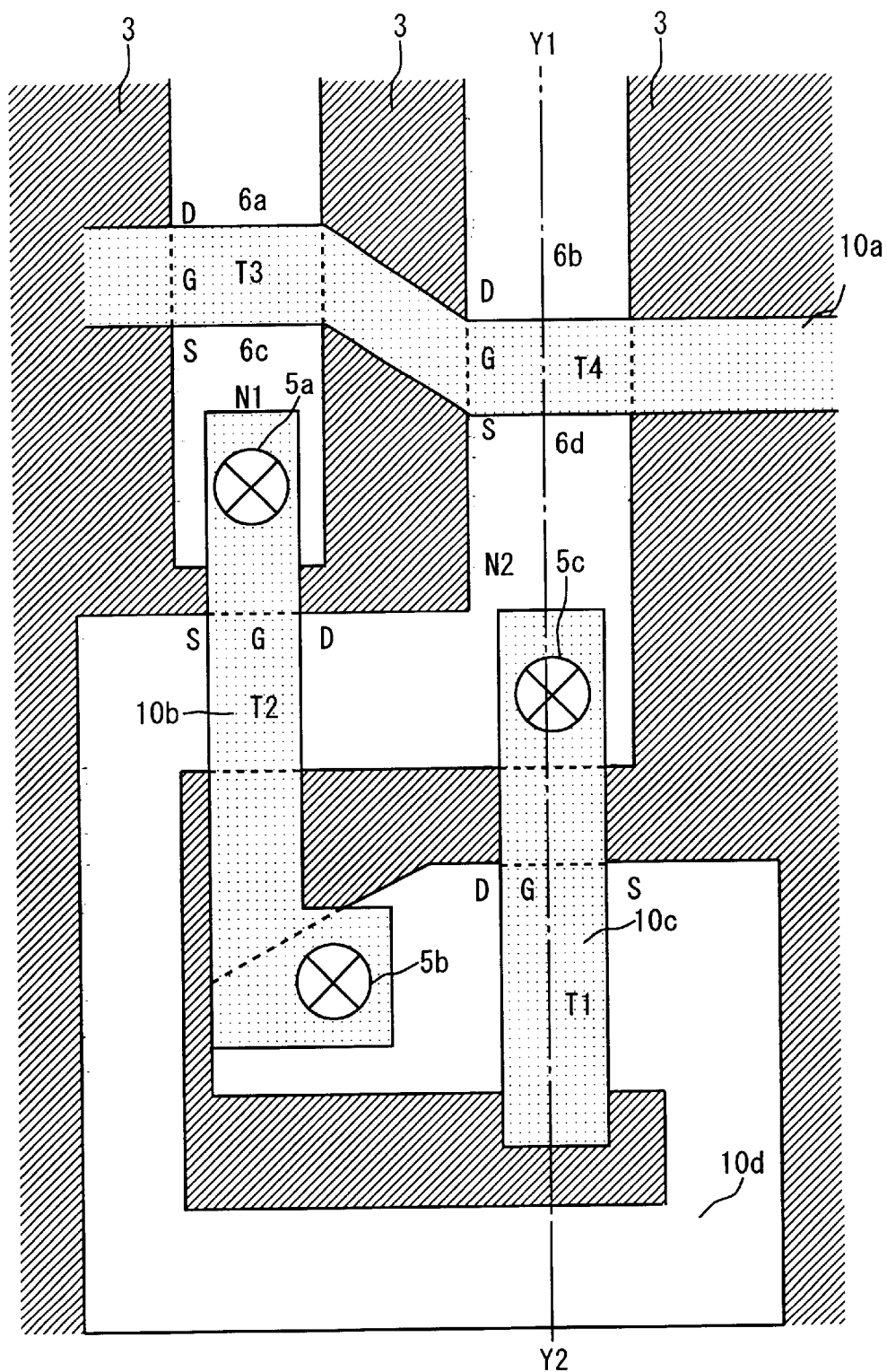
FIGS. 82 to 86 illustrate an exemplary structure of the one cell for one bit of the conventional SRAM of a TFT load type shown in FIG. 76, and a method of fabricating the same cell.
Figure 83:
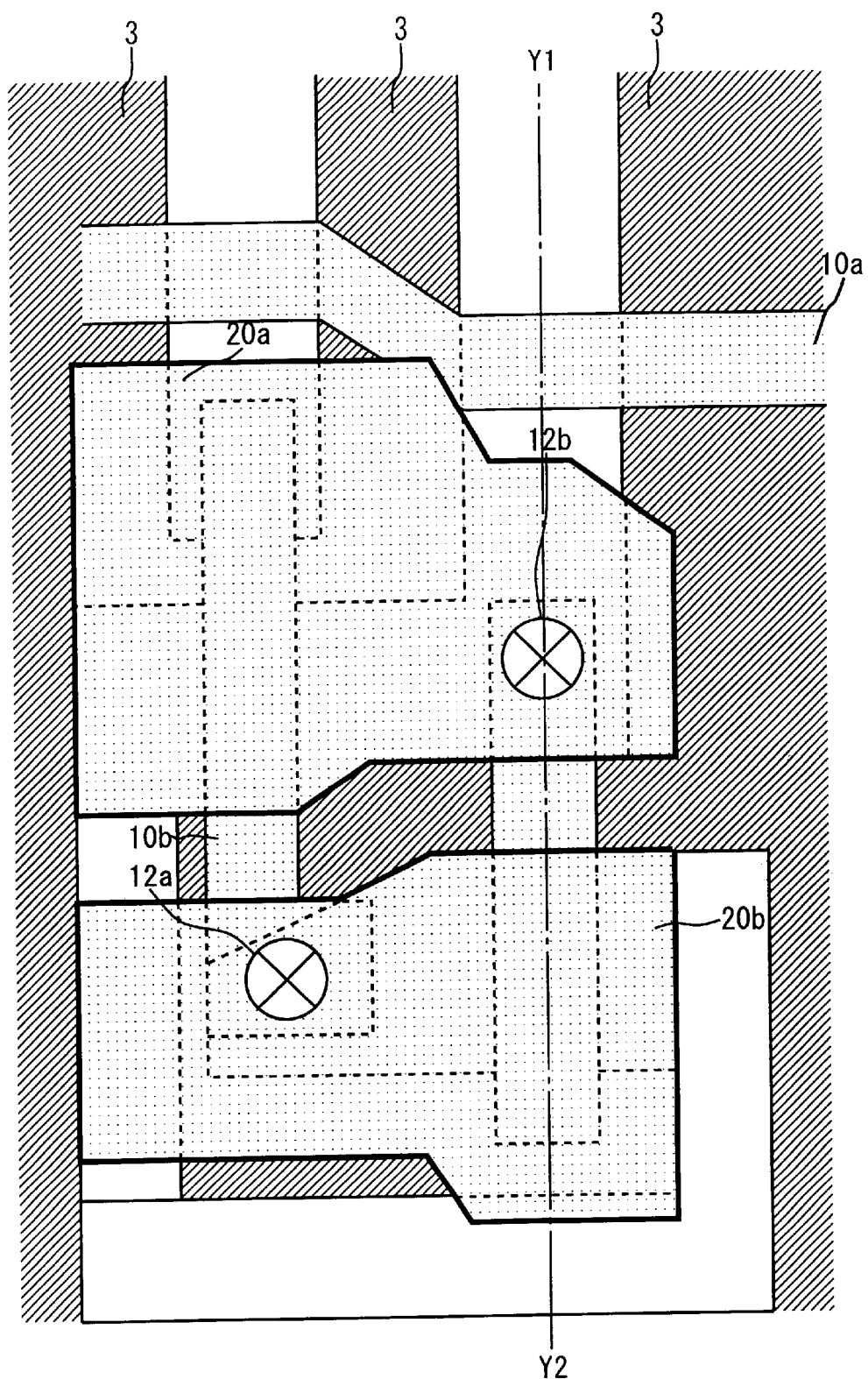
Figure 84:
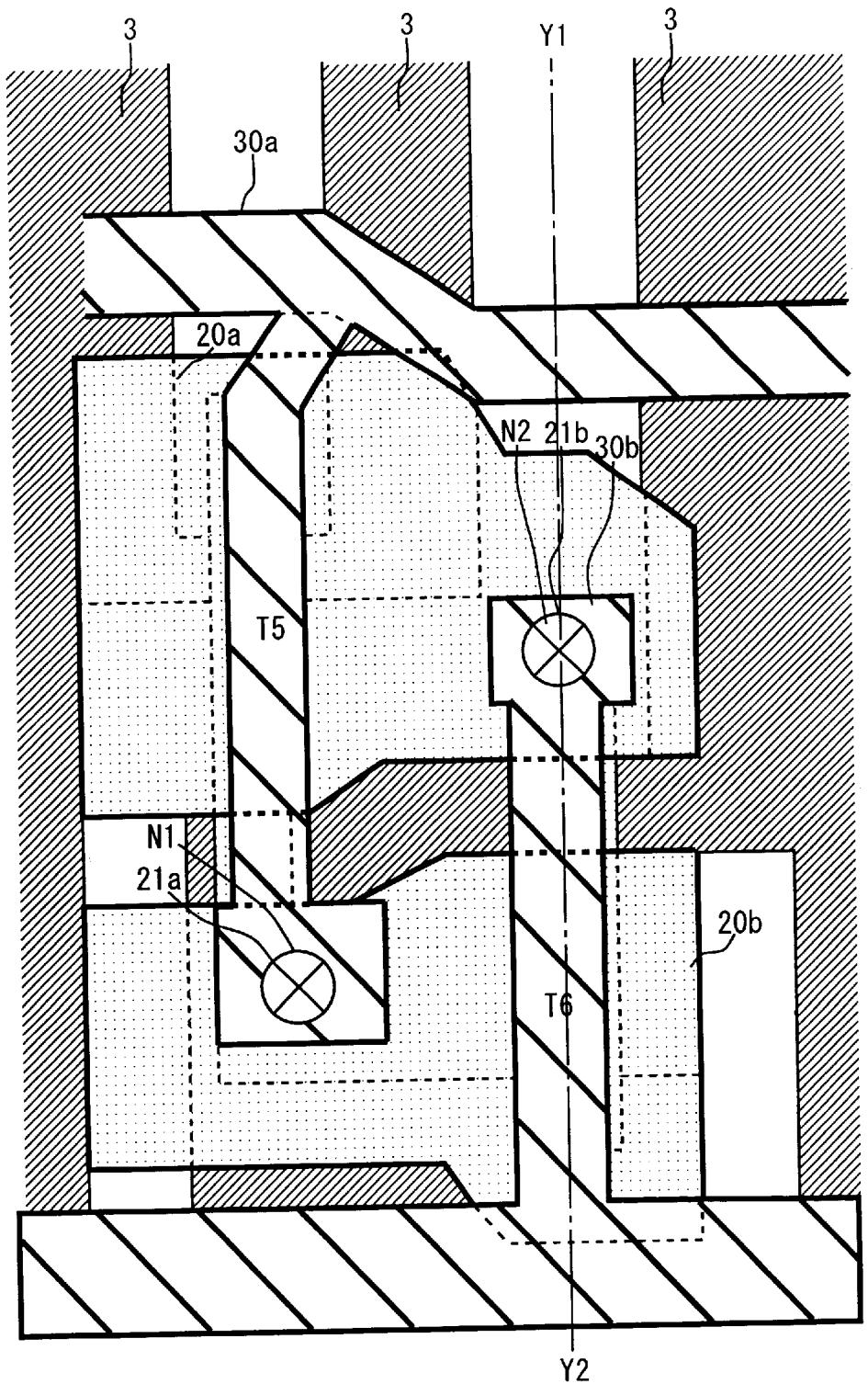
Figure 85:
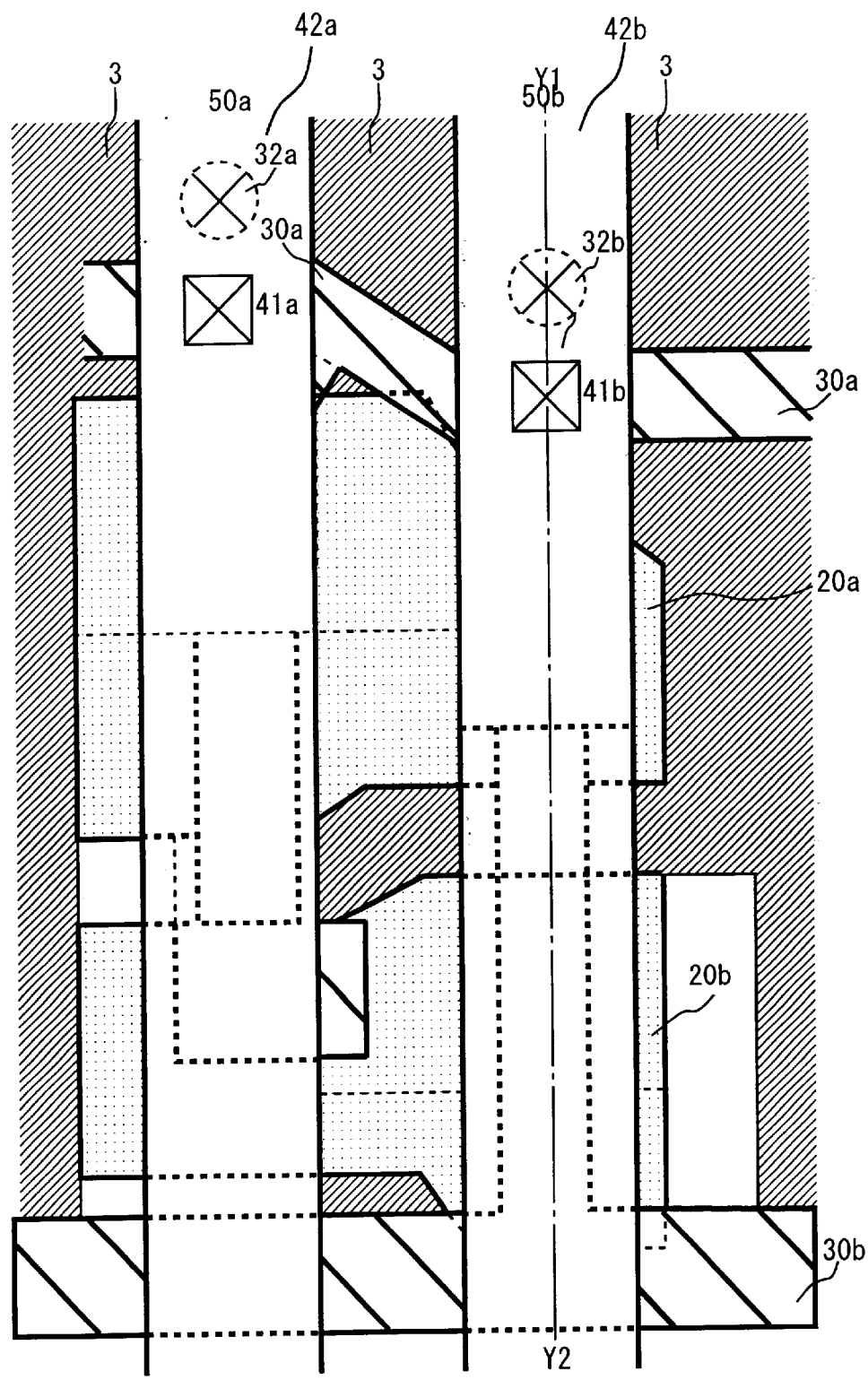
Figure 86:
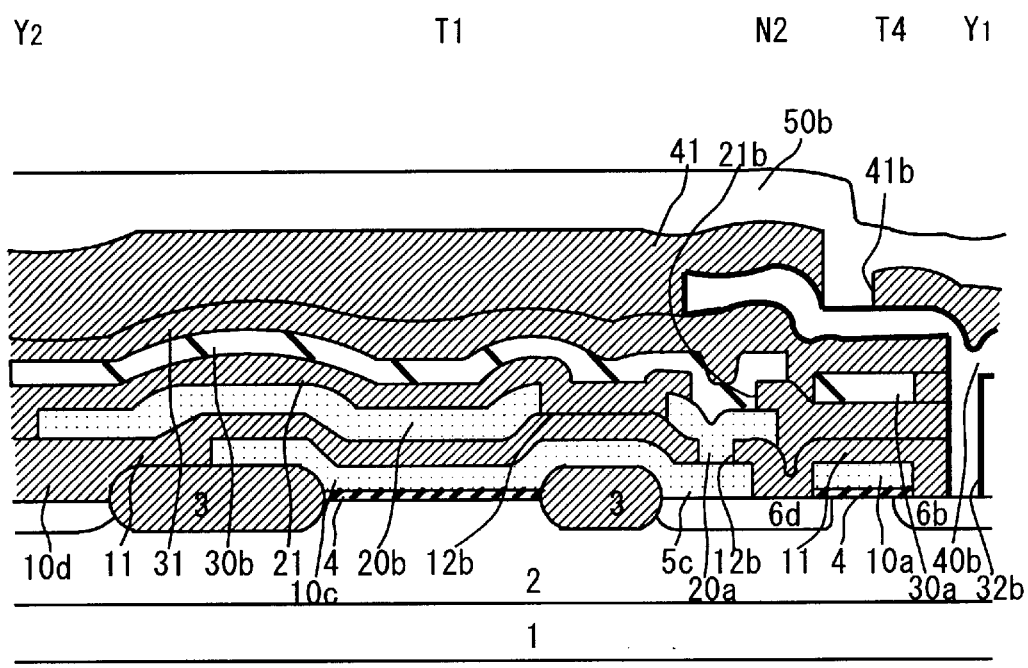

Referring to FIG. 73, a 100–1000 nm thick third layer insulating film 31 of $SiO_2$ or the like is deposited. As shown in FIG. 67, viaholes 32a to 32h are formed in the third layer insulating film 31 by photolithography and etching. Portions of the third layer insulating film 31 corresponding to the viaholes 32d and 32f are further etched to expose corresponding portions of the second conductive film members 20b and 20c. A fourth conductive film 40 (40a, 40b, 40c, 40d) of polysilicon or the like is deposited, the fourth conductive film 40 is patterned by photolithography and etching to form the upper gate electrodes 40b and 40c of the TFTs T5 and T6, and fourth conductive film members 40a and 40d.

Referring now to FIGS. 69 and 70, a 100–1000 nm thick fourth insulating film 41 of $SiO_2$ or the like is deposited by a CVD process or the like and, as shown in FIG. 68, viaholes 42a, 42b and 42c are formed in the fourth insulating film 41. A 500–2000 nm thick fifth conductive film is formed and the fifth conductive film is patterned to form aluminum wiring lines 50a, 50b and 50c. The aluminum wiring lines 50a and 50b are bit lines, and the aluminum wiring line 50c is a grounding line.

The structure of the memory cell thus formed will be described with reference to FIG. 74 showing an equivalent circuit of the memory cell. In FIG. 74, parts like or corresponding to those shown in FIGS. 16 to 19 and 66 to 73 are designated by the same reference characters.

The first conductive film members 10a to 10d, and the second conductive film members 20a to 20d of the eighth embodiment are the same in connection and shape as the first conductive film members 10a to 10d, and the second conductive film members 20a to 20d of the second embodiment. Hence, the description thereof will be omitted.

The connection of the third conductive film and the conductive films formed over the third conductive film is different from that in the second embodiment.

Referring to FIG. 67, a node N1 is connected through the second conductive film member 20c, serving as the lower gate electrode of the TFT T6 and through the viahole 32f to the fourth conductive film member 40c. One end of the fourth conductive film member 40c is connected through the viahole 32e to one end of the third conductive film member 30b, serving as the channel region of the TFT T5. The other end of the third conductive film member 30b is connected through the viahole 32g to one of the fourth conductive film member 40d. The other end of the fourth conductive film member 40d is connected through the viahole 32h to the power feed line 30d.

The other end of the fourth conductive film member 40c is connected through the viahole 32f to the second conductive film member 20c, serving as the lower gate electrode of the TFT T6 and serving as the upper gate electrode of the TFT T6.

Referring to FIG. 67, a node N2 is connected through the second conductive film member 20b and the viahole 32d to the fourth conductive film member 40b. One end of the fourth conductive film member 40b is connected through the viahole 32c to one end of the third conductive film member 30c, serving as the channel region of the TFT T6. The other end of the third conductive film member 30c is connected through the viahole 32b to one end of the fourth conductive film member 40a. The other end of the fourth conductive film member 40a is connected through the viahole 32a to the power feed line 30a.

The other end of the fourth conductive film member 40b is connected through the viahole 32d to the second conductive film member 20c, serving as the lower gate electrode of the TFT T5 and serving as the upper gate electrode of the TFT T5. Thus, the TFTs T5 and T6 are formed.

The connection of the diffused drain layers 6a and 6b of the access MOS transistors T3 and T4 to the aluminum wiring lines 50a and 50b, i.e., bit lines, is the same as that in the second embodiment. Hence, the description thereof will be omitted. The connection of the sources S of the drive MOS transistors T1 and T2 to the aluminum wiring line 50c, i.e., a grounding line, is the same as that in the second embodiment. Hence, the description thereof will be omitted. Thus, the circuit shown in FIG. 74 is formed.

As mentioned above, in the eighth embodiment, the gate electrodes 10b and 10c of the drive MOS transistors, the first layer insulating film 11, the lower gate electrodes 20b and 20c of the TFTs, the second layer insulating film 21, and the channels 30b and 30c of the TFTs T5 and T6 are formed in the same planar shape by simultaneous patterning so as to include necessary interlayer connection. Therefore, superposing allowances, which must be secured in the conventional SRAM, are not necessary. Hence, the memory cell can be formed in a reduced length and width.

Since the viaholes 12a and 12b are formed through the gate oxide film 4, the first conductive film 10 and the first layer insulating film 11, and the second conductive film 20 of polysilicon or the like are deposited. The first conductive film 10 and the second conductive film 20 are connected to the storage nodes N1 and N2. Capacitors C1 and C2 are formed of the first conductive film 10, and the first layer insulating film 11 and the second conductive film 20 can be connected to the nodes N1 and N2. Thus, the immunity of the memory cell to soft error attributable to alpha particles and neutrons can be enhanced.

Since the first conductive film 10, the first layer insulating film 11, the second conductive film 20, the second layer insulating film 21 and the third conductive film 30 are patterned simultaneously, conventional processes (including an ion implantation process, a photolithographic process and an etching process) are unnecessary. Hence, the number of processes can be reduced by 15% or more.

Although the n-channel MOS transistors are formed in the p-type wells formed in the surface of the n-type silicon substrate in the foregoing embodiments, a SRAM cell provided with p-channel MOS transistors formed in n-type wells may be fabricated by the same method in the same structure for the same effects.

Although the invention has been described as applied to the SRAM cells, the present invention is not limited thereto in its practical application and may be applied to other memories and other semiconductor devices. The present invention is suitable for application particularly to semiconductor devices provided with a plurality of transistors, and a plurality of load elements or capacity elements formed on a semiconductor substrate.

As is apparent from the foregoing description, a semiconductor device according to the present invention has a semiconductor substrate, and a plurality of conductive films formed on the semiconductor substrate with layer insulating film between the adjacent conductive films, and at least two of those conductive films are patterned simultaneously in the same planar shape so as to include necessary interlayer connection.

In this semiconductor device, selected ones of the plurality of conductive films are connected through viaholes formed in an insulating film to the semiconductor substrate.

In the semiconductor device, selected ones of the plurality of conductive films form high-resistance elements, capacity elements or thin-film transistors.

According to the present invention, since the plurality of conductive films formed in a layered sandwich structure are patterned simultaneously in the same shape, misalignment of masks, and increase or decrease in the dimensions of those components do not occur. Therefore, any sufficient superposing allowances need not be secured when laying out the cells, and hence the semiconductor device, such as a memory chip, can be formed in a reduced area.

Even if the semiconductor device, such as a SRAM cell, is formed in a small area, storage capacity elements of a large capacity can be formed by forming the conductive films in a layered sandwich structure, and the immunity to soft error can be enhanced.

Since the plurality of conductive films formed in the layered sandwich structure are patterned simultaneously, the semiconductor device can be fabricated by a reduced number of processes, the yield is improved accordingly, and the manufacturing cost can be reduced.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A method of fabricating a semiconductor device, the semiconductor device having a static-type memory cell including a pair of driver transistors and a pair of load elements, the method comprising the steps of:

forming a gate insulating film on a main surface of a semiconductor substrate;

forming a first conductive film on said gate insulating film constituting a gate electrode of said driver transistors;

forming a first insulating film on said first conductive film;

forming an opening successively through said first insulating film, said first conductive film and said gate insulating film to expose said semiconductor substrate;

forming a second conductive film on said first insulating film and in said opening constituting said load elements; and forming a same planar pattern that includes said opening in order of said second conductive film, said first insulating film and said first conductive film.

2. The method of fabricating a semiconductor device according to claim 1, further comprising the step of implanting an impurity simultaneously into a source drain region of said driver transistor on said main surface and said second conductive film on the semiconductor substrate.

3. The method of fabricating a semiconductor device according to claim 1, wherein said planar pattern is formed so as to arrange that said pair of transistors themselves and said pair of load elements themselves are parallel.

* * * * *